US012648394B2

(12) United States Patent
Sakamoto et al.

(10) Patent No.: US 12,648,394 B2
(45) Date of Patent: Jun. 2, 2026

(54) LASER PROCESSING DEVICE AND LASER PROCESSING METHOD

(71) Applicant: HAMAMATSU PHOTONICS K.K., Hamamatsu (JP)

(72) Inventors: Takeshi Sakamoto, Hamamatsu (JP); Iku Sano, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 934 days.

(21) Appl. No.: 17/910,049

(22) PCT Filed: Mar. 3, 2021

(86) PCT No.: PCT/JP2021/008243
§ 371 (c)(1),
(2) Date: Jan. 19, 2023

(87) PCT Pub. No.: WO2021/182252
PCT Pub. Date: Sep. 16, 2021

(65) Prior Publication Data
US 2023/0245906 A1 Aug. 3, 2023

(30) Foreign Application Priority Data
Mar. 10, 2020 (JP) ................................. 2020-040958

(51) Int. Cl.
*H10P 54/00* (2026.01)
*H10P 34/42* (2026.01)
(Continued)

(52) U.S. Cl.
CPC .......... *H10P 72/0616* (2026.01); *H10P 34/42* (2026.01); *H10P 54/00* (2026.01); *H10P 72/0428* (2026.01); *H10P 74/203* (2026.01)

(58) Field of Classification Search
CPC ............. H01L 21/67288; H01L 21/268; H01L 21/67092; H01L 21/78; H01L 22/12
See application file for complete search history.

(56) References Cited

U.S. PATENT DOCUMENTS

2007/0298529 A1* 12/2007 Maeda ................. B28D 5/0011
438/33
2019/0001433 A1* 1/2019 Yamamoto ........... B23K 26/032

FOREIGN PATENT DOCUMENTS

CN 102294546 A 12/2011
CN 106216831 A 12/2016
(Continued)

OTHER PUBLICATIONS

English-language translation of International Preliminary Report on Patentability (IPRP) dated Sep. 22, 2022 that issued in WO Patent Application No. PCT/JP2021/008243.

*Primary Examiner* — Mohammad M Choudhry
(74) *Attorney, Agent, or Firm* — Faegre Drinker Biddle & Reath LLP

(57) ABSTRACT

A laser processing device comprising: an irradiation unit configured to irradiate an object with laser light; an image capturing part configured to capture an image of the object; and a control unit configured to control at least the irradiation unit and the image capturing part, wherein the control unit performs a first process of irradiating the object with the laser light by control of the irradiation unit to form a modified spot and a fracture extending from the modified spot in the object so as not to reach an outer surface of the object, a second process of, after the first process, capturing an image of the object with light having transparency to the object and acquiring information indicating a formation state of the modified spot and/or the fracture, by control of the image capturing part.

14 Claims, 56 Drawing Sheets

(51) Int. Cl.
    *H10P 72/00*     (2026.01)
    *H10P 74/20*     (2026.01)

(56)            References Cited

FOREIGN PATENT DOCUMENTS

| | | | |
|---|---|---|---|
| CN | 109317839 | A | 2/2019 |
| CN | 110064840 | A | 7/2019 |
| CN | 110116280 | A | 8/2019 |
| CN | 110270769 | A | 9/2019 |
| CN | 110620038 | A | 12/2019 |
| JP | 2006-150385 | A | 6/2006 |
| JP | 2006-315017 | A | 11/2006 |
| JP | 2008-062258 | A | 3/2008 |
| JP | 2011-054841 | A | 3/2011 |
| JP | 2012-199374 | A | 10/2012 |
| JP | 5060673 | B2 | 10/2012 |
| JP | 2014-087806 | A | 5/2014 |
| JP | 5743123 | B1 | 7/2015 |
| JP | 5789802 | B2 | 10/2015 |
| JP | 2016-219756 | A | 12/2016 |
| JP | 2017-131937 | A | 8/2017 |
| JP | 2017-204574 | A | 11/2017 |
| JP | 2018-523166 | A | 8/2018 |
| JP | 2019-012849 | A | 1/2019 |
| JP | 2019-140167 | A | 8/2019 |
| JP | 2019-150846 | A | 9/2019 |
| JP | 2019-158811 | A | 9/2019 |
| JP | 6625956 | B2 | 12/2019 |
| JP | 2020-077767 | A | 5/2020 |
| WO | WO-2017/013091 | A1 | 1/2017 |
| WO | WO-2018/110238 | A1 | 6/2018 |

* cited by examiner

*Fig.11*
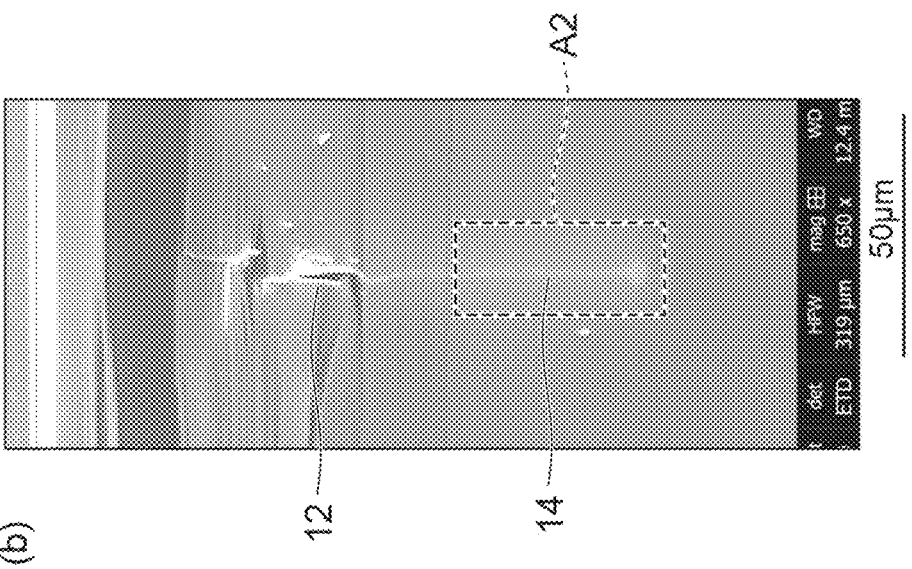
(b)
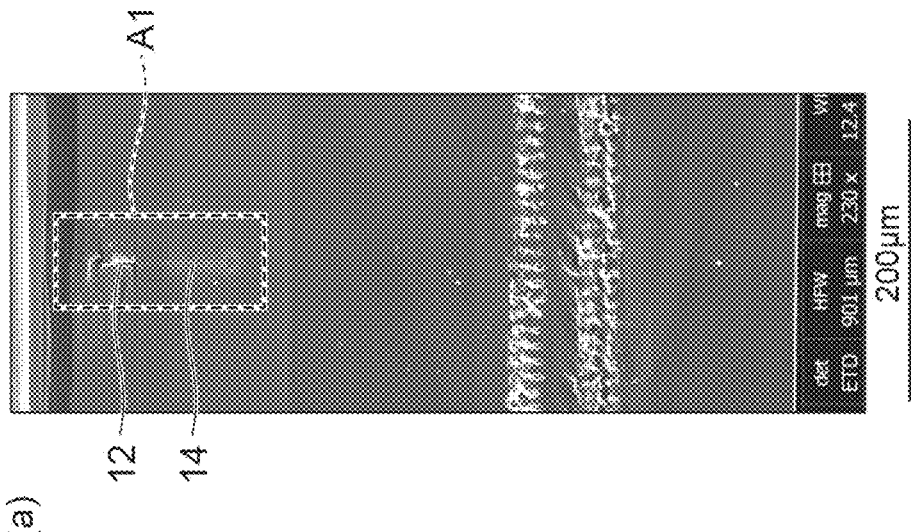
(a)

*Fig.13*
(a)
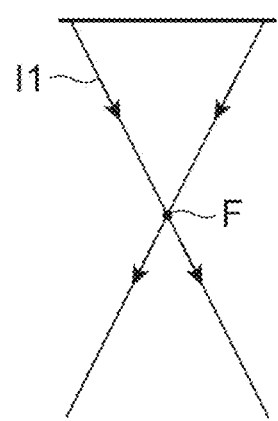
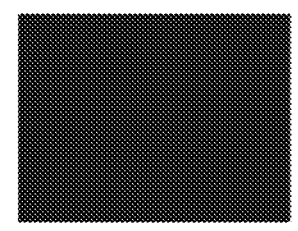
(b)
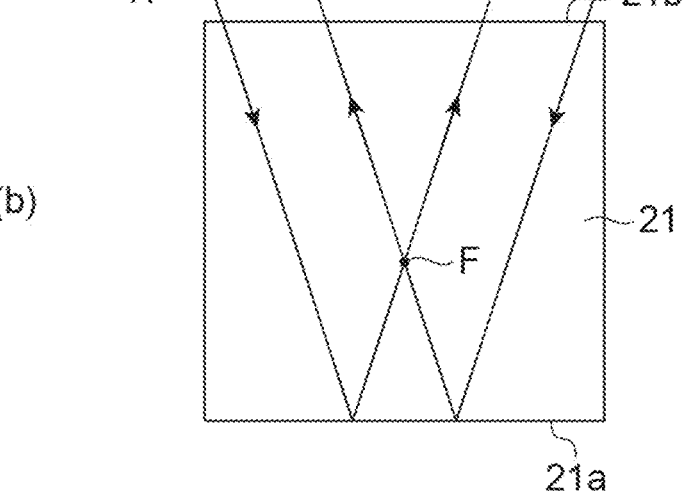
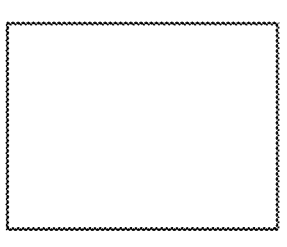
(c)
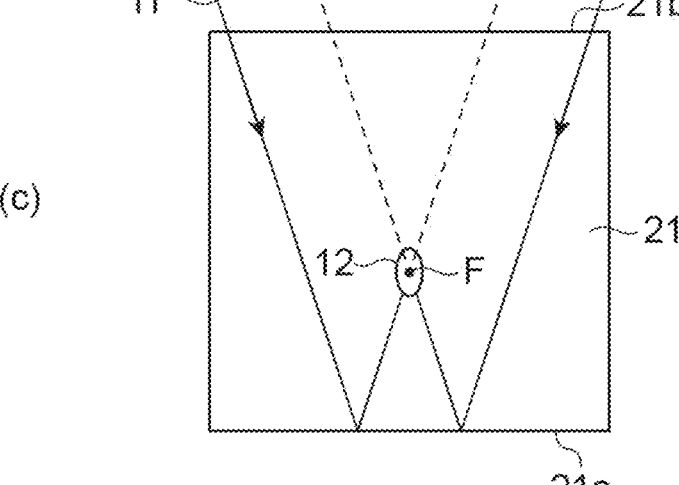
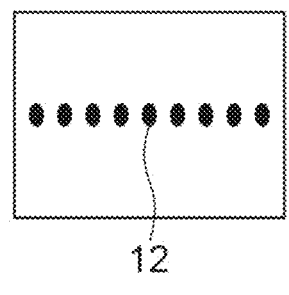

*Fig.14*
(a)
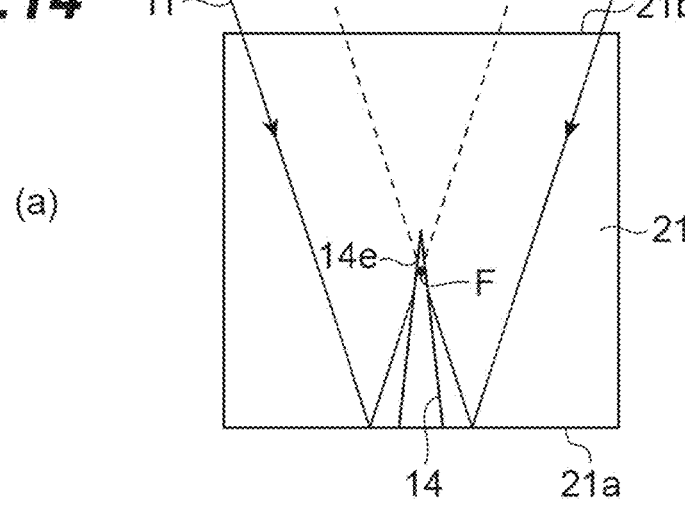 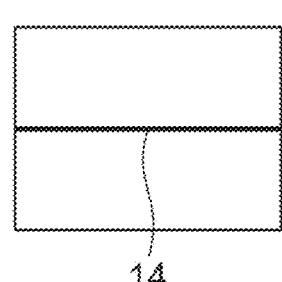
(b)
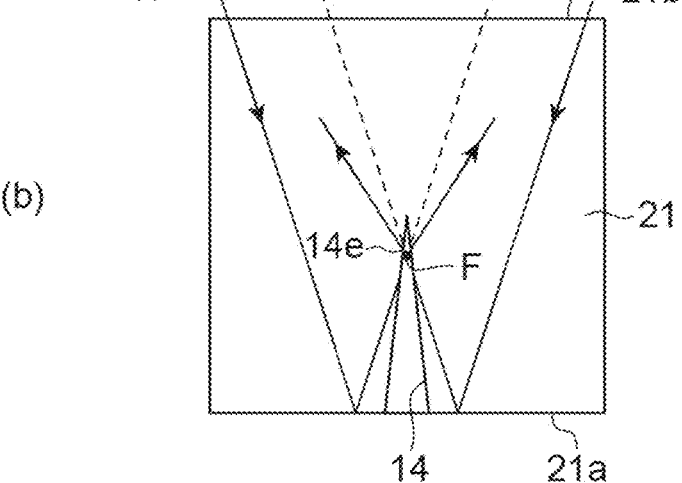 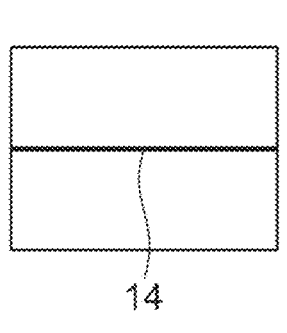
(c)
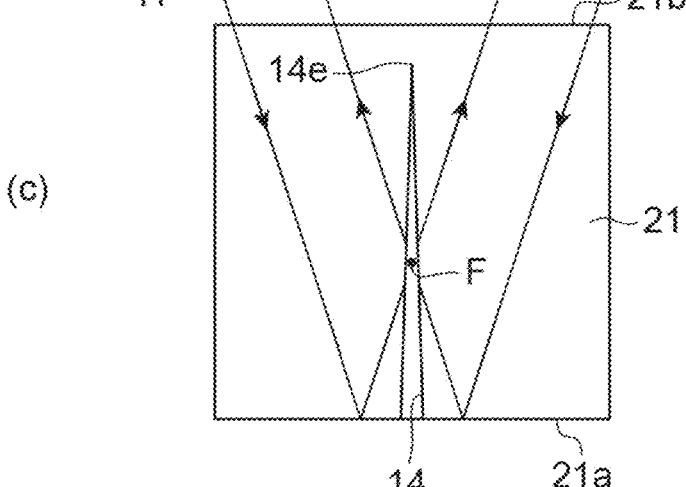 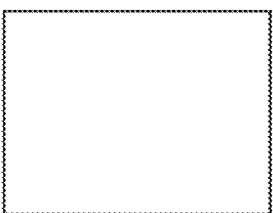

*Fig.18*
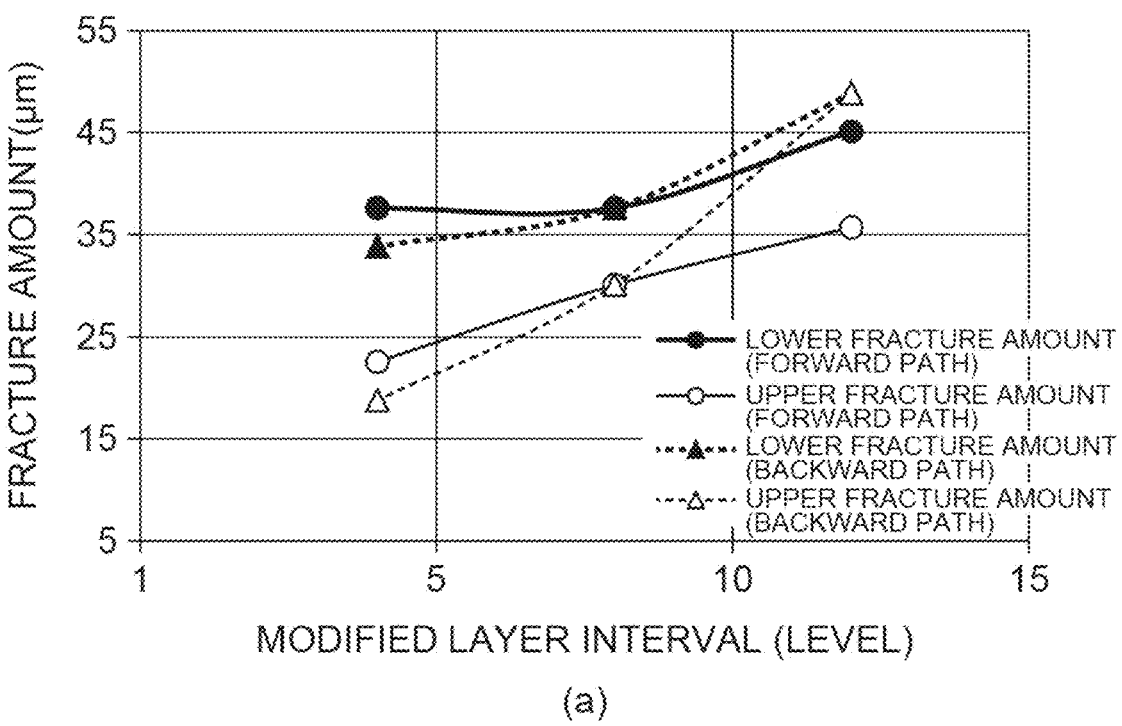
(a)
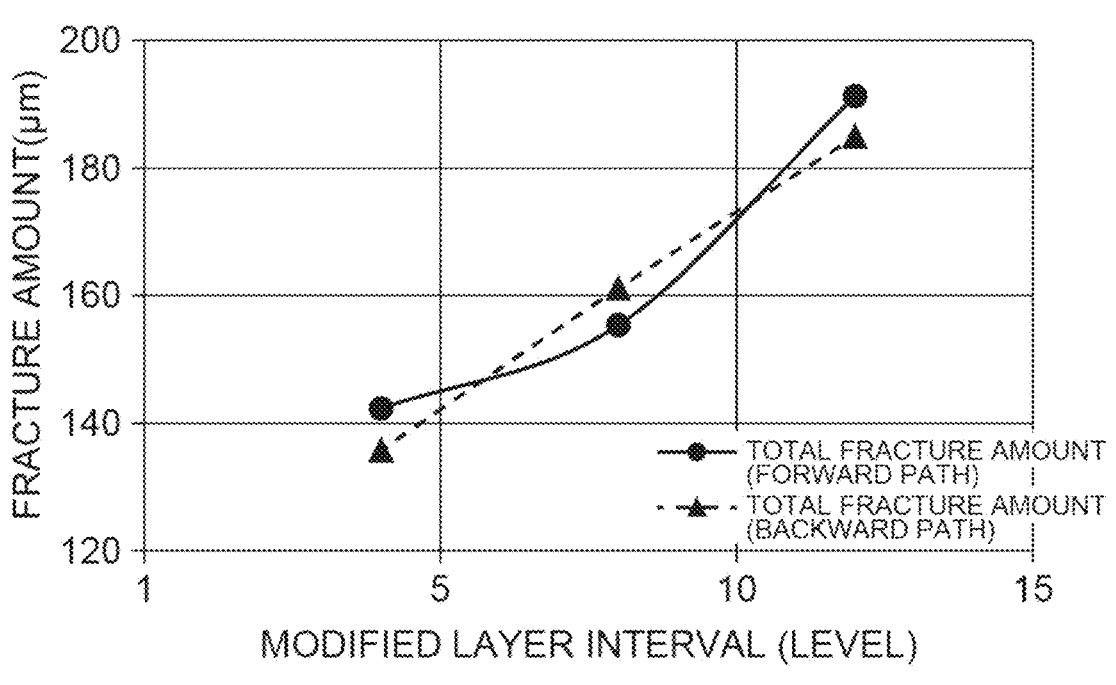
(b)

(a)                (b)                (c)

*Fig.20*
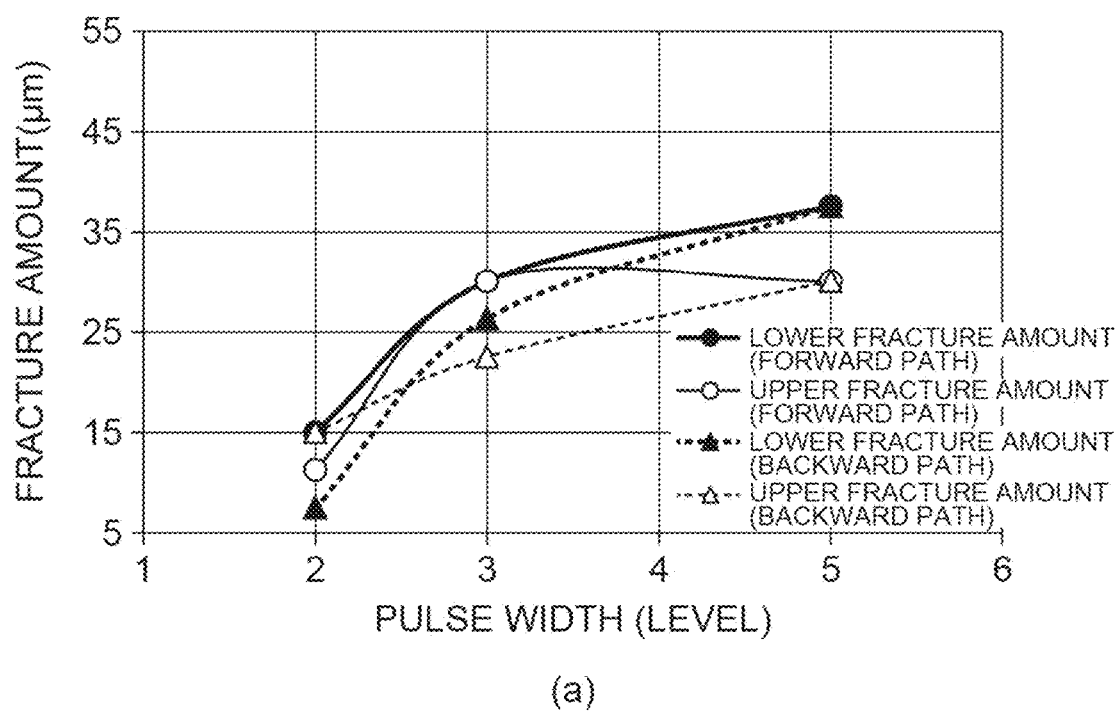
(a)
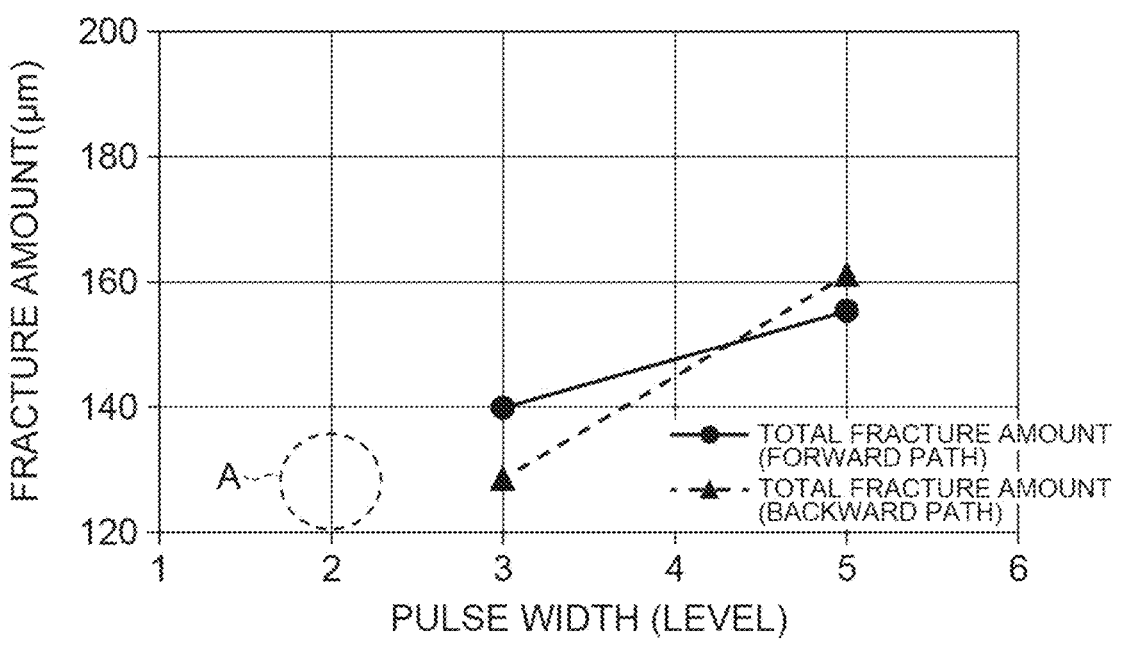
(b)

(a)                    (b)                    (c)

*Fig.22*
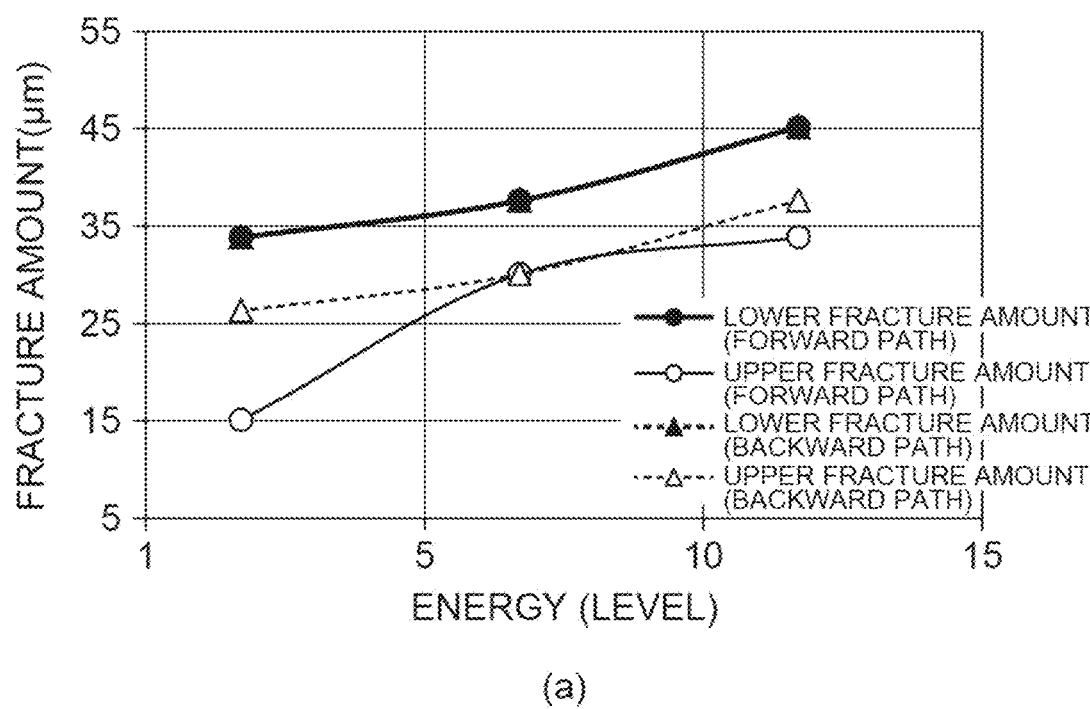
(a)
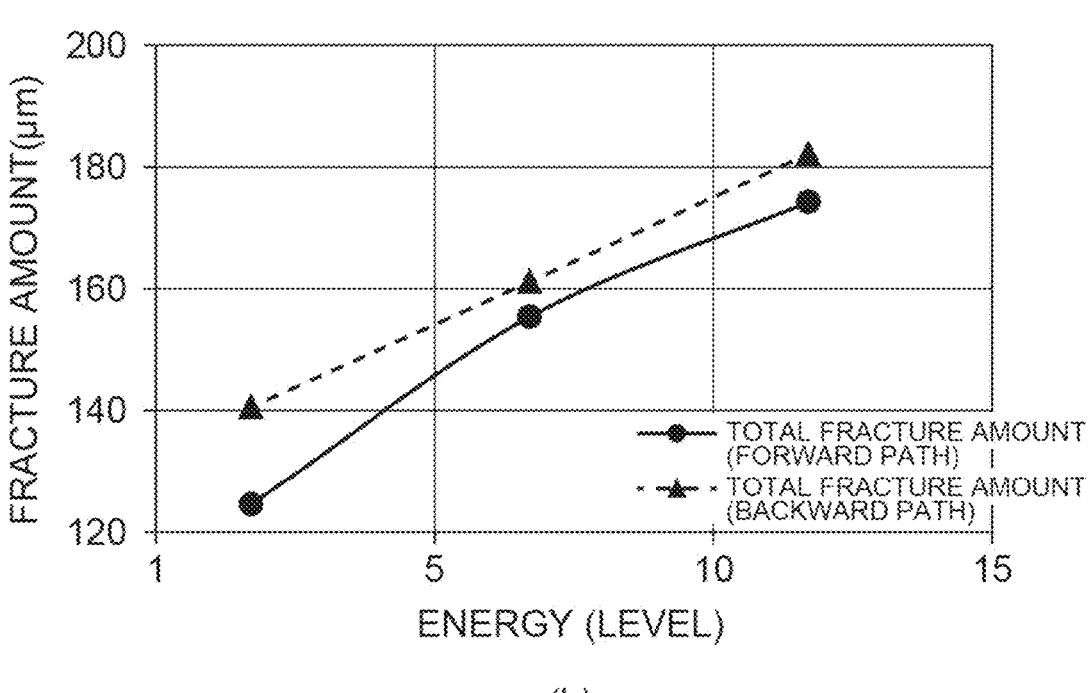
(b)

(a)                    (b)                    (c)

*Fig.24*
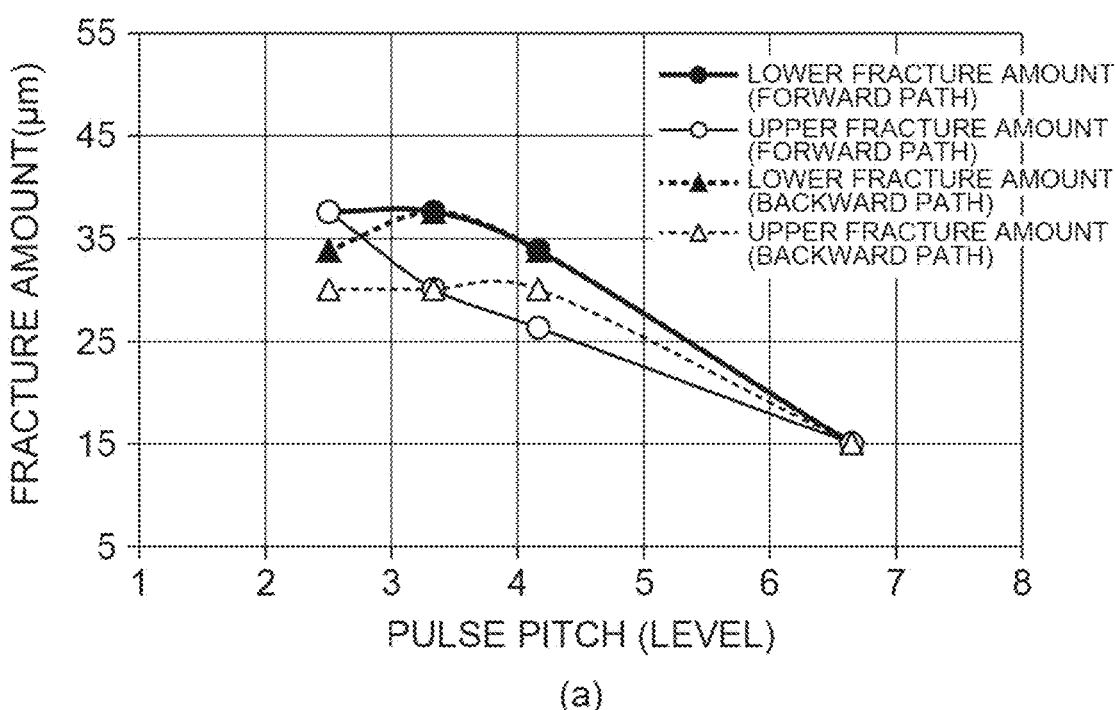
(a)
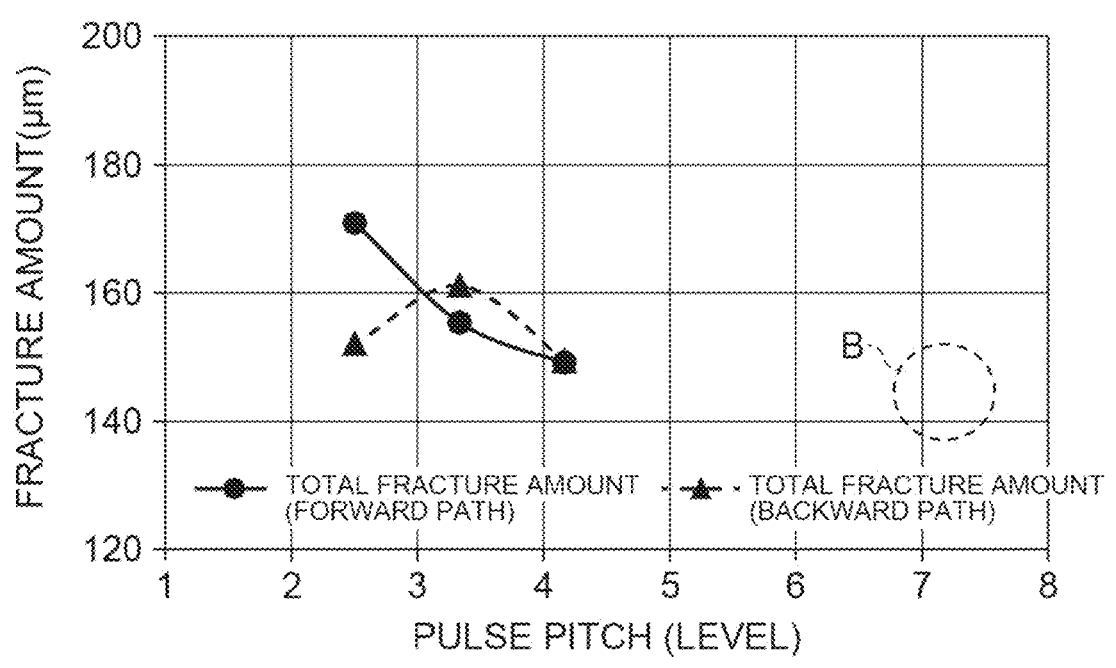
(b)

*Fig.26*
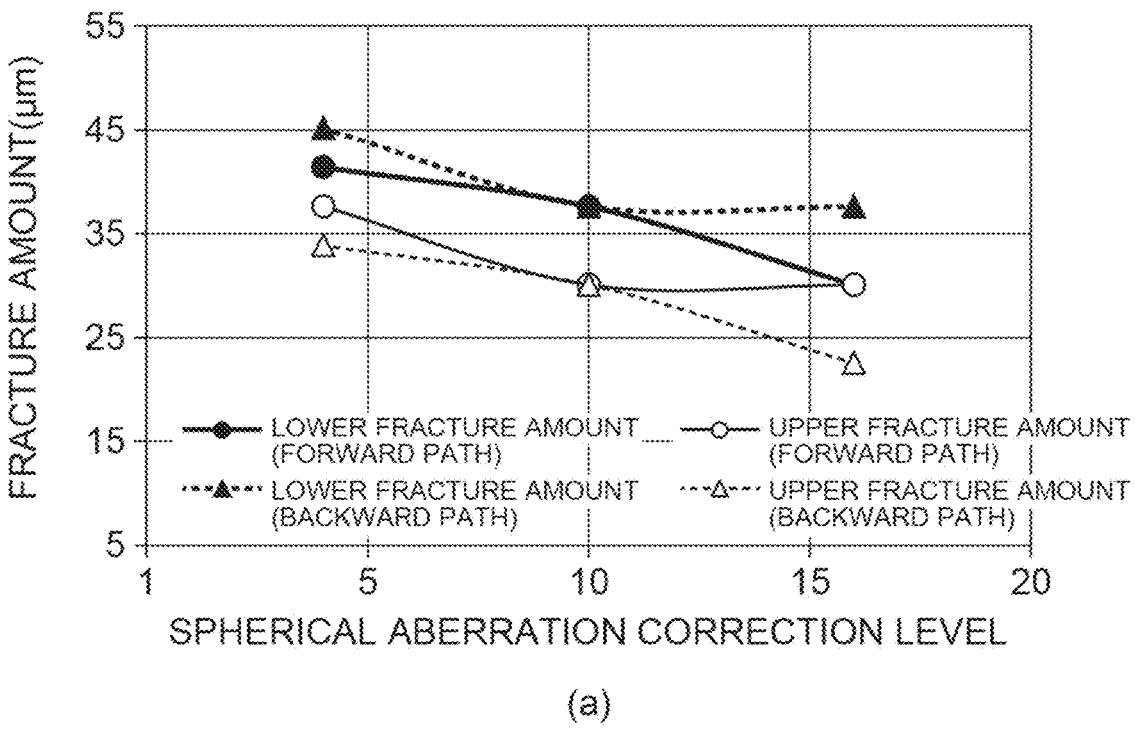
(a)
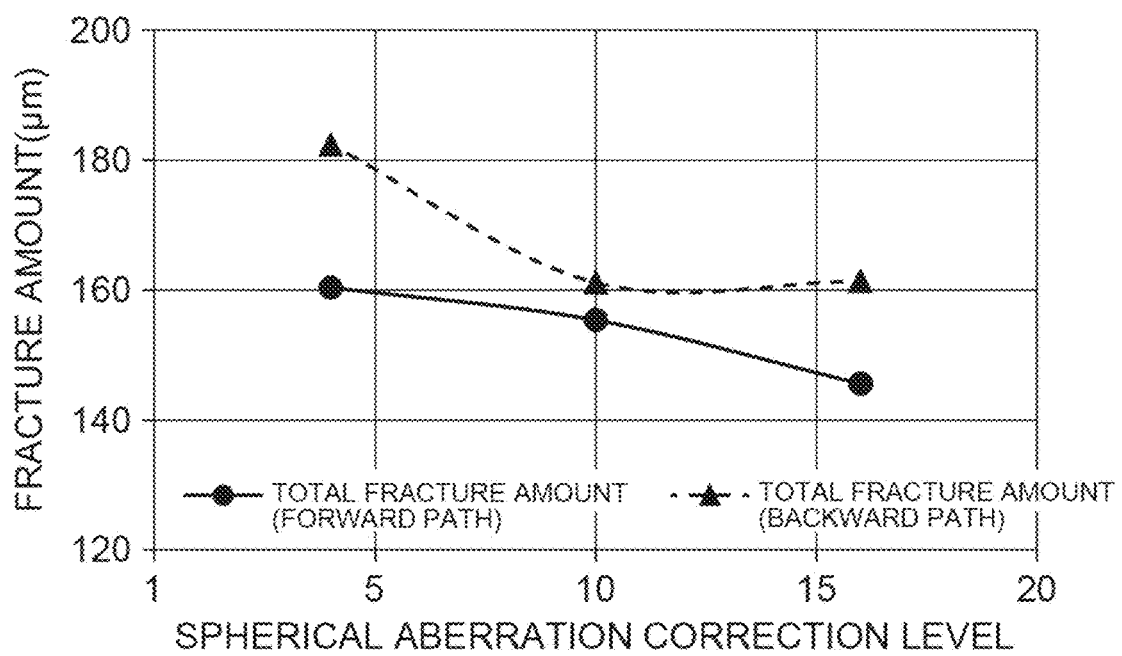
(b)

(a)                    (b)                    (c)

*Fig.28*
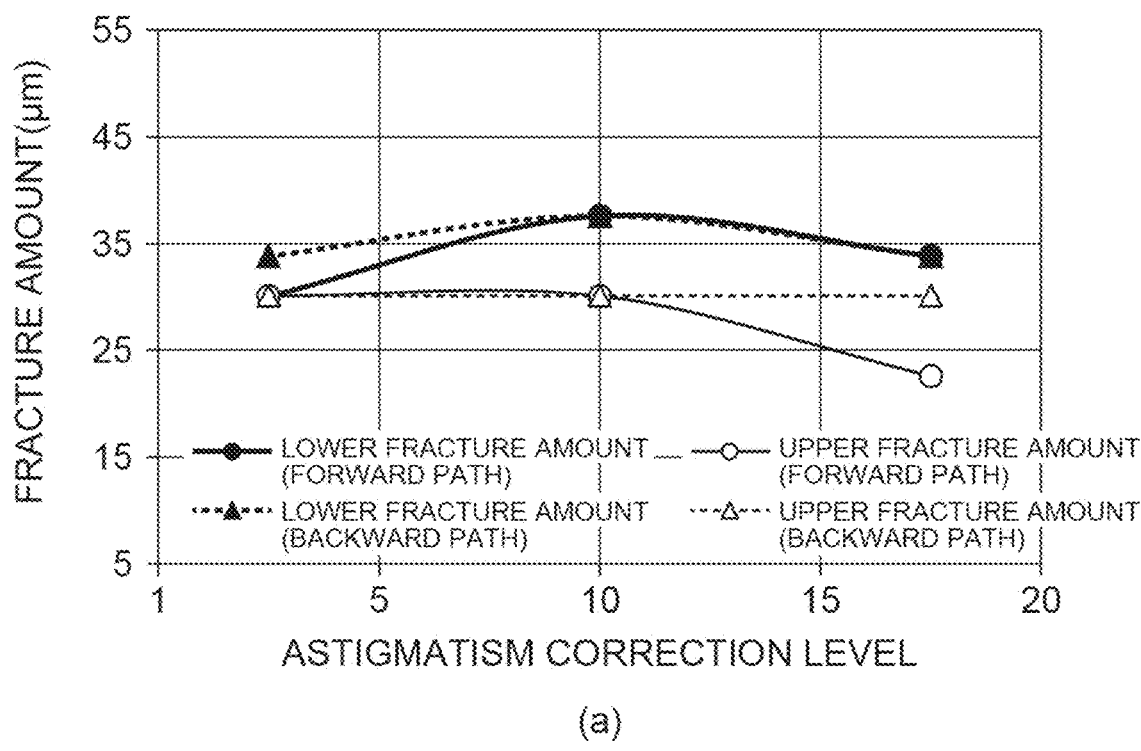
(a)
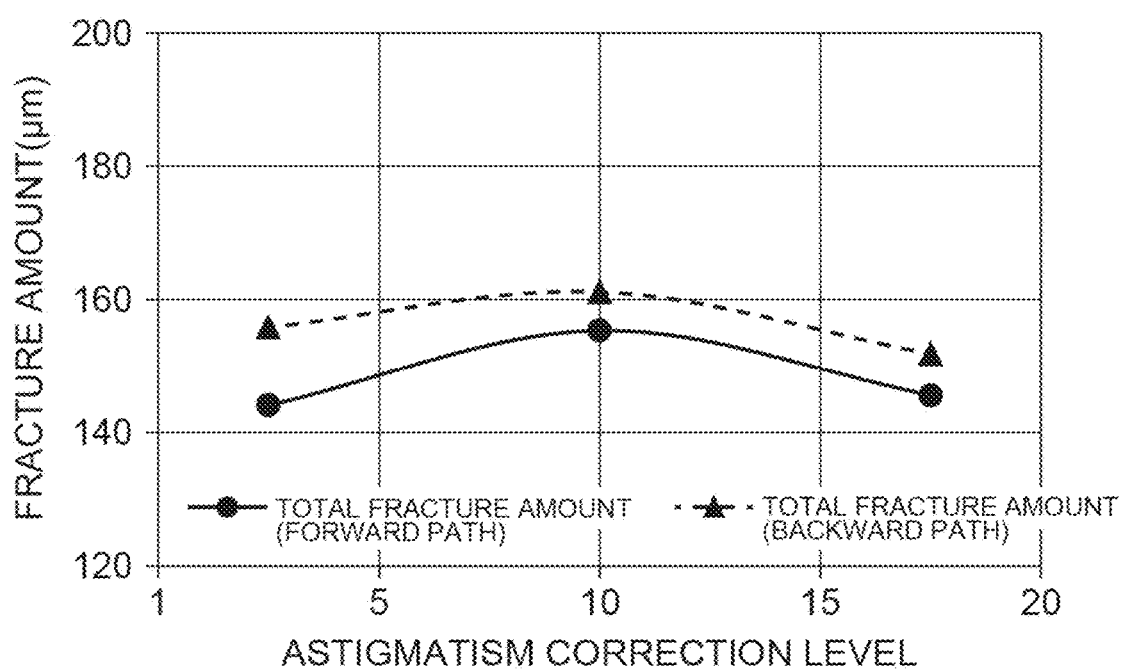
(b)

(a)                    (b)                    (c)

*Fig.30*
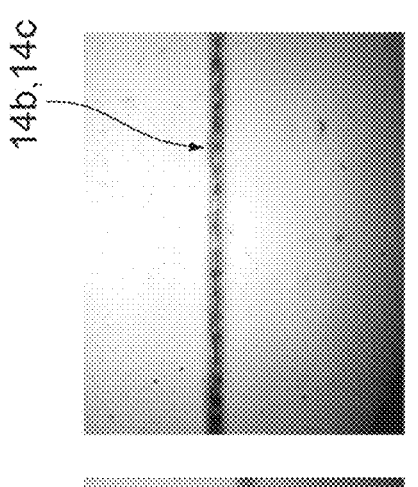
14b,14c
(d)
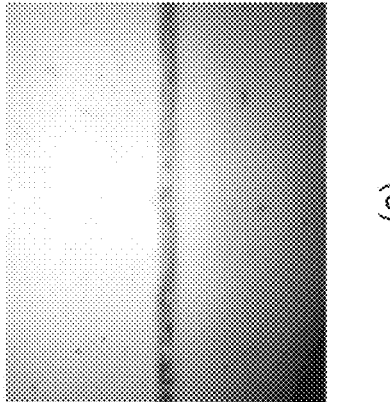
(c)
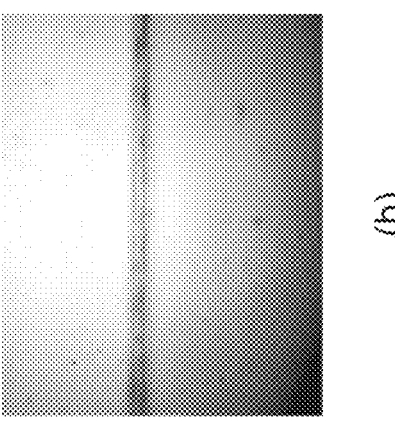
(b)
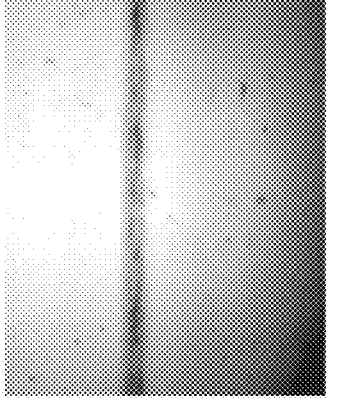
(a)

*Fig.31*
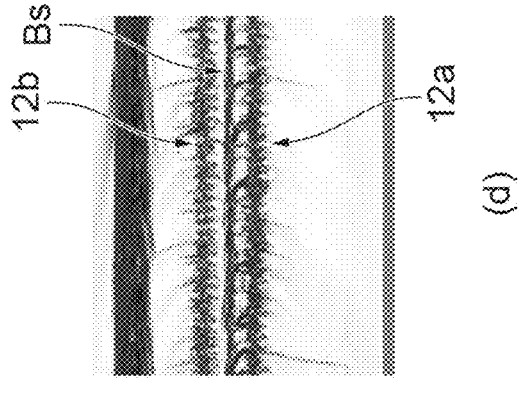
(d)
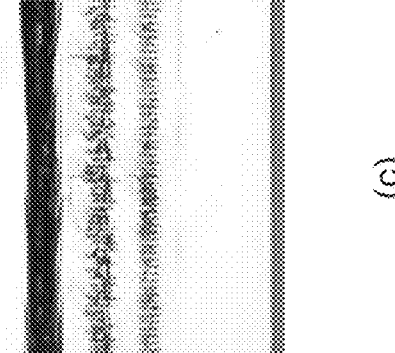
(c)
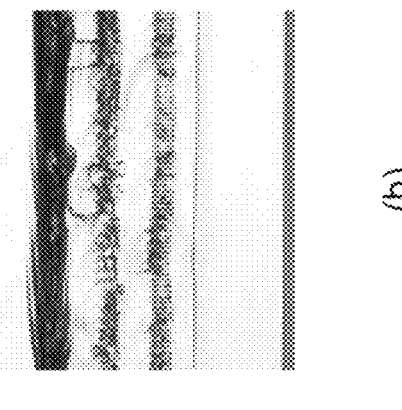
(b)
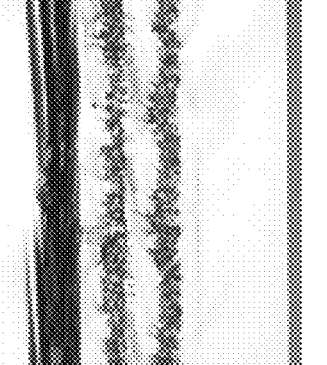
(a)

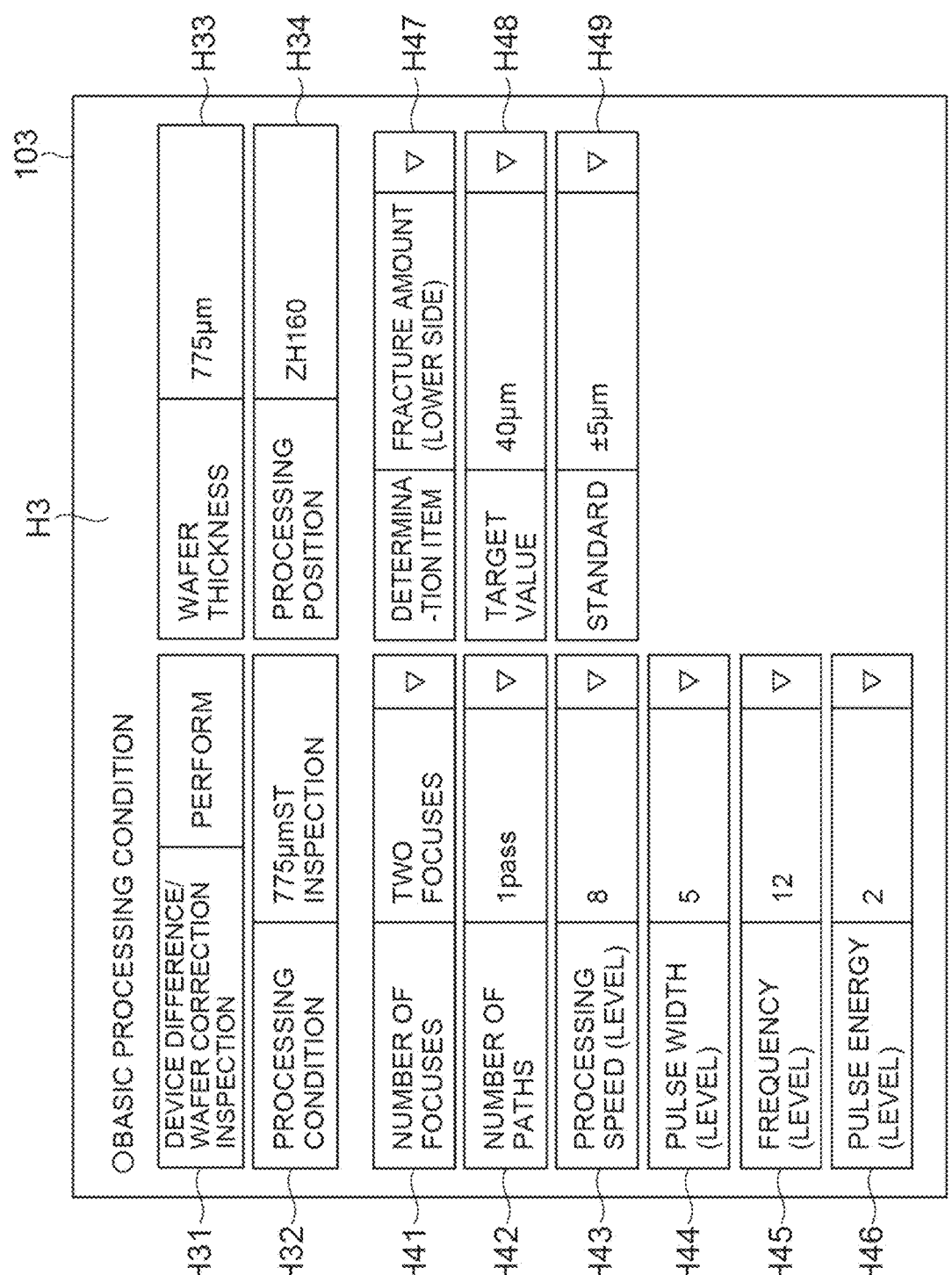

| ○BASIC PROCESSING CONDITION | | | | | |
|---|---|---|---|---|---|
| DEVICE DIFFERENCE/ WAFER CORRECTION INSPECTION | PERFORM | | WAFER THICKNESS | 775μm | |
| PROCESSING CONDITION | 775μmST INSPECTION | | PROCESSING POSITION | ZH160 | |
| NUMBER OF FOCUSES | TWO FOCUSES | ▷ | DETERMINA -TION ITEM | FRACTURE AMOUNT (LOWER SIDE) | ▷ |
| NUMBER OF PATHS | 1pass | ▷ | TARGET VALUE | 40μm | ▷ |
| PROCESSING SPEED (LEVEL) | 8 | ▷ | STANDARD | ±5μm | ▷ |
| PULSE WIDTH (LEVEL) | 5 | ▷ | | | |
| FREQUENCY (LEVEL) | 12 | ▷ | | | |
| PULSE ENERGY (LEVEL) | 2 | ▷ | | | |

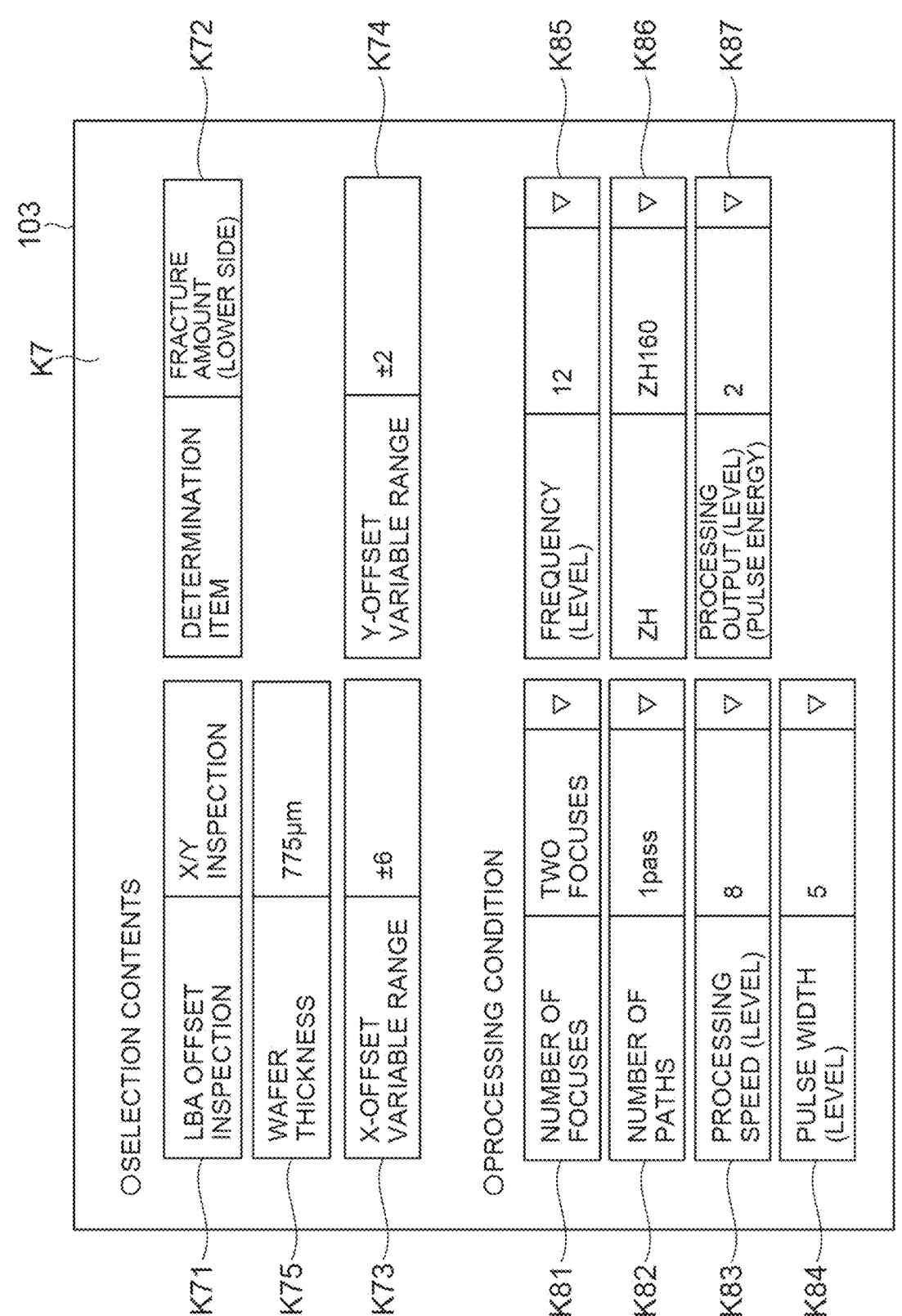

K7          103

○SELECTION CONTENTS

| LBA OFFSET INSPECTION | X/Y INSPECTION | | DETERMINATION ITEM | FRACTURE AMOUNT (LOWER SIDE) |
|---|---|---|---|---|
| WAFER THICKNESS | 775μm | | | |
| X-OFFSET VARIABLE RANGE | ±6 | | Y-OFFSET VARIABLE RANGE | ±2 |

K71    K72    K74    K75    K73

○PROCESSING CONDITION

| NUMBER OF FOCUSES | TWO FOCUSES | ▷ | FREQUENCY (LEVEL) | 12 | ▷ |
|---|---|---|---|---|---|
| NUMBER OF PATHS | 1pass | ▷ | ZH | ZH160 | ▷ |
| PROCESSING SPEED (LEVEL) | 8 | ▷ | PROCESSING OUTPUT (LEVEL) (PULSE ENERGY) | 2 | ▷ |
| PULSE WIDTH (LEVEL) | 5 | ▷ | | | |

K81    K82    K83    K84    K85    K86    K87

*Fig.50*
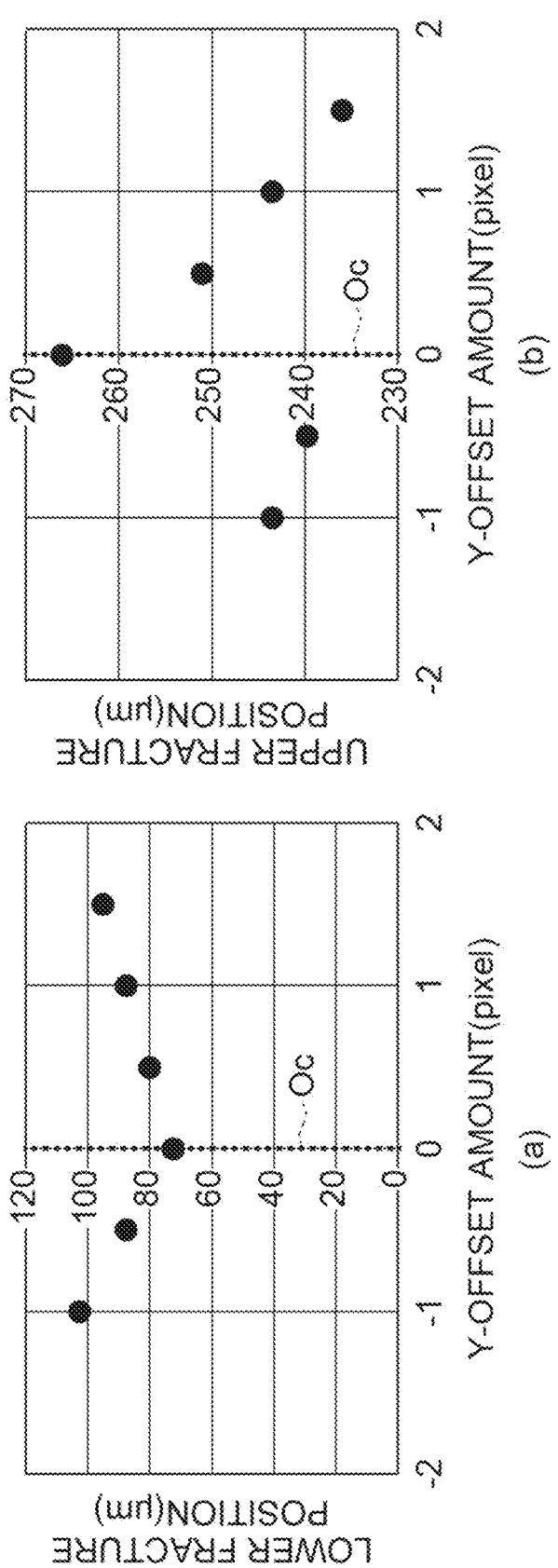
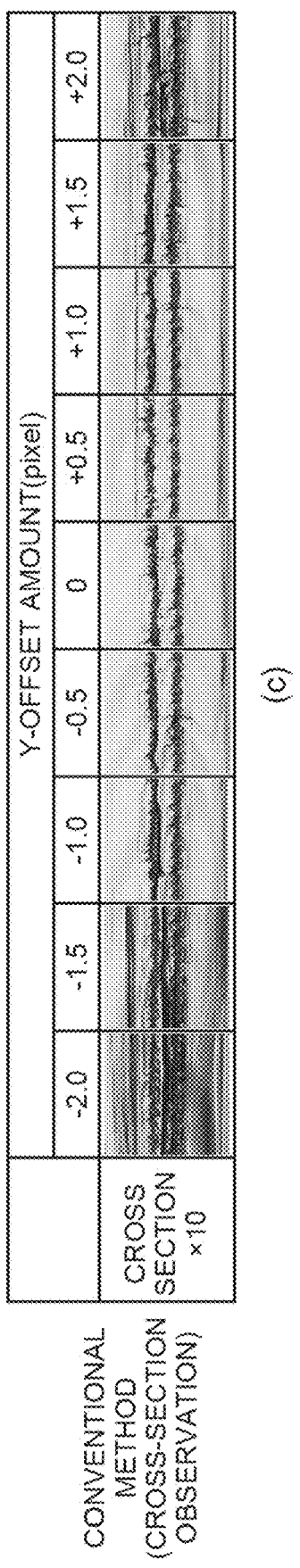

*Fig.51*
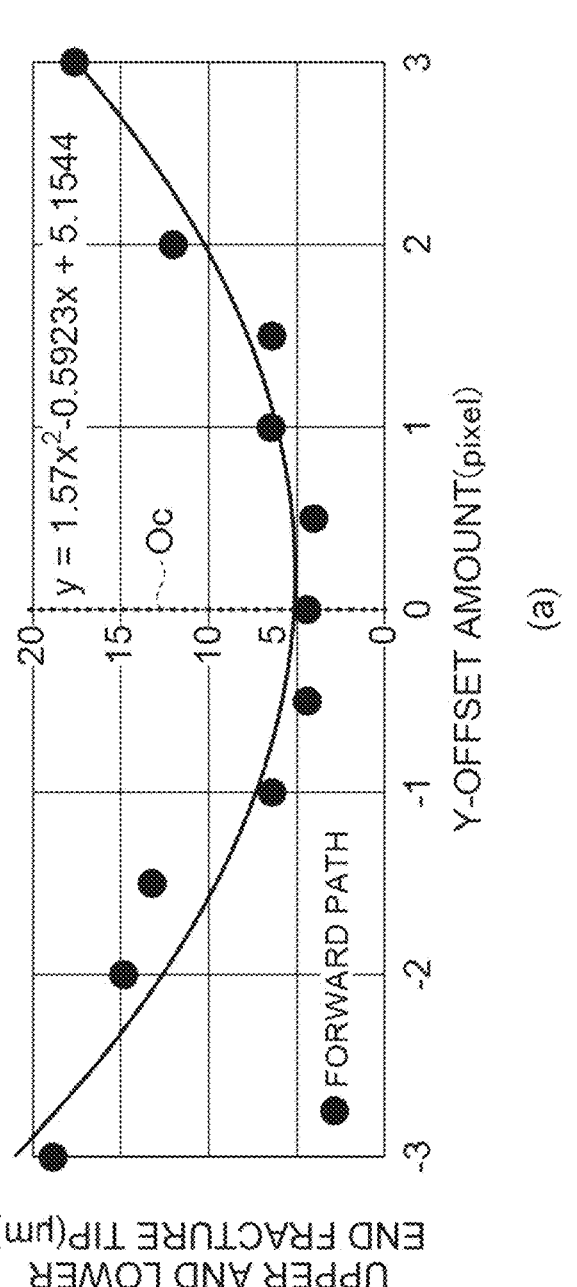
(a)
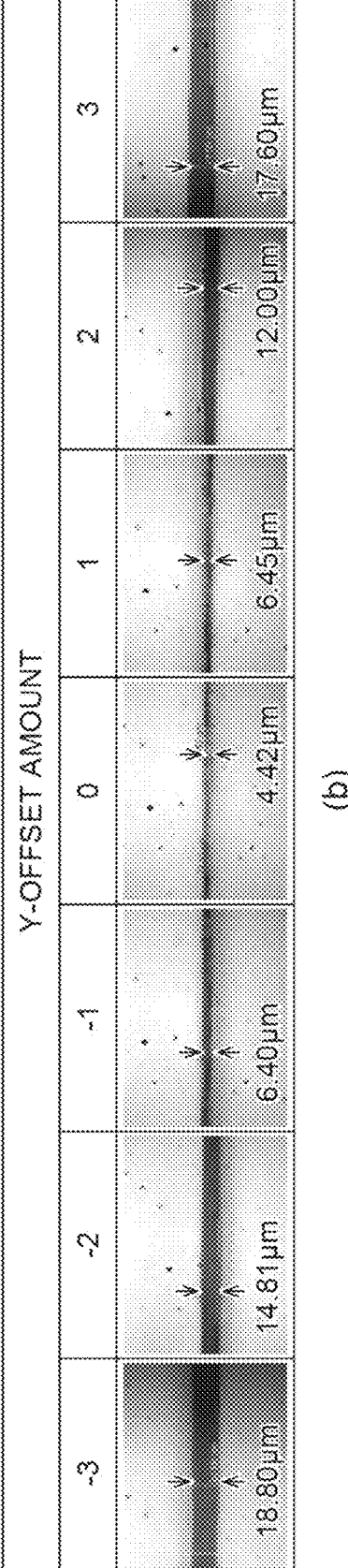
(b)

*Fig.54*

LASER PROCESSING DEVICE AND LASER PROCESSING METHOD

TECHNICAL FIELD

The present disclosure relates to a laser processing device and a laser processing method.

BACKGROUND ART

Patent Literature 1 discloses a laser dicing device. The laser dicing device includes a stage that moves a wafer, a laser head that irradiates the wafer with laser light, and a control unit that controls each unit. The laser head includes a laser light source that emits processing laser light for forming a modified region in the wafer, a dichroic mirror and a condenser lens that are sequentially arranged on an optical path of the processing laser light, and an AF device.

CITATION LIST

Patent Literature

Patent Literature 1: Japanese Patent No. 5743123

SUMMARY OF INVENTION

Technical Problem

By the way, in order to adjust an irradiation condition of the laser light with respect to an object such as the wafer to be a condition allowing a desirable processing result to be obtained, it is conceivable that the following step is performed. That is, first, laser processing is performed under a predetermined irradiation condition. Then, the object is cut so that the cross section in which the modified region and the like are formed is exposed. Then, an actual processing result with respect to the irradiation condition is grasped by observing the cut surface. Then, pass/fail determination of whether or not the processing result is a desired result is performed, and the irradiation condition is corrected when the result does not reach the desired result.

On the other hand, in such a method, it takes time to adjust the irradiation condition, and it is necessary to have advanced know-how of cross-section observation. Thus, in the above technical field, it is desirable to facilitate the pass/fail determination of the irradiation condition based on the processing result.

An object of the present disclosure is to provide a laser processing device and a laser processing method capable of facilitating pass/fail determination of an irradiation condition of laser light based on a processing result.

Solution to Problem

According to the present disclosure, a laser processing device includes an irradiation unit configured to irradiate an object with laser light, an image capturing part configured to capture an image of the object, and a control unit configured to control at least the irradiation unit and the image capturing part. The control unit performs a first process of irradiating the object with the laser light by control of the irradiation unit to form a modified spot and a fracture extending from the modified spot in the object so as not to reach an outer surface of the object, a second process of, after the first process, capturing an image of the object with light having transparency to the object and acquiring information indicating a formation state of the modified spot and/or the fracture, by control of the image capturing part, and a third process of, after the second process, performing pass/fail determination of an irradiation condition in the first process, based on the information indicating the formation state acquired in the second process.

According to the present disclosure, a laser processing method includes a first step of irradiating an object with laser light to form a modified spot and a fracture extending from the modified spot in the object so as not to reach an outer surface of the object, a second step of, after the first step, capturing an image of the object with light having transparency to the object and acquiring information indicating a formation state of the modified spot and/or the fracture, and a third step of, after the second step, performing pass/fail determination of an irradiation condition in the first step, based on the information indicating the formation state acquired in the second step.

In the device and the method, a modified spot and the like (a modified spot and a fracture extending from the modified spot) are formed by irradiating an object with laser light, and then an image of the object is captured by light transmitted through the object, and a formation state (processing result) of the modified spot or the like is acquired. Then, pass/fail determination of an irradiation condition of the laser light is performed based on a formation state of the modified spot and the like. Thus, it is not necessary to cut the object or perform cross-section observation when pass/fail determination of the irradiation condition of the laser light is performed based on the formation state of the modified spot or the like. Therefore, according to the device and the method, the pass/fail determination of the irradiation condition of the laser light based on the processing result is facilitated.

In the laser processing device according to the present disclosure, the control unit may perform, before the first process, a fourth process of determining whether or not the irradiation condition is a non-reaching condition being a condition under which the fracture does not reach the outer surface, and may perform the first process in a case where the irradiation condition is the non-reaching condition as a result of the determination in the fourth process. In this case, it is possible to reliably perform processing so that the fracture does not reach the outer surface of the object.

In the laser processing device according to the present disclosure, the control unit may perform a fifth process of determining whether or not the fracture reaches the outer surface based on the information indicating the formation state acquired in the second process, after the second process and before the third process, and may perform the third process in a case where the fracture does not reach the outer surface as a result of the determination in the fifth process. In this case, it is possible to reliably perform pass/fail determination of the irradiation condition of the laser light in a state where the fracture does not reach the outer surface of the object.

The laser processing device according to the present disclosure may further include a display unit for displaying information and an input unit for receiving an input. In this case, it is possible to present information to the user, and receive an input of information from the user.

In the laser processing device according to the present disclosure, the control unit may perform a sixth process of causing the display unit to display information indicating a result of the pass/fail determination by control of the display unit, after the third process. In this case, it is possible to present the result of the pass/fail determination to a user.

In the laser processing device according to the present disclosure, the control unit may perform, before the third process, a seventh process of causing the display unit to display information for urging an input of a target value of a formation state by control of the display unit. The input unit may receive the input of the target value. The control unit may perform pass/fail determination by comparing the formation state under the irradiation condition in the first process to the target value based on the information indicating the formation state acquired in the second process, in the third process. In this case, it is possible to perform the pass/fail determination on a processing state (target value of the formation state) desired by the user.

In the laser processing device according to the present disclosure, the control unit may correct, as a correction item, at least one of a plurality of irradiation condition items included in the irradiation condition and perform re-determination of performing the first process and the subsequent processes again, in response to a result of the pass/fail determination in the third process. In this case, it is possible to automatically correct and re-determine the irradiation condition of the laser light in response to the result of the pass/fail determination.

In the laser processing device according to the present disclosure, the control unit may perform an eighth process of causing the display unit to display information for urging selection of whether or not to perform re-determination of correcting at least one of a plurality of irradiation condition items included in the irradiation condition as a correction item and performing the first process and the subsequent processes again in response to a result of the pass/fail determination in the third process, by control of the display unit. The input unit may receive an input of the selection of whether or not to perform the re-determination. The control unit may perform the re-determination in a case where the input unit receives the selection to perform the re-determination. In this case, in a case where the result of the pass/fail determination is fail, it is possible to select whether or not to correct and re-determine the irradiation condition of the laser light.

In the laser processing device according to the present disclosure, the control unit may perform a ninth process of causing the display unit to display information for urging selection of the correction item by control of the display unit. The input unit may receive an input of the selection of the correction item. The control unit may correct the correction item received by the input unit and perform re-determination.

At this time, the irradiation condition may include, as irradiation condition items, at least one of a pulse waveform of the laser light, pulse energy of the laser light, a pulse pitch of the laser light, a condensing state of the laser light, and an interval of the modified spots in a direction intersecting with an incident surface of the laser light of the object in the first process, in a case where a plurality of modified spots is formed at positions different from each other in the direction intersecting with the incident surface.

In addition, the laser processing device according to the present disclosure may further include a spatial light modulator configured to display a spherical aberration correction pattern for correcting spherical aberration of the laser light, and a condenser lens for condensing, on the object, the laser light modulated by the spherical aberration correction pattern in the spatial light modulator. The condensing state may include an offset amount of a center of the spherical aberration correction pattern with respect to a center of a pupil surface of the condenser lens.

In these cases, it is possible to correct an item selected by the user in the irradiation condition of the laser light and then perform re-determination.

In the laser processing device according to the present invention, the control unit may perform, before the third process, a tenth process of causing the display unit to display information for urging selection of a determination item by control of the display unit, the determination item being an item used for the pass/fail determination among a plurality of formation state items included in the formation state. The input unit may receive an input of the selection of the determination item. The control unit may perform the pass/fail determination based on information indicating the determination item in the formation state acquired in the second process, in the third process.

At this time, the object may include a first surface that is an incident surface of the laser light and a second surface on an opposite side of the first surface. The fracture may include a first fracture extending from the modified spot to the first surface side and a second fracture extending from the modified spot to the second surface side. The formation state may include, as the formation state item, a length of the first fracture in a first direction intersecting with the first surface, a length of the second fracture in the first direction, a total length of the fractures in the first direction, a position of a first end that is a tip of the first fracture on the first surface side in the first direction, a position of a second end that is a tip of the second fracture on the second surface side in the first direction, a shift width between the first end and the second end when viewed from the first direction, presence or absence of a dent of the modified spot, a meandering amount of the second end when viewed from the first direction, and presence or absence of the tip of the fracture in a region between the modified spots arranged in the direction intersecting with the first surface in a case where a plurality of the modified spots is formed at positions different from each other in the direction intersecting with the first surface in the first process.

In these cases, it is possible to perform the pass/fail determination of the item selected by the user in the formation state of the modified spot or the like.

Advantageous Effects of Invention

According to the present disclosure, it is possible to provide a laser processing device and a laser processing method capable of facilitating pass/fail determination of an irradiation condition of laser light based on a processing result.

BRIEF DESCRIPTION OF DRAWINGS

FIG. 11 is an SEM image of a modified region and a fracture formed in a semiconductor substrate.

FIG. 13 is an optical path diagram for explaining the image capturing principle by the image capturing unit illustrated in FIG. 7, and is a schematic diagram illustrating an image at a focus by the image capturing unit.

FIG. 14 is an optical path diagram for explaining the image capturing principle by the image capturing unit illustrated in FIG. 7, and is a schematic diagram illustrating an image at a focus by the image capturing unit.

FIG. 18 is a diagram illustrating a change in a fracture amount in a case where a modified region interval is changed at three points.

FIG. 20 is a diagram illustrating a change in a fracture amount in a case where a pulse width of laser light is changed at three points.

FIG. 22 is a diagram illustrating a change in a fracture amount in a case where pulse energy of laser light is changed at three points.

FIG. 24 is a diagram illustrating a change in a fracture amount in a case where a pulse pitch of laser light is changed at four points.

FIG. 26 is a diagram illustrating a change in a fracture amount in a case where a condensing state (spherical aberration correction level) of laser light is changed at three points.

FIG. 28 is a diagram illustrating a change in a fracture amount in a case where a condensing state (astigmatism correction level) of laser light is changed at three points.

FIG. 30 is a diagram illustrating a change in the presence or absence of a black streak in a case where the pulse pitch of the laser light is changed at four points.

FIG. 31 is a diagram illustrating the change in the presence or absence of the black streak in a case where the pulse pitch of the laser light is changed at the four points.

FIG. 34 is a diagram illustrating an input reception unit in a state where an example of basic processing conditions is displayed.

FIG. 48 is a diagram illustrating an input reception unit in a state where a setting screen is displayed.

FIG. 50 is a diagram illustrating a relationship between the Y-offset amount and the determination item.

FIG. 51 is a diagram illustrating a relationship between the Y-offset amount and a determination item.

FIG. 54 is a diagram illustrating a relationship between an X-offset amount and a determination item.

DESCRIPTION OF EMBODIMENTS

Figure 1:
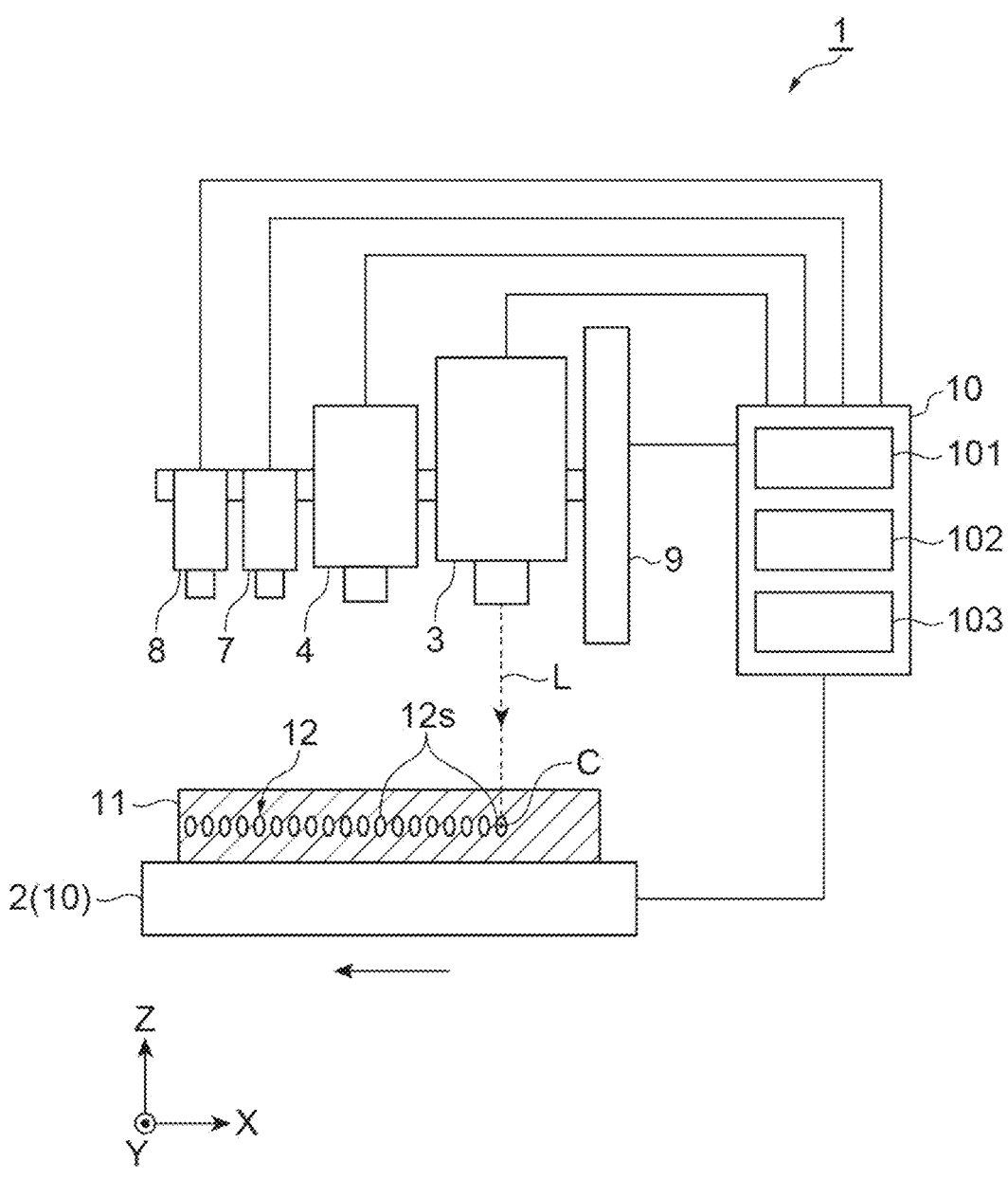
FIG. 1 is a schematic diagram illustrating a configuration of a laser processing device according to an embodiment.

Hereinafter, an embodiment will be described in detail with reference to the drawings. In the drawings, the same or the corresponding parts are denoted by the same reference signs, and repetitive descriptions thereof will be omitted. In addition, each drawing may illustrate an orthogonal coordinate system defined by an X-axis, a Y-axis, and a Z-axis.

FIG. 1 is a schematic diagram illustrating a configuration of a laser processing device according to an embodiment. As illustrated in FIG. 1, a laser processing device 1 includes a stage 2, a laser irradiation unit 3, a plurality of image capturing units 4, 7, and 8, a drive unit 9, and a control unit 10. The laser processing device 1 is a device that forms a modified region 12 on an object 11 by irradiating the object 11 with laser light L.

The stage 2 supports the object 11 by, for example, adsorbing a film attached to the object 11. The stage 2 can move along an X-direction and a Y-direction, respectively, and can rotate around an axis parallel to a Z-direction as a center line. The X-direction and the Y-direction are referred to as a first horizontal direction and a second horizontal direction that intersect with each other (are perpendicular to each other), and the Z-direction is referred to as a vertical direction.

The laser irradiation unit (irradiation unit) 3 collects the laser light L having transparency to the object 11 and the object 11 with the laser light. If the laser light L is focused in the object 11 supported by the stage 2, the laser light L is particularly absorbed at a portion corresponding to a focusing point C of the laser light L, and thus the modified region 12 is formed in the object 11.

The modified region 12 is a region in which the density, the refractive index, the mechanical strength, and other physical properties are different from those of the surrounding non-modified region. Examples of the modified region 12 include a melting treatment region, a fracture region, a dielectric breakdown region, and a refractive index change region. The modified region 12 may be formed so that a fracture extends from the modified region 12 to the incident side of the laser light L and the opposite side thereof. Such a modified region 12 and a fracture are used, for example, to cut the object 11.

As an example, if the stage 2 is moved along the X-direction and the focusing point C is moved relative to the object 11 along the X-direction, a plurality of modified spots 12s are formed to be arranged in one row along the X-direction. One modified spot 12s is formed by irradiation with the laser light L of one pulse. The modified region 12 in one row is a set of a plurality of modified spots 12s arranged in one row. Thus, similar to the modified region 12, a modified spot 12s is a spot that differs from the surrounding non-modified portions in density, refractive index, mechanical strength, and other physical properties. Adjacent modified spots 12s may be connected to each other or separated from each other, depending on the relative movement speed of the focusing point C with respect to the object 11 and the repetition frequency of the laser light L.

The image capturing unit (image capturing part) 4 captures images of the modified region 12 formed on the object

11 and the tip of the fracture extending from the modified region 12 (details will be described later). Under the control of the control unit 10, the image capturing units 7 and 8 capture an image of the object 11 supported by the stage 2 with light transmitted through the object 11. The images obtained by the image capturing units 7 and 8 performing image capturing are, for example, used for alignment of the irradiation position of the laser light L.

The drive unit 9 supports the laser irradiation unit 3 and a plurality of image capturing units 4, 7, and 8. The drive unit 9 moves the laser irradiation unit 3 and the plurality of image capturing units 4, 7, 8 along the Z-direction.

The control unit 10 controls the operations of the stage 2, the laser irradiation unit 3, the plurality of image capturing units 4, 7, 8, and the drive unit 9. The control unit 10 includes a processing unit 101, a storage unit 102, and an input reception unit (display unit, input unit) 103. The processing unit 101 is configured as a computer device including a processor, a memory, a storage, a communication device, and the like. In the processing unit 101, the processor performs software (program) read into the memory or the like, and controls reading and writing of data in the memory and the storage, and communication by a communication device. The storage unit 102 is, for example, a hard disk or the like, and stores various types of data. The input reception unit 103 is an interface unit that displays various types of information and receives inputs of various types of information from the user. In the present embodiment, the input reception unit 103 constitutes a graphical user interface (GUI).

[Configuration of Object]

Figure 2:
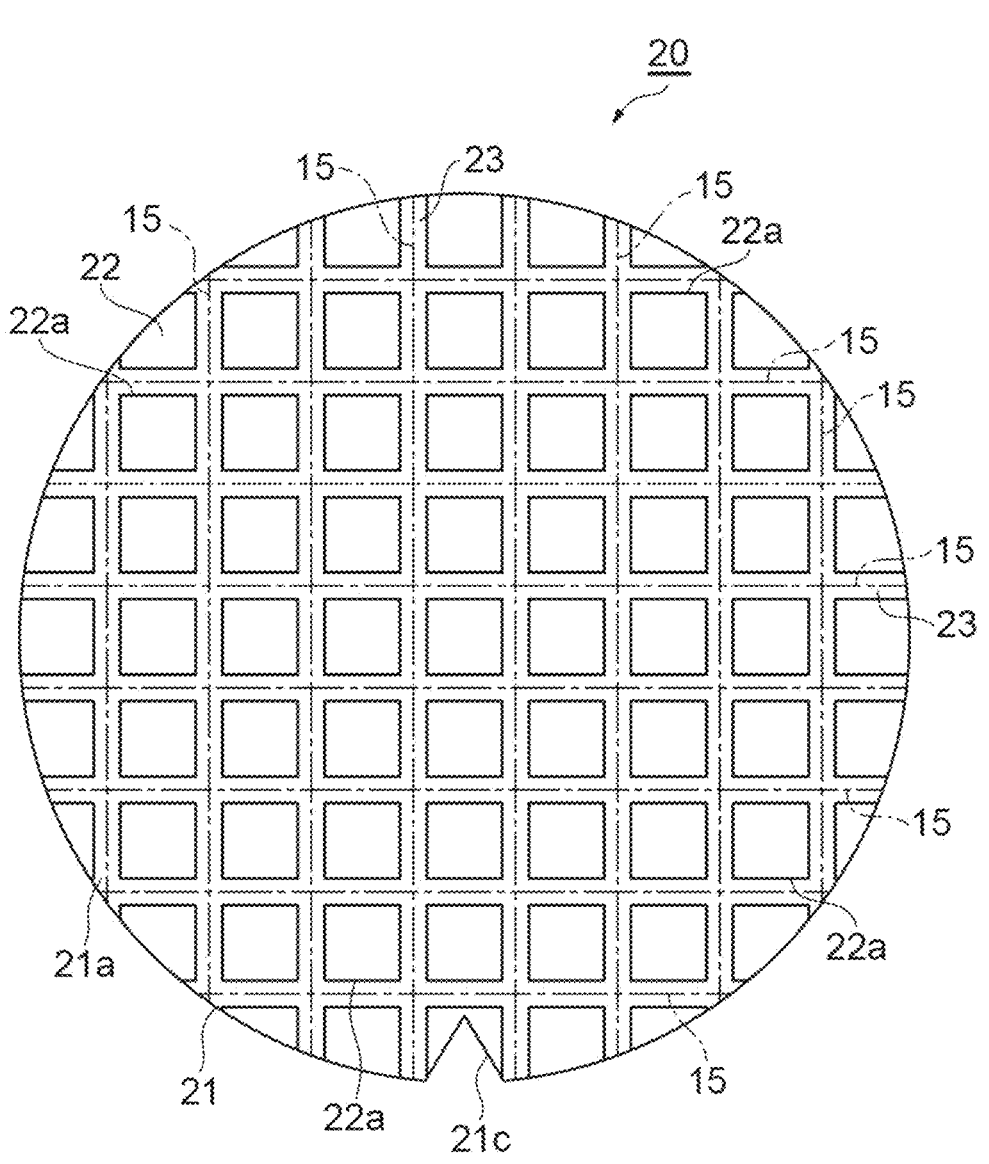
FIG. 2 is a plan view illustrating a wafer in an embodiment.
Figure 3:
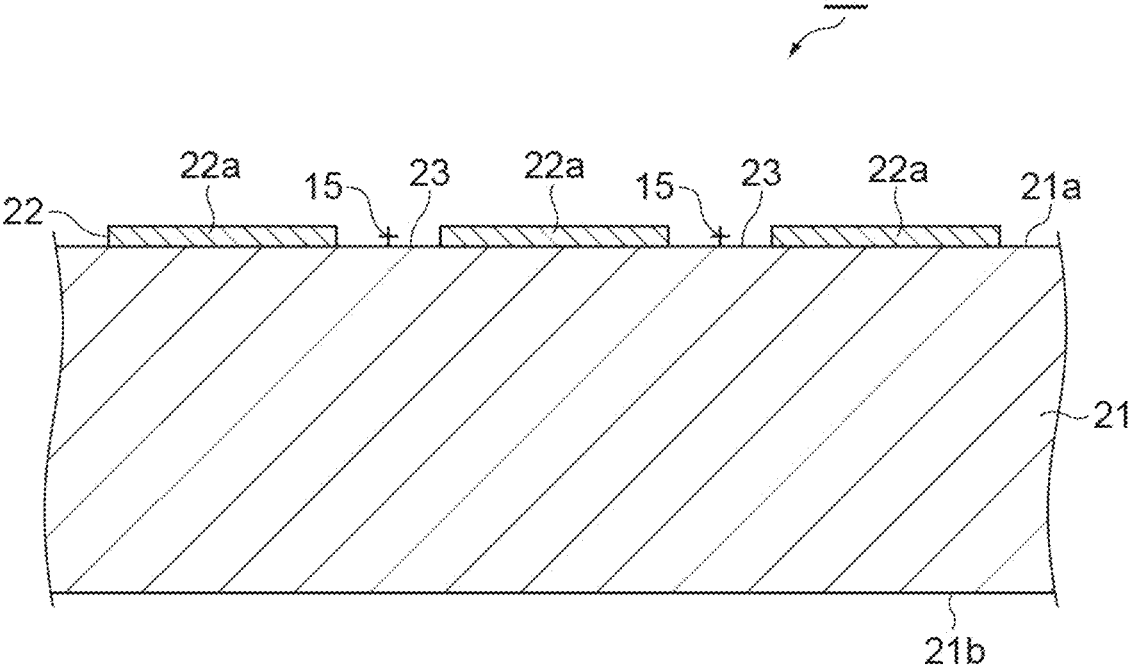
FIG. 3 is a cross-sectional view illustrating a portion of the wafer illustrated in FIG. 2.

FIG. 2 is a plan view illustrating a wafer in an embodiment. FIG. 3 is a cross-sectional view illustrating a portion of the wafer illustrated in FIG. 2. The object 11 in the present embodiment is a wafer 20 illustrated in FIGS. 2 and 3 as an example. The wafer 20 includes a semiconductor substrate 21 and a functional element layer 22. The semiconductor substrate 21 has a front surface 21a and a back surface 21b. As an example, the back surface 21b is a first surface serving as an incident surface of the laser light L or the like, and the front surface 21a is a second surface opposite to the first surface. The semiconductor substrate 21 is, for example, a silicon substrate. The functional element layer 22 is formed on the front surface 21a of the semiconductor substrate 21. The functional element layer 22 includes a plurality of functional elements 22a arranged two-dimensionally along the front surface 21a.

The functional element 22a is, for example, a light receiving element such as a photodiode, a light emitting element such as a laser diode, a circuit element such as a memory, or the like. The functional element 22a may be configured three-dimensionally by stacking a plurality of layers. Although the semiconductor substrate 21 is provided with a notch 21c indicating the crystal orientation, an orientation flat may be provided instead of the notch 21c. The object 11 may be a bare wafer.

The wafer 20 is cut into functional elements 22a along each of the plurality of lines 15. The plurality of lines 15 pass between a plurality of functional elements 22a in a case of being viewed from the thickness direction of the wafer 20. More specifically, the line 15 passes through the center (center in the width direction) of a street region 23 in a case of being viewed from the thickness direction of the wafer 20. The street region 23 extends to pass between adjacent functional elements 22a in the functional element layer 22. In the present embodiment, the plurality of functional elements 22a are arranged in a matrix along the front surface 21a, and the plurality of lines 15 are set in a grid. Although the line 15 is a virtual line, the line may be a line actually drawn.

[Configuration of Laser Irradiation Unit]

Figure 4:
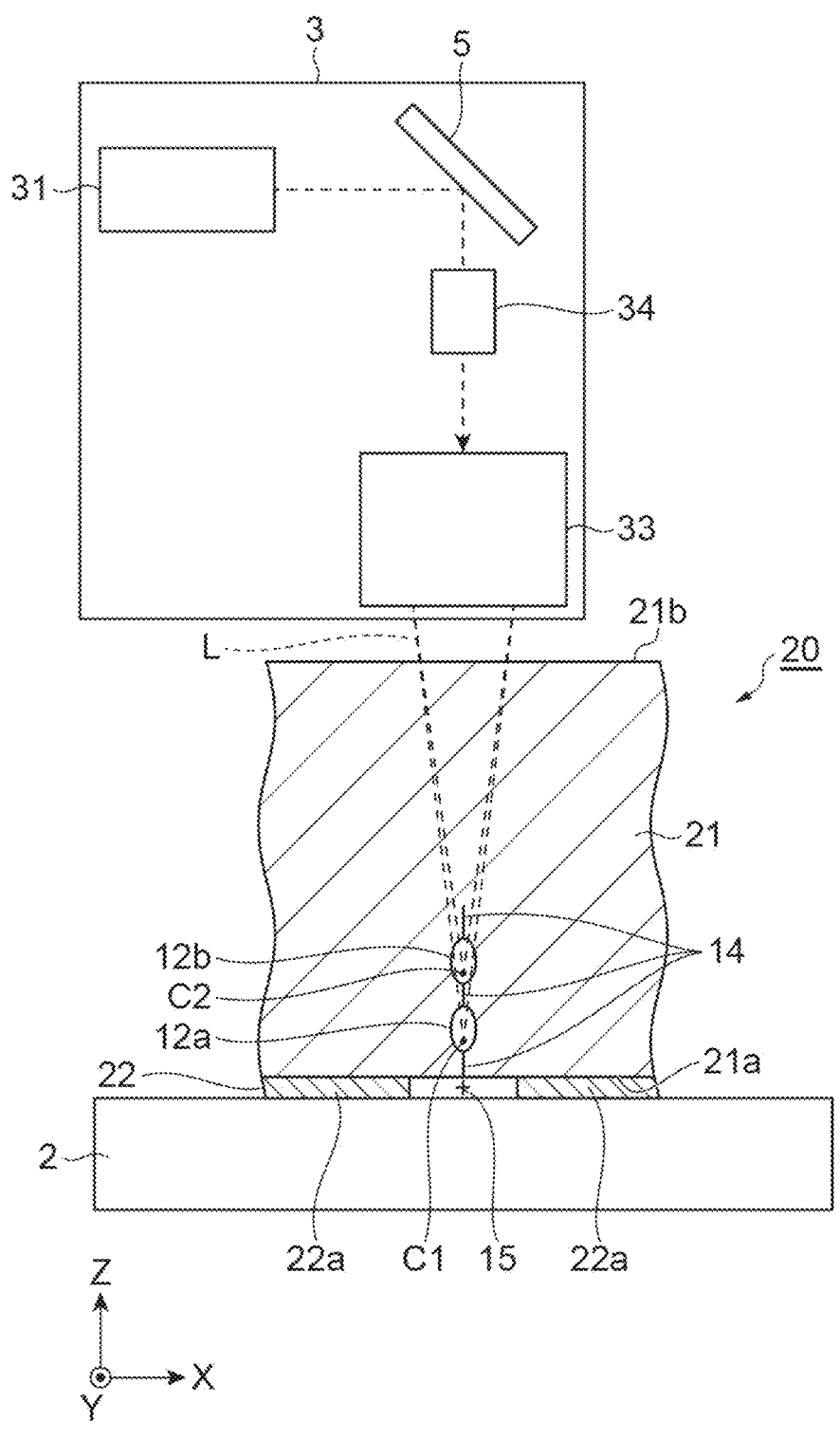
FIG. 4 is a schematic diagram illustrating a configuration of a laser irradiation unit illustrated in FIG. 1.
Figure 5:
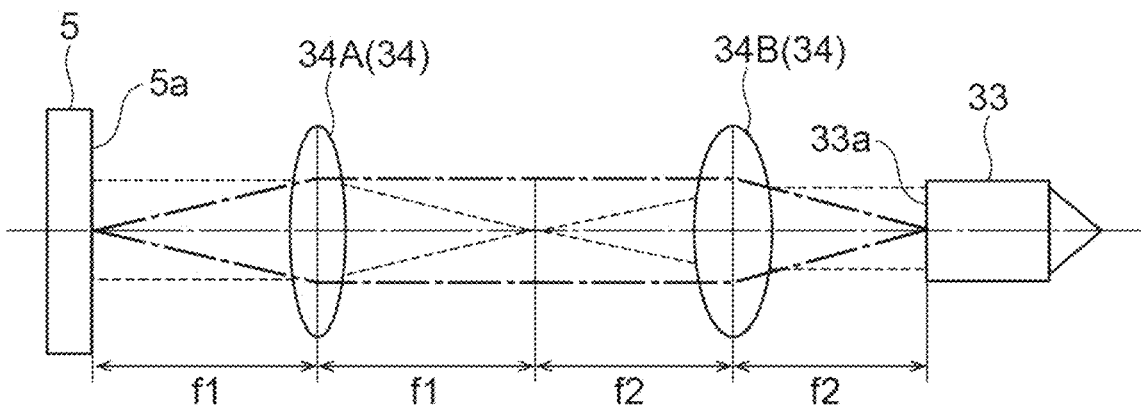
FIG. 5 is a view illustrating a relay lens unit illustrated in FIG. 4.
Figure 6:
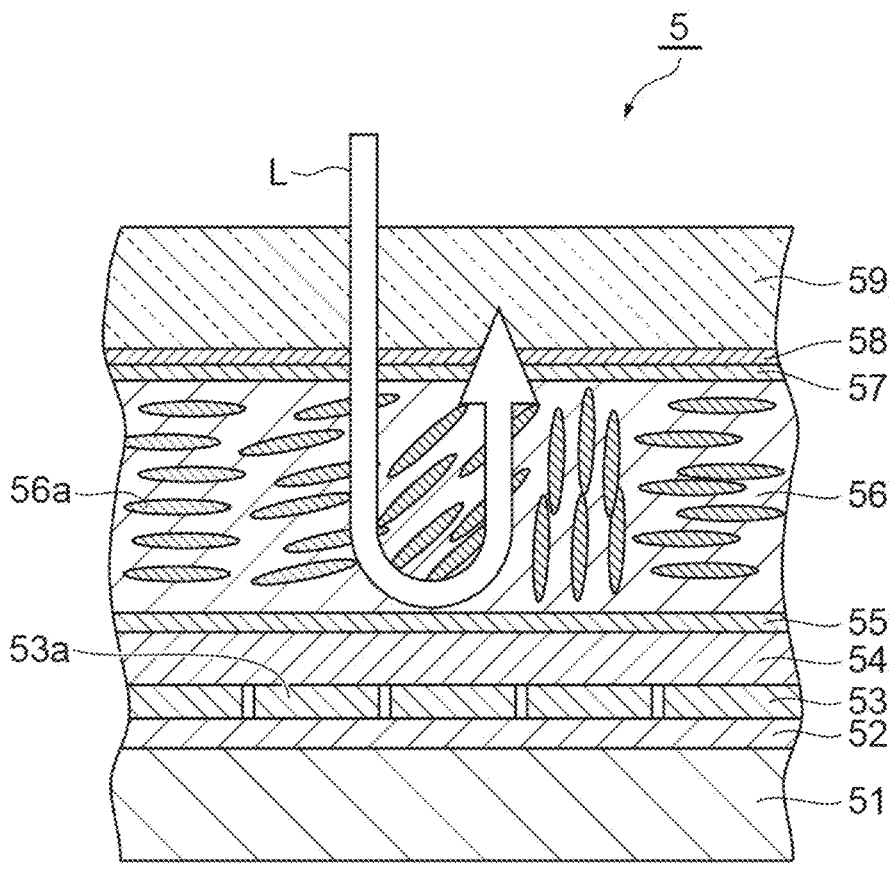
FIG. 6 is a partial cross-sectional view illustrating a spatial light modulator illustrated in FIG. 4.

FIG. 4 is a schematic diagram illustrating a configuration of the laser irradiation unit illustrated in FIG. 1. FIG. 5 is a view illustrating a relay lens unit illustrated in FIG. 4. FIG. 6 is a partial cross-sectional view illustrating a spatial light modulator illustrated in FIG. 4. As illustrated in FIG. 4, the laser irradiation unit 3 includes a light source 31, a spatial light modulator 5, a condenser lens 33, and a 4f lens unit 34. The light source 31 outputs the laser light L by, for example, a pulse oscillation method. The laser irradiation unit 3 may not include the light source 31, and may be configured to introduce the laser light L from the outside of the laser irradiation unit 3.

The spatial light modulator 5 modulates the laser light L output from the light source 31. The condenser lens 33 collects the laser light L modulated by the spatial light modulator 5. The 4f lens unit 34 includes a pair of lenses 34A and 34B arranged on an optical path of the laser light L from the spatial light modulator 5 toward the condenser lens 33. The pair of lenses 34A and 34B constitute a both-side telecentric optical system in which a reflection surface 5a of the spatial light modulator 5 and an incident pupil surface (pupil surface) 33a of the condenser lens 33 have an imaging relation. Thus, an image of the laser light L on the reflection surface 5a of the spatial light modulator 5 (an image of the laser light L modulated in the spatial light modulator 5) is transferred (formed) to (on) an incident pupil surface 33a of the condenser lens 33.

The spatial light modulator 5 is a spatial light modulator (SLM) of a reflective liquid crystal (LCOS: Liquid Crystal on Silicon). The spatial light modulator 5 is configured in a manner that a drive circuit layer 52, a pixel electrode layer 53, a reflective film 54, an alignment film 55, a liquid crystal layer 56, an alignment film 57, a transparent conductive film 58, and a transparent substrate 59 are stacked on a semiconductor substrate 51 in this order.

The semiconductor substrate 51 is, for example, a silicon substrate. The drive circuit layer 52 constitutes an active matrix circuit on the semiconductor substrate 51. The pixel electrode layer 53 includes a plurality of pixel electrodes 53a arranged in a matrix along the surface of the semiconductor substrate 51. Each of the pixel electrodes 53a is formed of, for example, a metal material such as aluminum. A voltage is applied to each of the pixel electrodes 53a by the drive circuit layer 52.

The reflective film 54 is, for example, a dielectric multilayer film. The alignment film 55 is provided on the surface of the liquid crystal layer 56 on the reflective film 54 side. The alignment film 57 is provided on the surface of the liquid crystal layer 56 on the opposite side of the reflective film 54. Each of the alignment films 55 and 57 is formed of, for example, a polymer material such as polyimide. For example, a rubbing treatment is performed on a contact surface of each of the alignment films 55 and 57 with the liquid crystal layer 56. The alignment films 55 and 57 align liquid crystal molecules 56a contained in the liquid crystal layer 56 in a predetermined direction.

The transparent conductive film 58 is provided on the surface of the transparent substrate 59 on the alignment film 57 side, and faces the pixel electrode layer 53 with the liquid crystal layer 56 and the like interposed therebetween. The transparent substrate 59 is, for example, a glass substrate. The transparent conductive film 58 is formed of, for example, a light transmissive and conductive material such as ITO. The transparent substrate 59 and the transparent conductive film 58 cause the laser light L to be transmitted.

In the spatial light modulator 5 configured as described above, when a signal indicating a modulation pattern is input from the control unit 10 to the drive circuit layer 52, a voltage corresponding to the signal is applied to each of the pixel electrodes 53a. Thus, an electric field is formed between each of the pixel electrodes 53a and the transparent conductive film 58. When the electric field is formed, in the liquid crystal layer 56, the arrangement direction of the liquid crystal molecules 216a changes for each region corresponding to each of the pixel electrodes 53a, and the refractive index changes for each region corresponding to each of the pixel electrodes 53a. This state is a state in which the modulation pattern is displayed on the liquid crystal layer 56.

When, in a state where the modulation pattern is displayed on the liquid crystal layer 56, the laser light L enters into the liquid crystal layer 56 from the outside through the transparent substrate 59 and the transparent conductive film 58, is reflected by the reflective film 54, and then is emitted to the outside from the liquid crystal layer 56 through the transparent conductive film 58 and the transparent substrate 59, the laser light L is modulated in accordance with the modulation pattern displayed on the liquid crystal layer 56. As described above, according to the spatial light modulator 5, it is possible to modulate (for example, modulation of intensity, amplitude, phase, polarization, and the like of the laser light L) the laser light L by appropriately setting the modulation pattern to be displayed on the liquid crystal layer 56.

In the present embodiment, the laser irradiation unit 3 irradiates the wafer 20 with the laser light L from the back surface 21b side of the semiconductor substrate 21 along each of the plurality of lines 15, so as to form two rows of modified regions 12a and 12b in the semiconductor substrate 21 along each of the plurality of lines 15. The modified region (first modified region) 12a is the modified region closest to the front surface 21a of the two rows of modified regions 12a and 12b. The modified region (second modified region) 12b is the modified region closest to the modified region 12a among two rows of the modified regions 12a and 12b, and is the modified region closest to the back surface 21b.

The two rows of modified region 12a and 12b are adjacent to each other in the thickness direction (Z-direction) of the wafer 20. The two rows of modified regions 12a and 12b are formed by moving two focusing points O1 and O2 relative to the semiconductor substrate 21 along the line 15. The laser light L is modulated by the spatial light modulator 5 so that, for example, the focusing point O2 is located on the rear side in a traveling direction and on the incident side of the laser light L with respect to the focusing point O1.

As an example, the laser irradiation unit 3 can irradiate the wafer 20 with the laser light L from the back surface 21b side of the semiconductor substrate 21 along each of the plurality of lines 15 under a condition that a fracture 14 extending through the two rows of modified regions 12a and 12b reaches the front surface 21a of the semiconductor substrate 21. As an example, for the semiconductor substrate 21 which is a single crystal silicon substrate having a thickness of 775 μm, the two focusing points O1 and O2 are aligned at positions of 54 μm and 128 μm from the front surface 21a. Then, the wafer 20 is irradiated with the laser light L from the back surface 21b side of the semiconductor substrate 21 along each of the plurality of lines 15.

At this time, the wavelength of the laser light L is 1099 nm, the pulse width is 700 nsec, and the repetition frequency is 120 kHz. In addition, the output of the laser light L at the focusing point O1 is 2.7 W, the output of the laser light L at the focusing point O2 is 2.7 W, and the relative movement speeds of the two focusing points O1 and O2 with respect to the semiconductor substrate 21 are 800 mm/sec.

The formation of such two rows of modified regions 12a, 12b and fracture 14 is performed in the following cases. That is, in a case where, in the subsequent steps, the back surface 21b of the semiconductor substrate 21 is ground to thin the semiconductor substrate 21 and expose the fractures 14 to the back surface 21b, and the wafer 20 is cut into a plurality of semiconductor devices along each of the plurality of lines 15, such formation is performed. However, as will be described later, the laser irradiation unit 3 may form modified regions (modified spots) 12a and 12b and a fracture 14 extending from the modified regions 12a and 12b in the semiconductor substrate 21 so as not to reach the outer surface (the front surface 21a and the back surface 21b) of the semiconductor substrate 21.

[Configuration of Image Capturing Unit]

Figure 7:
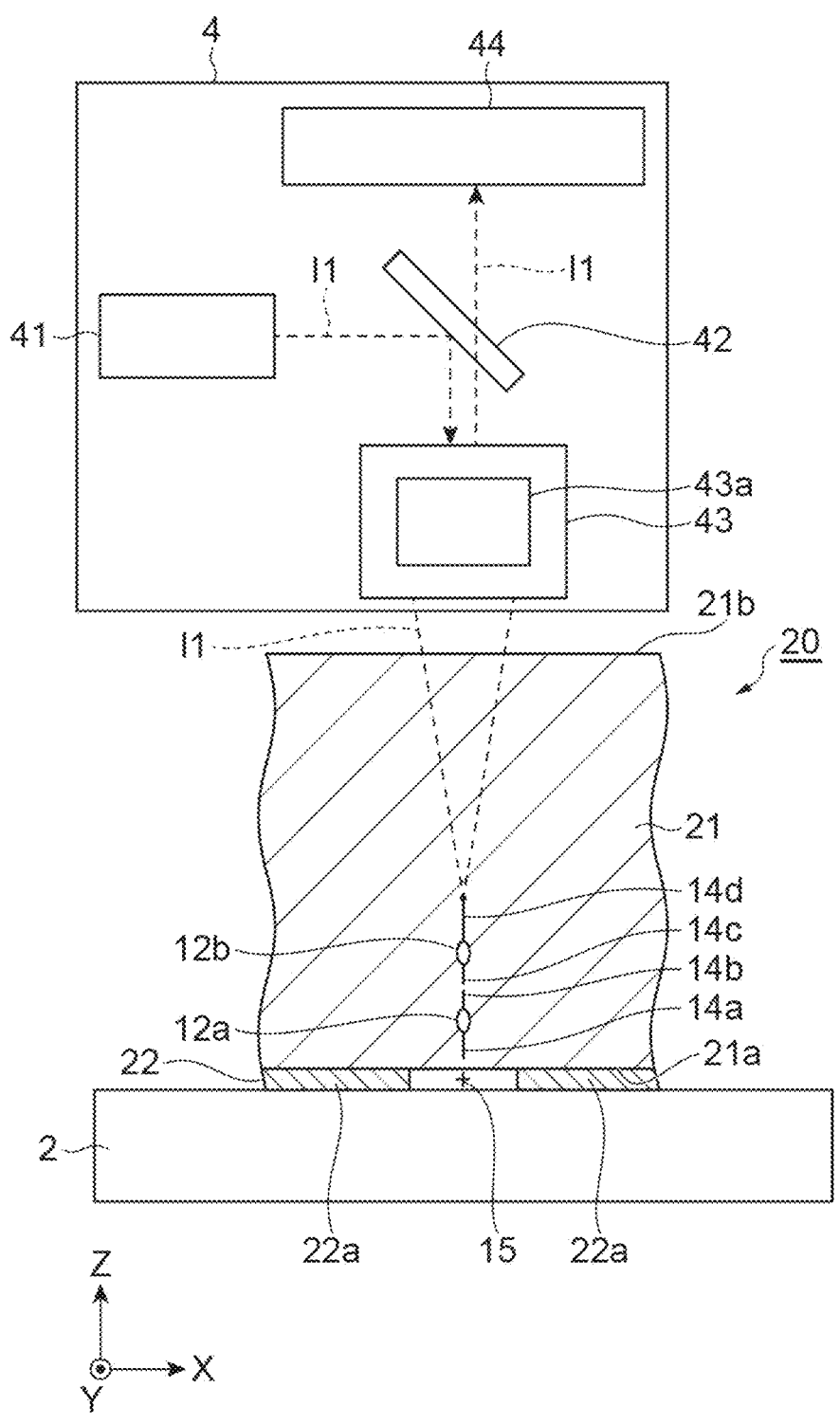
FIG. 7 is a schematic diagram illustrating a configuration of an image capturing unit illustrated in FIG. 1.

FIG. 7 is a schematic diagram illustrating the configuration of the image capturing unit illustrated in FIG. 1. As illustrated in FIG. 7, the image capturing unit 4 includes a light source 41, a mirror 42, an objective lens 43, and a light detection unit 44. The light source 41 outputs light I1 having transparency to the wafer 20 (at least the semiconductor substrate 21). The light source 41 is configured by, for example, a halogen lamp and a filter, and outputs light I1 in a near infrared region. The light I1 output from the light source 41 is reflected by the mirror 42, passes through the objective lens 43, and then is applied to the wafer 20 from the back surface 21b side of the semiconductor substrate 21. At this time, the stage 2 supports the wafer 20 in which the two rows of modified regions 12a and 12b are formed as described above.

The objective lens 43 passes the light I1 reflected by the front surface 21a of the semiconductor substrate 21 through the objective lens. That is, the objective lens 43 passes the light I1 propagating in the semiconductor substrate 21 through the objective lens. The numerical aperture (NA) of the objective lens 43 is 0.45 or more. The objective lens 43 includes a correction ring 43a. The correction ring 43a corrects the aberration generated in the light I1 in the semiconductor substrate 21 by adjusting the distance between a plurality of lenses constituting the objective lens 43, for example. The light detection unit 44 detects the light I1 that has passed through the objective lens 43 and the mirror 42. The light detection unit 44 is configured by an infrared camera including, for example, an InGaAs camera, and detects the light I1 in the near infrared region. That is, the image capturing unit 4 is provided for capturing an image of the semiconductor substrate 21 with the light I1 having transparency to the semiconductor substrate 21. As a configuration for correcting the aberration generated in the light I1, the spatial light modulator 5 or another configuration may be adopted instead of (or in addition to) the correction ring 43a described above. In addition, the light detection unit 44 is not limited to the InGaAs camera, and may be any image capturing means using transmission image capturing, such as a transmission confocal microscope.

The image capturing unit 4 is capable of capturing images of each of the two rows of modified regions 12a and 12b and the tip of each of a plurality of fractures 14a to 14d (details will be described later). The fracture 14a is a fracture extending from the modified region 12a to the front surface 21a side. The fracture 14b is a fracture extending from the modified region 12a to the back surface 21b side. The fracture 14c is a fracture extending from the modified region 12b to the front surface 21a side. The fracture 14d is a fracture extending from the modified region 12b to the back surface 21b side.

That is, the fractures 14b and 14d are first fractures extending from the modified regions 12a and 12b to the back surface 21b side, which is the first surface. The fractures 14a and 14c are second fractures extending from the modified regions 12a and 12b to the front surface 21a side, which is the second surface. The fracture 14d of the first fractures may be referred to as an upper fracture below, and the fracture 14a of the second fractures may be referred to as a lower fracture below, in accordance with a case where the positive direction of the Z-direction is set to an upper side.

[Configuration of Alignment Correction Image Capturing Unit]

Figure 8:
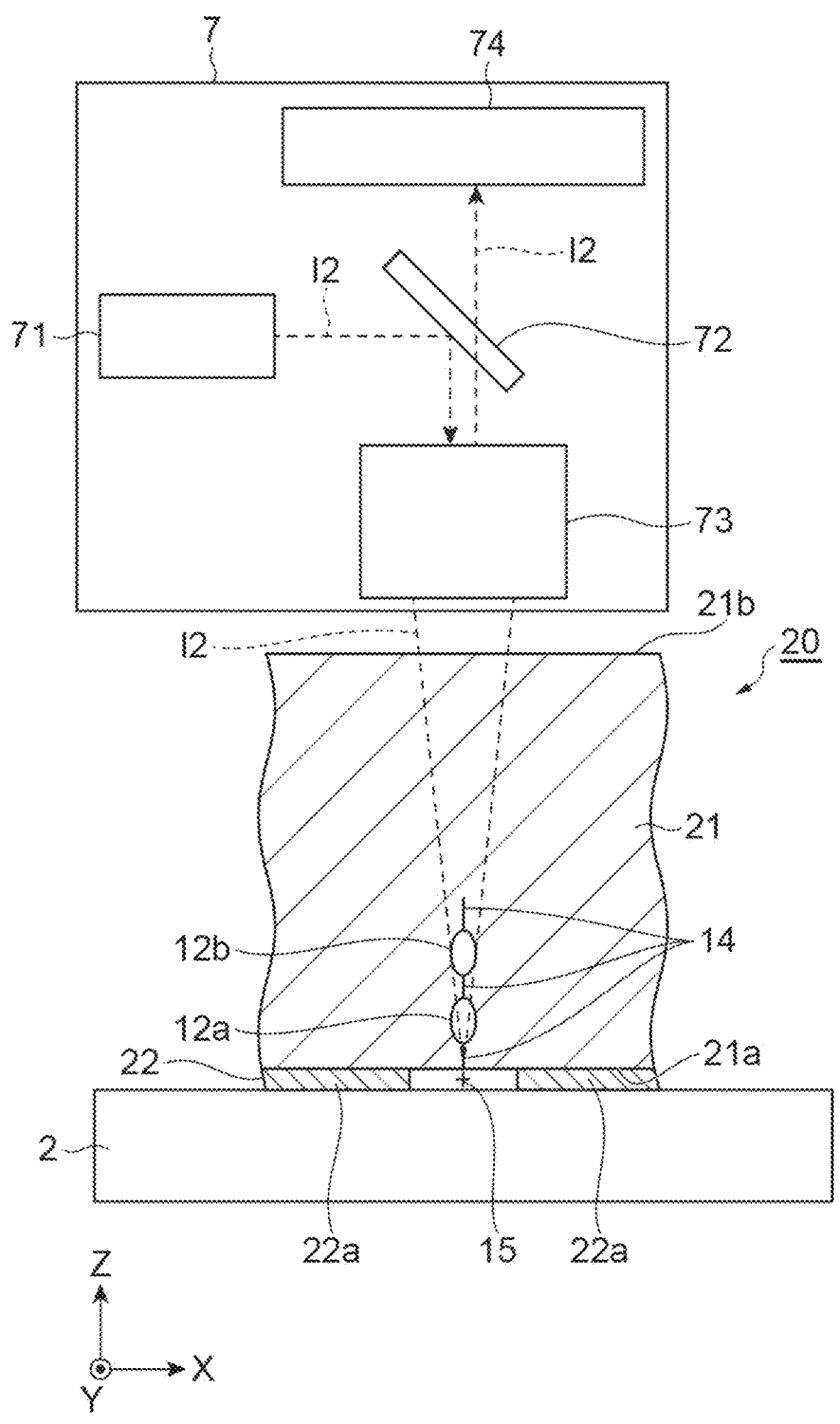
FIG. 8 is a schematic diagram illustrating the configuration of the image capturing unit illustrated in FIG. 1.

FIG. 8 is a schematic diagram illustrating the configuration of the image capturing unit illustrated in FIG. 1. As illustrated in FIG. 8, the image capturing unit 7 includes a light source 71, a mirror 72, a lens 73, and a light detection unit 74. The light source 71 outputs light I2 having transparency to the semiconductor substrate 21. The light source 71 is configured by, for example, a halogen lamp and a filter, and outputs light I2 in the near infrared region. The light source 71 may be shared with the light source 41 of the image capturing unit 4. The light I2 output from the light source 71 is reflected by the mirror 72, passes through the lens 73, and then is applied to the wafer 20 from the back surface 21b side of the semiconductor substrate 21.

The lens 73 passes the light I2 reflected by the front surface 21a of the semiconductor substrate 21 through the lens. That is, the lens 73 passes the light I2 propagating in the semiconductor substrate 21 through the lens. The numerical aperture of the lens 73 is 0.3 or less. That is, the numerical aperture of the objective lens 43 in the image capturing unit 4 is more than the numerical aperture of the lens 73. The light detection unit 74 detects the light I2 that has passed through the lens 73 and the mirror 72. The light detection unit 75 is configured by, for example, an InGaAs camera, and detects the light I2 in the near infrared region.

Under the control of the control unit 10, the image capturing unit 7 captures an image of the functional element layer 22 by irradiating the wafer 20 with the light I2 from the back surface 21b side and detecting the light I2 returning from the front surface 21a (functional element layer 22). Further, similarly, under the control of the control unit 10, the image capturing unit 7 acquires an image of a region including the modified regions 12a and 12b by irradiating the wafer 20 with the light I2 from the back surface 21b side and detecting the light I2 returning from positions at which the modified regions 12a and 12b are formed in the semiconductor substrate 21. The images are used for alignment of the irradiation position of the laser light L. The image capturing unit 8 has the similar configuration to the image capturing unit 7 except that the lens 73 has a lower magnification (for example, 6 times in the image capturing unit 7 and 1.5 times in the image capturing unit 8), and is used for alignment, similar to the image capturing unit 7. In the image capturing units 4, 7, and 8, image capturing for acquiring the formation state as described later and image capturing for alignment as described above may be shared.

[Image Capturing Principle by Image Capturing Unit]

Figure 9:
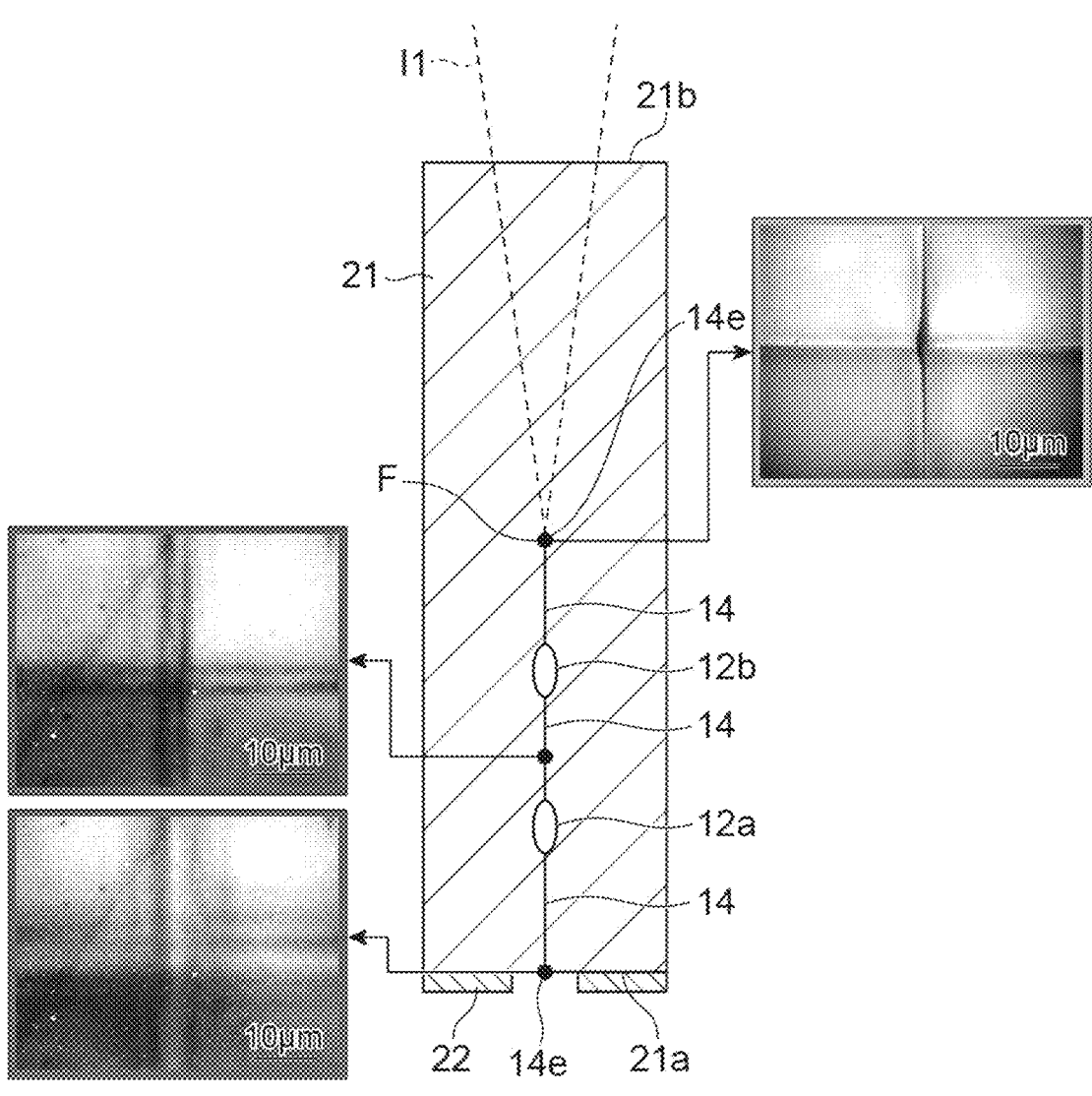
FIG. 9 is a cross-sectional view illustrating the wafer for explaining the image capturing principle by the image capturing unit illustrated in FIG. 7, and is an image at each location by the image capturing unit.

Using the image capturing unit 4, a focus F (focus of the objective lens 43) is moved from the back surface 21b side toward the front surface 21*a* side for the semiconductor substrate 21 in which the fracture 14 extending through the two rows of modified regions 12*a* and 12*b* (fracture extending from the modified spot) reaches the front surface 21*a*, as illustrated in FIG. 9. In this case, if the focus F is aligned from the back surface 21*b* side to a tip 14*e* of the fracture 14 extending from the modified region 12*b* to the back surface 21*b* side, it is possible to check the tip 14*e* (image on the right side in FIG. 9). However, even though the focus F is aligned to the fracture 14 itself and the tip 14*e* of the fracture 14 reaching the front surface 21*a* from the back surface 21*b* side, it is not possible to check the fracture and the tip of the fracture (image on the left side in FIG. 9). If the focus F is aligned to the front surface 21*a* of the semiconductor substrate 21 from the back surface 21*b* side, it is possible to check the functional element layer 22.

Figure 10:
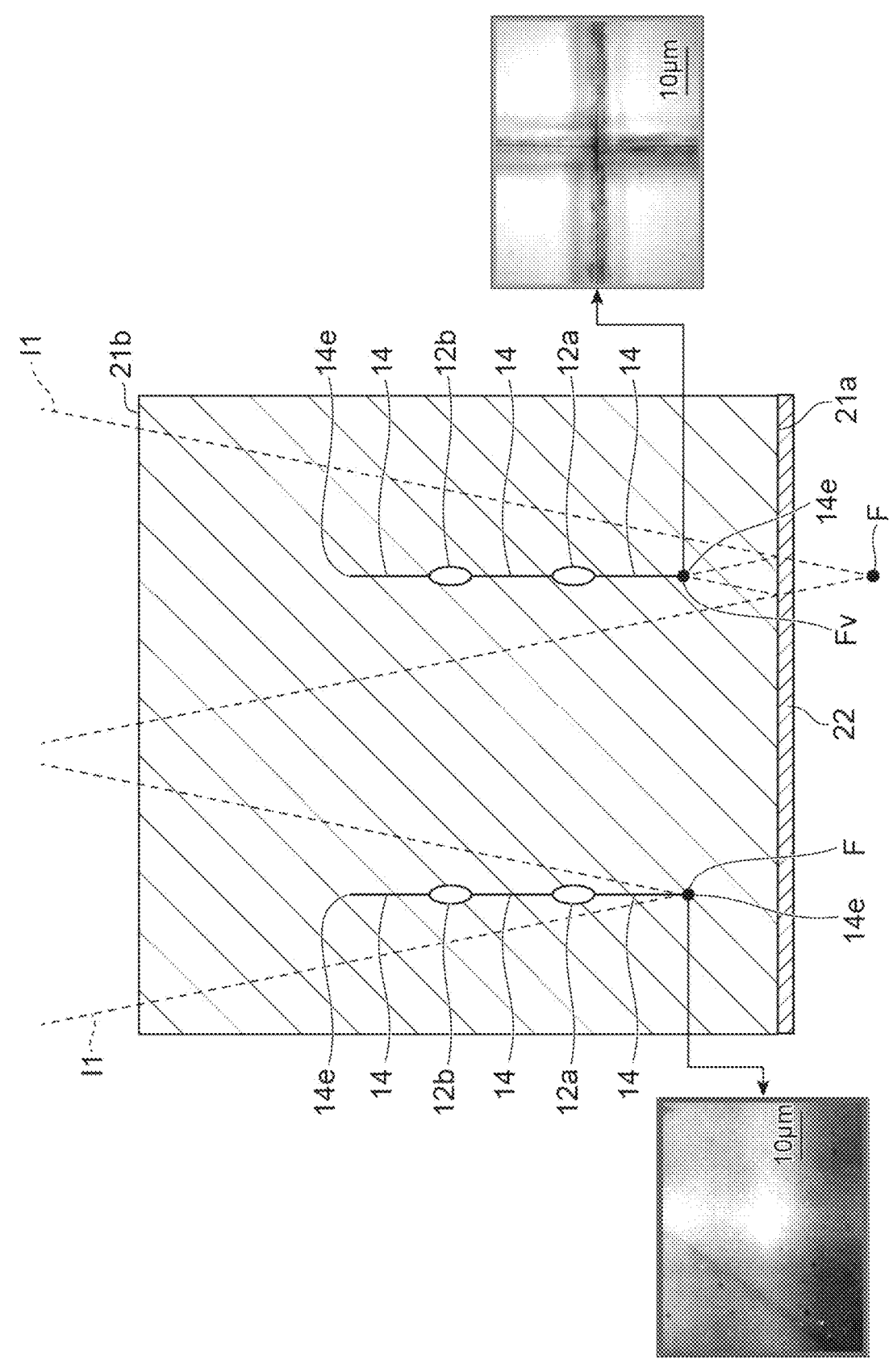
FIG. 10 is a cross-sectional view illustrating the wafer for explaining the image capturing principle by the image capturing unit illustrated in FIG. 7, and is an image at each location by the image capturing unit.

Further, using the image capturing unit 4, the focus F is moved from the back surface 21*b* side toward the front surface 21*a* side for the semiconductor substrate 21 in which the fracture 14 over the two rows of modified regions 12*a* and 12*b* does not reach the front surface 21*a*, as illustrated in FIG. 10. In this case, even though the focus F is aligned from the back surface 21*b* side to the tip 14*e* of the fracture 14 extending from the modified region 12*a* to the front surface 21*a* side, it is not possible to check the tip 14*e* (image on the left side in FIG. 10). However, if the focus F is aligned from the back surface 21*b* side to a region of the front surface 21*a* on an opposite side of the back surface 21*b* (that is, region of the front surface 21*a* on the functional element layer 22 side), and a virtual focus Fv symmetrical with the focus F with respect to the front surface 21*a* is located at the tip 14*e*, it is possible to check the tip 14*e* (image on the right side in FIG. 10). The virtual focus Fv is a point symmetrical with the focus F with respect to the front surface 21*a* in consideration of the refractive index of the semiconductor substrate 21.

Figure 12:
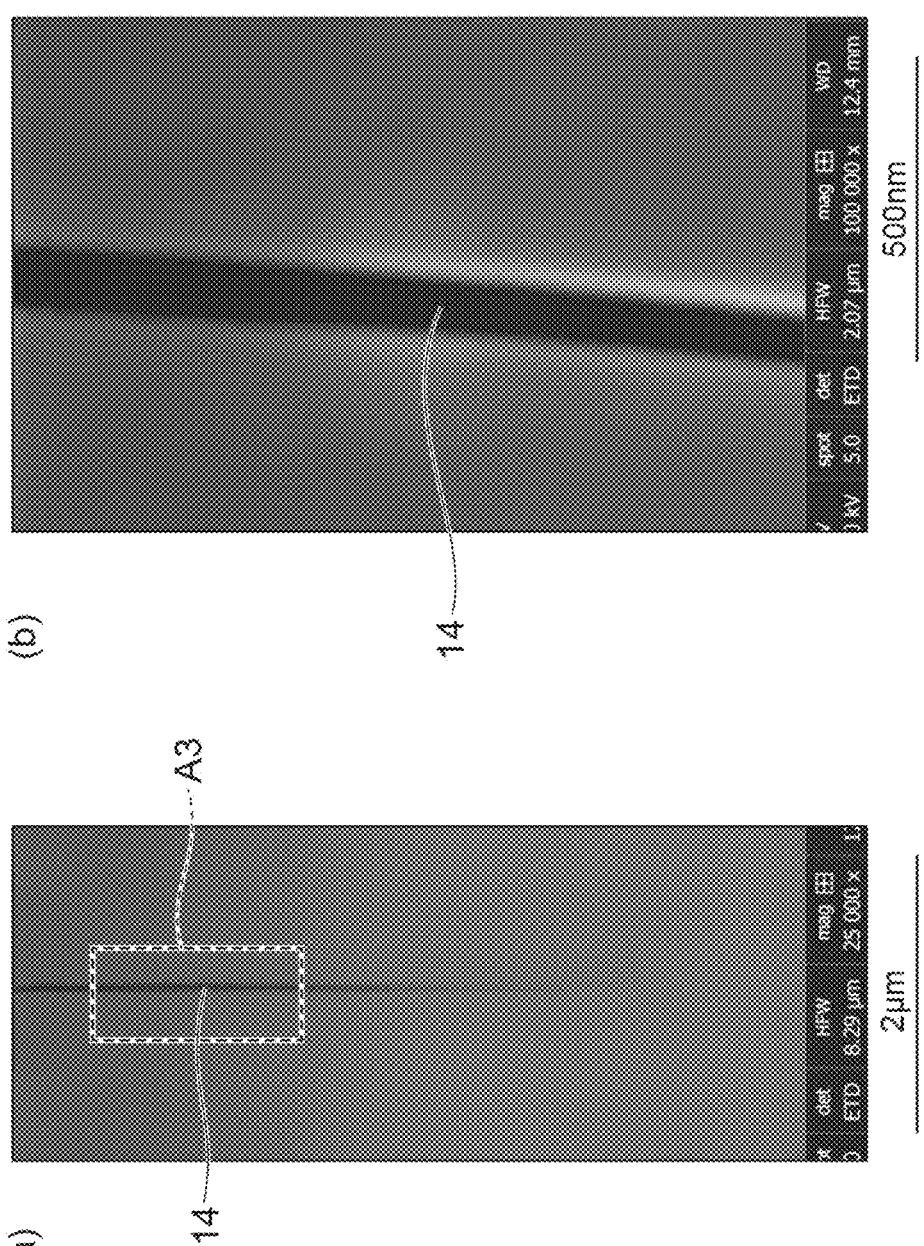
FIG. 12 is an SEM image of the modified region and the fracture formed in the semiconductor substrate.

It is assumed that the reason why it is not possible to check the fracture 14 itself as described above is that the width of the fracture 14 is smaller than the wavelength of the light I1 as the illumination light. FIGS. 11 and 12 are scanning electron microscope (SEM) images of a modified region 12 and the fracture 14 formed in the semiconductor substrate 21 being a silicon substrate. (b) of FIG. 11 is an enlarged image of a region A1 illustrated in (a) of FIG. 11. (a) of FIG. 12 is an enlarged image of a region A2 illustrated in (b) of FIG. 11. (b) of FIG. 12 is an enlarged image of a region A3 illustrated in (a) of FIG. 12. As described above, the width of the fracture 14 is about 120 nm and is smaller than the wavelength (for example, 1.1 to 1.2 μm) of the light I1 in the near infrared region.

The image capturing principle assumed based on the above description is as follows. As illustrated in (a) of FIG. 13, if the focus F is located in the air, the light I1 does not return, and thus a blackish image is obtained (image on the right side in (a) of FIG. 13). As illustrated in (b) of FIG. 13, if the focus F is located in the semiconductor substrate 21, the light I1 reflected by the front surface 21*a* is returned, so that a whitish image is obtained (image on the right side in (b) of FIG. 13). As illustrated in (c) of FIG. 13, if the focus F is aligned on the modified region 12 from the back surface 21*b* side, a portion of the light I1 reflected and returned by the front surface 21*a* is absorbed, scattered, and the like by the modified region 12. Thus, an image in which the modified region 12 appears blackish in a whitish background is obtained (image on the right side in (c) of FIG. 13).

As illustrated in (a) and (b) of FIG. 14, if the focus F is aligned to the tip 14*e* of the fracture 14 from the back surface

21*b* side, for example, scattering, reflection, interference, absorption, and the like occurs in a portion of the light I1 reflected and returned by the front surface 21*a* by the optical specificity (stress concentration, strain, discontinuity of atomic density, and the like), confinement of light, and the like occurring near the tip 14*e*. Thus, an image in which the tip 14*e* appears blackish in a whitish background is obtained (images on the right side in (a) and (b) of FIG. 14). As illustrated in (c) of FIG. 14, if the focus F is aligned from the back surface 21*b* side to a portion of the fracture 14 other than the vicinity of the tip 14*e* of the fracture 14, at least a portion of the light I1 reflected by the front surface 21*a* is returned. Thus, a whitish image is obtained (image on the right side in (c) of FIG. 14).

[Inspection Principle by Image Capturing Unit]

Figure 15:
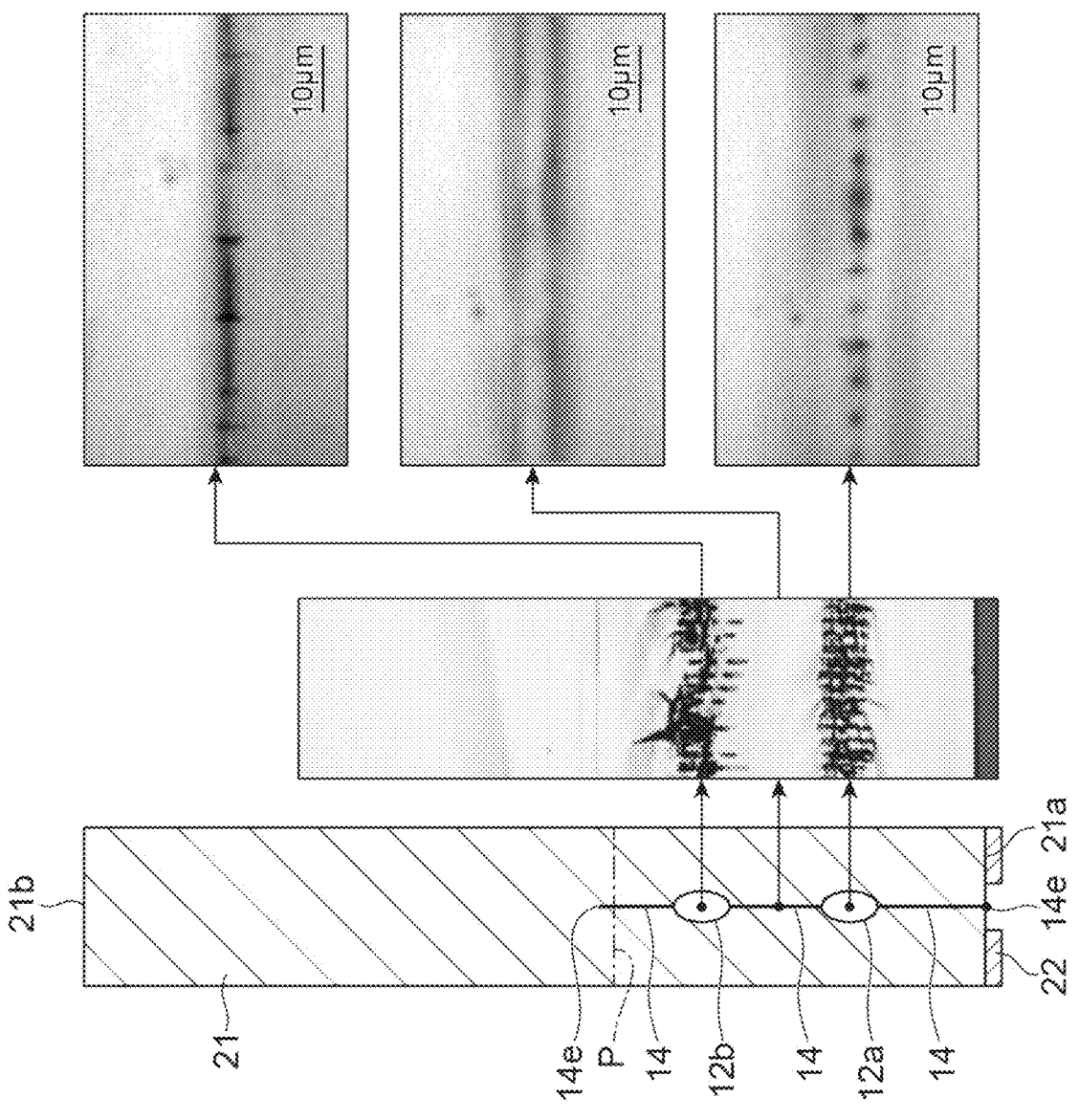
FIG. 15 is a cross-sectional view illustrating a wafer for explaining an inspection principle by the image capturing unit illustrated in FIG. 7, and is an image of a cut surface of the wafer and an image at each location by the image capturing unit.

In a case where, as a result obtained in a manner that the control unit 10 causes the laser irradiation unit 3 to perform irradiation with the laser light L under the condition that the fractures 14 over the two rows of the modified regions 12*a* and 12*b* reach the front surface 21*a* of the semiconductor substrate 21, the fractures 14 over the two rows of the modified regions 12*a* and 12*b* reach the front surface 21*a* as planned, the state of the tip 14*e* of the fracture 14 is as follows. That is, as illustrated in FIG. 15, the tip 14*e* of the fracture 14 does not appear in a region between the modified region 12*a* and the front surface 21*a* and a region between the modified region 12*a* and the modified region 12*b*. The position (simply referred to as a "tip position" below) of the tip 14*e* of the fracture 14 extending from the modified region 12*b* to the back surface 21*b* side is located on the back surface 21*b* side with respect to a reference position P between the modified region 12*b* and the back surface 21*b*.

Figure 16:
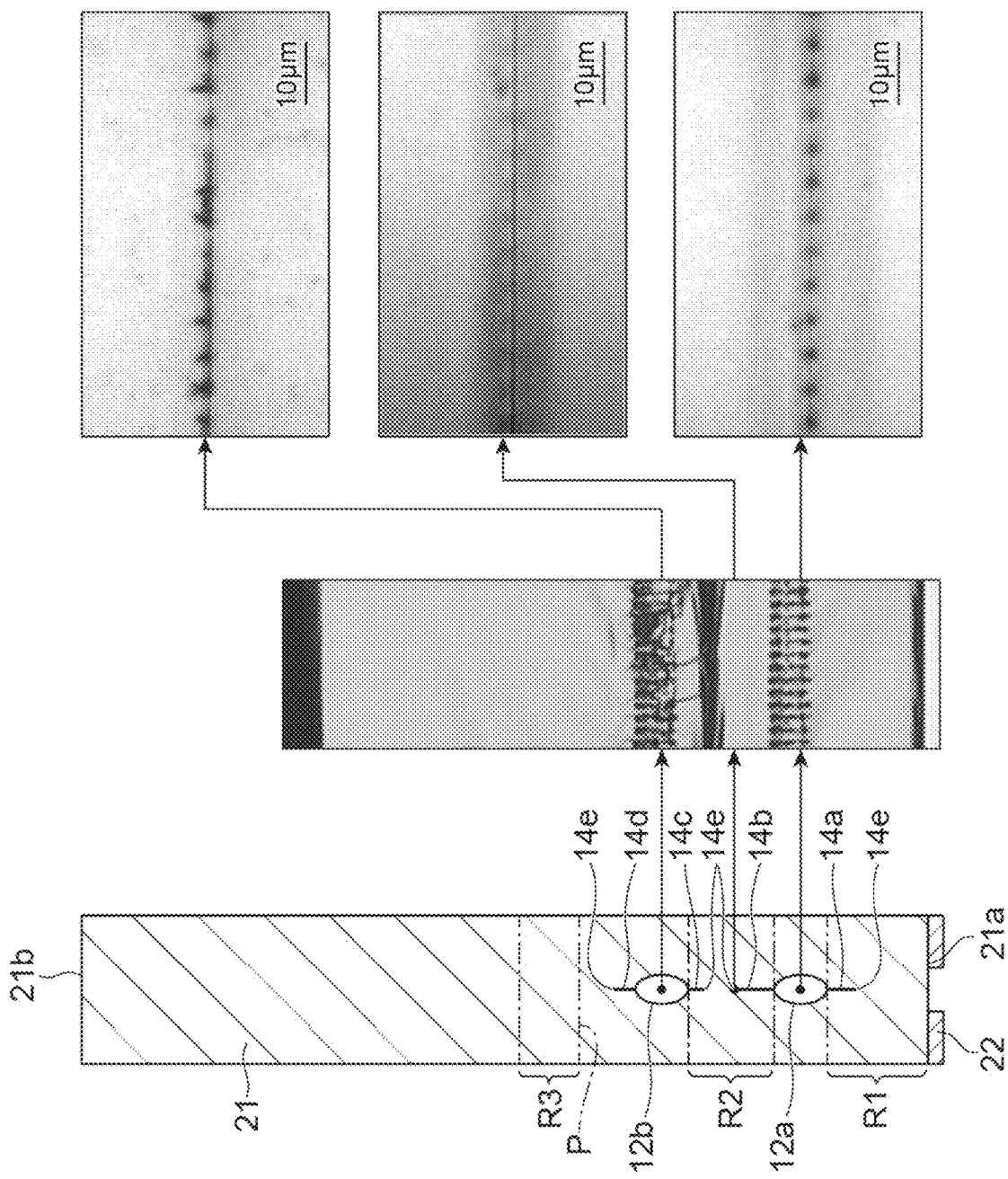
FIG. 16 is a cross-sectional view illustrating a wafer for explaining the inspection principle by the image capturing unit illustrated in FIG. 7, and is an image of a cut surface of the wafer and an image at each location by the image capturing unit.

On the other hand, in a case where the control unit 10 determines that the fracture 14 extending through the two rows of modified regions 12*a* and 12*b* does not reach the front surface 21*a*, the state of the tip 14*e* of the fracture 14 is as follows. That is, as illustrated in FIG. 16, the tip 14*e* of the fracture 14*a* extending from the modified region 12*a* to the front surface 21*a* side appears in the region between the modified region 12*a* and the front surface 21*a*. The tip 14*e* of the fracture 14*b* extending from the modified region 12*a* to the back surface 21*b* and the tip 14*e* of the fracture 14*c* extending from the modified region 12*b* to the front surface 21*a* appear in the region between the modified region 12*a* and the modified region 12*b*. The tip position of the fracture 14 extending from the modified region 12*b* to the back surface 21*b* side is located on the front surface 21*a* with respect to the reference position P between the modified region 12*b* and the back surface 21*b*.

With the above description, if the control unit 10 performs at least one of the following first inspection, second inspection, third inspection, and fourth inspection, it is possible to evaluate whether or not the fractures 14 over the two rows of the modified regions 12*a* and 12*b* reach the front surface 21*a* of the semiconductor substrate 21. The first inspection is an inspection of whether or not, when the region between the modified region 12*a* and the front surface 21*a* is set as an inspection region R1, there is the tip 14*e* of the fracture 14*a* extending from the modified region 12*a* to the front surface 21*a* side, in the inspection region R1.

The second inspection is an inspection of whether or not, when the region between the modified region 12*a* and the modified region 12*b* is set as an inspection region R2, there is the tip 14*e* of the fracture 14*b* extending from the modified region 12*a* to the back surface 21*b* side, in the inspection region R2. The third inspection is an inspection of whether or not there is the tip 14*e* of the fracture 14*c* extending from the modified region 12b to the front surface 21a side, in the inspection region R2. The fourth inspection is an inspection of whether or not, when a region that extends from the reference position P to the back surface 21b side and does not reach the back surface 21b is set as an inspection region R3, the tip position of the fracture 14 extending from the modified region 12b to the back surface 21b side is located in the inspection region R3.

According to the above inspection, in addition to whether or not there is the tip 14e of the fracture 14 in the predetermined region, it is possible to acquire information indicating the formation state of the modified region and the fracture, such as the position of each tip 14e, the positions of the modified regions 12a and 12b, the lengths of the fractures 14a to 14d, and the entire length of the fracture 14. As described above, the fractures 14b and 14d are the first fractures extending toward the back surface 21b which is the first surface, and the tips 14e thereof are first ends which are the tips of the first fractures on the back surface 21b side. In particular, the fracture 14d is an upper fracture. In addition, the fractures 14a and 14c are the second fractures extending toward the front surface 21a which is the second surface, and the tips 14e thereof are second ends which are the tips of the second fractures on the front surface 21a side. In particular, the fracture 14a is a lower fracture.

[Acquisition Method of Formation State]

Figure 17:
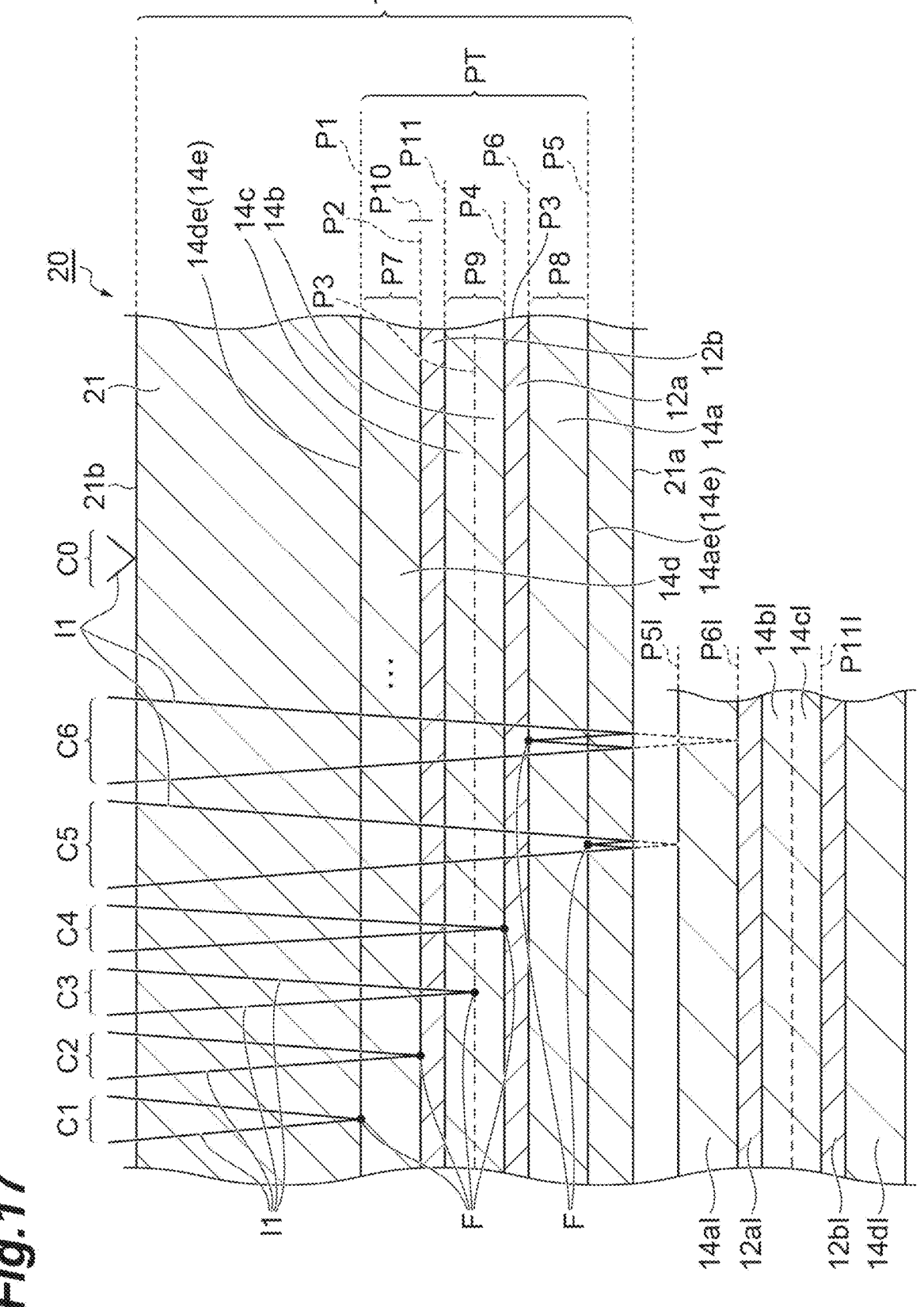
FIG. 17 is a cross-sectional view illustrating an object for explaining an acquisition method of the formation state.

Next, a method for acquiring information indicating the formation state of the modified region and the fracture will be described. FIG. 17 is a cross-sectional view illustrating an object for explaining an acquisition method of the formation state. In FIG. 17, the functional element layer 22 of the wafer 20 is omitted. In addition, FIG. 17 illustrates a virtual image 12aI, a virtual image 12bI, a virtual image 14aI, a virtual image 14bI, a virtual image 14cI, and a virtual image 14dI at symmetrical positions with respect to the front surface 21a, for the modified region 12a, the modified region 12b, the fracture 14a, the fracture 14b, the fracture 14d, and the fracture 14c, respectively.

Further, in FIG. 17, the modified regions 12a and 12b extending in one direction are illustrated. As described above, each of the modified regions 12a and 12b includes a set of modified spots 12s. Thus, the fractures 14a to 14d extending from the modified regions 12a and 12b may also be the fractures 14a to 14d extending from the modified spot 12s. In particular, in a cross-section intersecting with the extension direction of the modified regions 12a and 12b, each of the modified regions 12a and 12b is identical to a single modified spot 12s. Thus, the modified regions 12a and 12b can be replaced with the modified spot 12s.

The modified regions 12a and 12b, the fracture 14a (lower fracture) extending from the modified region 12a to the front surface 21a side, the fracture 14b extending from the modified region 12a to the back surface 21b side, the fracture 14c extending from the modified region 12b to the front surface 21a side, and the fracture 14d (upper fracture) extending from the modified region 12b to the back surface 21b side are formed in the wafer 20 so as not to reach the outer surface (front surface 21a and back surface 21b).

In the example in FIG. 17, the fracture 14b and the fracture 14c are connected to each other to form a single fracture, but may be separated from each other. In addition, the tip 14e of the fracture 14d (upper fracture) on the back surface 21b side may be referred to as a first end (upper fracture tip) 14de, and the tip 14e of the fracture 14a (lower fracture) on the front surface 21a side may be referred to as a second end (lower fracture tip) 14ae.

The formation states of the modified regions 12a and 12b and the fractures 14a to 14d include a plurality of items. An example of the item (referred to as a formation state item below) included in the formation state is as follows. The following Z-direction is an example of a first direction intersecting with (perpendicular to) the front surface 21a and the back surface 21b. In addition, each of the formation state items as follows is denoted by a reference sign (not illustrated) for easy description. Further, each value is a value with the front surface 21a as a reference position (0 point).

Upper fracture tip position F1: position of the first end 14de in the Z-direction.

Upper fracture amount F2: length of the fracture 14d in the Z-direction.

Lower fracture tip position F3: position of the second end 14ae in the Z-direction.

Lower fracture amount F4: length of the fracture 14a in the Z-direction.

Total fracture amount F5: total amount of the lengths of the fractures 14a to 14d in the Z-direction, which is a distance between the first end 14de and the second end 14ae in the Z-direction.

Upper and lower fracture tip position shift width F6: shift width between the position of the first end 14de and the position of the second end 14ae in a direction (Y-direction) intersecting with (perpendicular to) a processing progress direction (X-direction).

Presence or absence of a modified region dent F7: presence or absence of a dent of a modified spot constituting each of modified regions 12a and 12b.

Meandering amount F8 of lower fracture tip: meandering amount of the second end 14ae in the Y-direction.

Presence or absence of black streak between modified regions F9: presence or absence of the tip of the fracture 14b on the back surface 21b side and the tip of the fracture 14c on the front surface 21a side in a region between the modified region 12a and the modified region 12b (whether or not the fracture 14b and the fracture 14c are connected). In a case where there are the tips of the fractures 14b and 14c, black streaks are observed (corresponding to presence of a black streak). In a case where there is no tips of the fractures 14b and 14c (the tips are connected), black streaks are not observed (corresponding to absence of a black streak).

In order to acquire the formation state including the above formation state items, image capturing C1 to C11 as follows can be performed by the light I1 of the image capturing unit 4.

Image capturing C1: an image of the semiconductor substrate 21 is captured by the light I1 so that the focus F of the objective lens 43 of the image capturing unit 4 is aligned with the first end 14de of the fracture 14d. At this time, a position in the Z-direction where the focus F is aligned (a position based on the back surface 21b) can be acquired as a position P1.

Image capturing C2: an image of the semiconductor substrate 21W is captured by the light I1 so that the focus F is aligned on the tip of the modified region 12b on the back surface 21b side. At this time, a position in the Z-direction where the focus F is aligned (a position based on the back surface 21b) can be acquired as a position P2.

Image capturing C3: an image of the semiconductor substrate 21 is captured by the light I1 so that the focus F is aligned on the tip of the fracture 14b on the back surface 21b side. At this time, a position in the Z-direction where the focus F is aligned (a position based on the back surface 21b) can be acquired as a position P3.

Image capturing C4: an image of the semiconductor substrate 21 is captured by the light I1 so that the focus F is aligned on the tip of the modified region 12a on the back surface 21b side. At this time, a position in the Z-direction where the focus F is aligned (a position based on the back surface 21b) can be acquired as a position P4.

Image capturing C5: an image of the semiconductor substrate 21 is captured by the light I1 so that the focus F is aligned from the front surface 21a side with respect to the second end 14ae of the fracture 14a (so that the focus F is aligned on the tip of the virtual image 14aI). At this time, a position in the Z-direction where the focus F is aligned (a position based on the back surface 21b) can be acquired as a position P5I. Since the position P5I is a position corresponding to the tip of the virtual image 14aI, the position P5I is a position outside the semiconductor substrate 21 (below the front surface 21a). In addition, by subtracting the thickness T of the semiconductor substrate 21 from a distance from the back surface 21b to the position P5I, a position P5 of the second end 14ae of the fracture 14a (real image) can be acquired.

Image capturing C6: an image of the semiconductor substrate 21 is captured by the light I1 so that the focus F is aligned from the front surface 21a side with respect to the tip of the modified region 12a on the front surface 21a side (so that the focus F is aligned on the tip of the virtual image 12aI). At this time, a position in the Z-direction where the focus F is aligned (a position based on the back surface 21b) can be acquired as a position P6I. Since the position P6I is a position corresponding to the tip of the virtual image 12aI, the position P6I is a position outside the semiconductor substrate 21 (below the front surface 21a). In addition, by subtracting the thickness T of the semiconductor substrate 21 from a distance from the back surface 21b to the position P6I, a position P6 of the tip of the modified region 12a (real image) can be acquired. Furthermore, the position P6 may also be obtained by multiplying a Z-height by a DZ rate. The Z-height is the movement amount of the objective lens 43 in the Z-direction when the modified region 12a is formed. The DZ rate is a coefficient for considering the refractive index of a material (for example, silicon) of the semiconductor substrate 21.

Image capturing C7: an image of the semiconductor substrate 21 is captured by the light I1 while the focus F is scanned in a range P7 between the position P1 and the position P2.

Image capturing C8: an image of the semiconductor substrate 21 is captured by the light I1 while the focus F is scanned in a range P8 between the position P5 and the position P6.

Image capturing C9: an image of the semiconductor substrate 21 is captured by the light I1 while the focus F is scanned in a range P9 between the modified region 12a and the modified region 12b.

Image capturing C10: an image of the semiconductor substrate 21 is captured by the light I1 while the focus F is scanned in a range P10 that straddles the tip of the modified region 12a on the back surface 21b side.

Image capturing C11: an image of the semiconductor substrate 21 is captured by the light I1 so that the focus F is aligned from the front surface 21a side with respect to the tip of the modified region 12b on the front surface 21a side (so that the focus F is aligned on the tip of the virtual image 12bI). At this time, a position in the Z-direction where the focus F is aligned (a position based on the back surface 21b) can be acquired as a position P11I. Since the position P11I is a position corresponding to the tip of the virtual image 12bI, the position P11I is a position outside the semiconductor substrate 21 (below the front surface 21a). In addition, by subtracting the thickness T of the semiconductor substrate 21 from a distance from the back surface 21b to the position P11I, a position P11 of the tip of the modified region 12b (real image) can be acquired. The position P11 may also be obtained by multiplying a Z-height by a DZ rate. The Z-height is the movement amount of the objective lens 43 in the Z-direction when the modified region 12b is formed. The DZ rate is a coefficient for considering the refractive index of a material (for example, silicon) of the semiconductor substrate 21.

Each of the above formation state items can be acquired by performing the above image capturing C1 to C10 as follows.

Upper fracture tip position F1: acquired as a value (T−P1) obtained by subtracting a distance between the position P1 acquired in the image capturing C1 and the back surface 21b from the thickness T of the semiconductor substrate 21.

Upper fracture amount F2: acquired as a value (P2−P1) obtained by subtracting a distance between the position P1 and the back surface 21b from a distance between the position P2 acquired in the image capturing C2 and the back surface 21b.

Lower fracture tip position F3: as described above, acquired as a value (P5I−T=P5) obtained by subtracting the thickness T of the semiconductor substrate 21 from a distance between the position P5I acquired in the image capturing C5 and the back surface 21b.

Lower fracture amount F4: as described above, acquired as a value (P5−P6) obtained by subtracting a value (P6I−T=P6) from the position P5. The value (P6I−T=P6) is obtained by subtracting the thickness T of the semiconductor substrate 21 from a distance between the position P6I acquired in the image capturing C6 and the back surface 21b.

Total fracture amount F5: can be acquired as a distance to a value (P5−P1) obtained by subtracting the distance between the position P1 and the back surface 21b from the distance between the position P5 and the back surface 21b.

Upper and lower fracture tip position shift width F6: can be measured from an image acquired in the range P10 in the image capturing C10.

Presence or absence of a modified region dent F7: for the modified region 12b, can be determined from an image acquired at the position P2 in the image capturing C2 or an image acquired at the position P11 (position P11I) in the image capturing C11, and, for the modified region 12a, can be determined from an image acquired at the position P4 in the image capturing C4 or an image acquired at the position P6 (position P6I) in the image capturing C6.

Meandering amount F8 of lower fracture tip: can be measured from an image acquired at the position P5 (position P5I) in the image capturing C5.

Presence or absence of black streak between modified regions F9: can be determined from an image acquired in the range P9 in the image capturing C9 (can be determined that there is a black streak, in a case where the tips of the fractures 14b and 14c are checked in the image acquired in the range P9).

[Relationship Between Irradiation Condition and Formation State]

If the irradiation condition of the laser light L is changed when the modified regions 12a and 12b are formed, the formation states of the modified regions 12a and 12b and the fractures 14a to 14d may also change. Next, the correlation between the irradiation condition of the laser light L and the formation states of the modified regions 12a and 12b and the fractures 14a to 14d will be described by using, as an example, the upper fracture amount F2, the lower fracture amount F4, and the total fracture amount F5 among the formation state items.

First, the irradiation condition of the laser light L for forming the modified regions 12a and 12b includes a plurality of items. An example of the item (referred to as "irradiation condition item" below) included in the irradiation condition is as follows. Each of the irradiation condition items as follows is denoted by a reference sign (not illustrated) for easy description.

Modified region interval D1: interval between the modified region 12a and the modified region 12b in the Z-direction.

Pulse width D2: pulse width of the laser light L.

Pulse energy D3: pulse energy of the laser light L.

Pulse pitch D4: pulse pitch of the laser light L.

Condensing state D5: condensing state of the laser light, and being, for example, a spherical aberration correction level D6, an astigmatism correction level D7, or an LBA offset amount D8 (described later).

Figure 19:
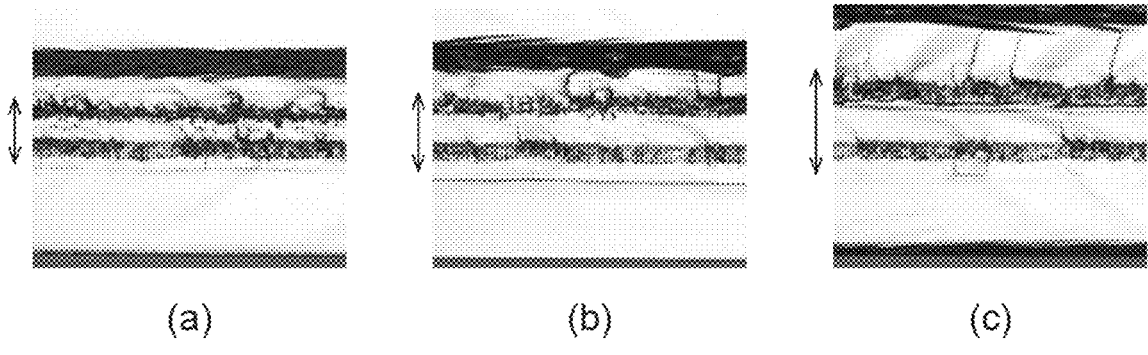
FIG. 19 is a diagram illustrating the change in the fracture amount in a case where the modified region interval is changed at the three points.

FIGS. 18 and 19 are diagrams illustrating the change in the fracture amount in a case where the modified region interval is changed at the three points. The horizontal axes of the graphs of (a) and (b) of FIG. 18 indicate the modified region interval D1 in the Z-height. The three points of the modified region interval D1 are Lv4, Lv8, and Lv12, and correspond to (a), (b), and (c) of FIG. 19, respectively. FIG. 19 illustrates a cut surface.

As illustrated in FIGS. 18 and 19, in the processing without the forward path and the backward path, the upper fracture amount F2, the lower fracture amount F4, and the total fracture amount F5 also increase in accordance with the increase in the modified region interval D1. As an example, a case where the focusing point of the laser light L travels in the X positive direction (the processing progress direction is the X positive direction) is referred to as processing in the forward path, and a case where the focusing point of the laser light L travels in the X negative direction (the processing progress direction is the X negative direction) is referred to as processing in the backward path.

Figure 21:
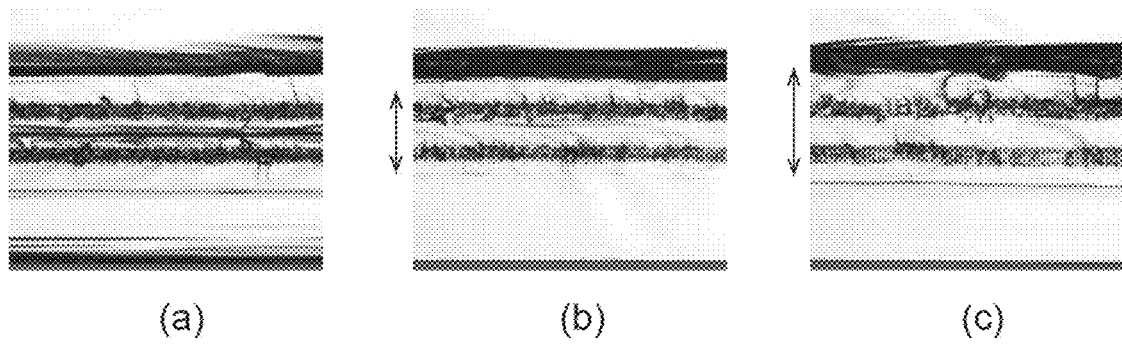
FIG. 21 is a diagram illustrating the change in the fracture amount in a case where the pulse width of the laser light is changed at the three points.

FIGS. 20 and 21 are diagrams illustrating the change in the fracture amount in a case where the pulse width of the laser light is changed at the three points. The three points of the pulse width D2 are Lv2, Lv3, and Lv5, and correspond to (a), (b), and (c) of FIG. 21, respectively. FIG. 21 illustrates a cut surface. As illustrated in FIGS. 20 and 21, the upper fracture amount F2, the lower fracture amount F4, and the total fracture amount F5 also increase in accordance with the increase in the pulse width D2. However, regarding the total fracture amount F5, in a case where the pulse width D2 is Lv2, a black streak occurs between the modified region 12a and the modified region 12b (there is a black streak between the modified regions), and it is not possible to measure the total fracture amount F5 by the image capturing unit 4 (the total fracture amount F5 is in a region A from the observation of the cut surface).

Figure 23:
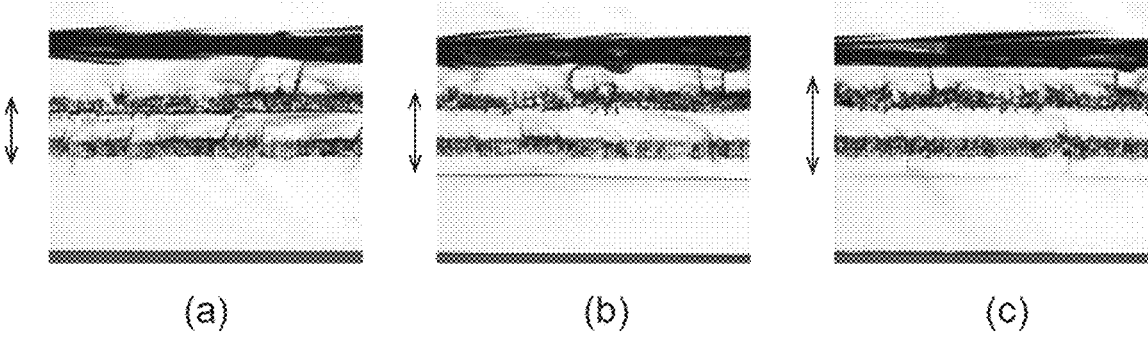
FIG. 23 is a diagram illustrating the change in the fracture amount in a case where the pulse energy of the laser light is changed at the three points.

FIGS. 22 and 23 are diagrams illustrating the change in the fracture amount in a case where the pulse energy of the laser light is changed at the three points. The three points of the pulse energy D3 are Lv2, Lv7, and Lv12, and correspond to (a), (b), and (c) of FIG. 23, respectively. FIG. 23 illustrates a cut surface. As illustrated in FIGS. 22 and 23, the upper fracture amount F2, the lower fracture amount F4, and the total fracture amount F5 also increase in accordance with the increase in the pulse energy D3.

Figure 25:
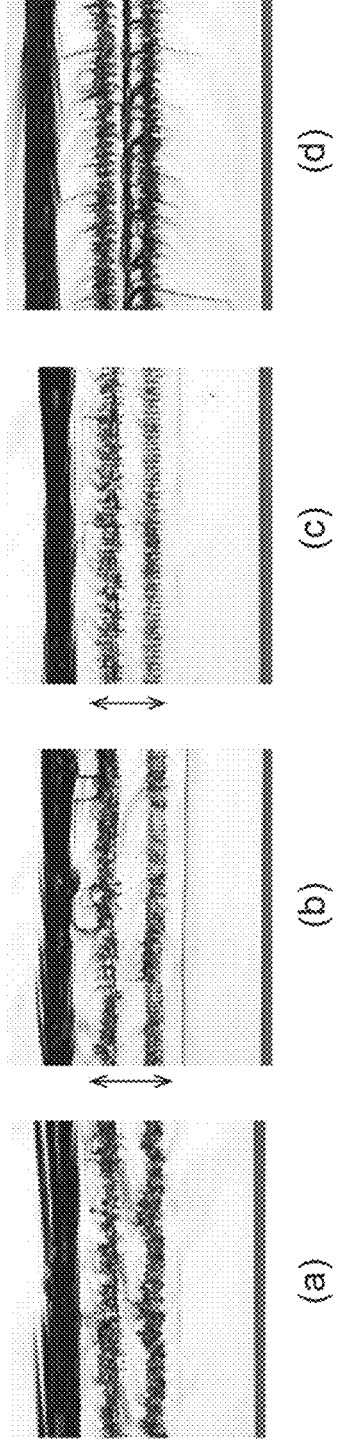
FIG. 25 is a diagram illustrating the change in the fracture amount in a case where the pulse pitch of the laser light is changed at the four points.

FIGS. 24 and 25 are diagrams illustrating the change in the fracture amount in a case where the pulse pitch of the laser light is changed at the four points. The four points of the pulse pitch D4 are Lv2.5, Lv3.3, Lv4.1, and Lv6.7, and correspond to (a), (b), (c), and (d) of FIG. 24, respectively. FIG. 25 illustrates a cut surface. As illustrated in FIGS. 24 and 25, the upper fracture amount F2, the lower fracture amount F4, and the total fracture amount F5 also change in accordance with the change in the pulse pitch D4.

In particular, in the lower fracture amount F4 in the forward path and the backward path, the upper fracture amount F2 in the backward path, and the total fracture amount F5 in the backward path, peaks appear among the four pulse pitches D4. However, regarding the total fracture amount F5, in a case where the pulse pitch D4 is Lv6.7, a black streak occurs between the modified region 12a and the modified region 12b (there is a black streak between the modified regions), and it is not possible to measure the total fracture amount F5 by the image capturing unit 4 (the total fracture amount F5 is in a region B from the observation of the cut surface).

Figure 27:
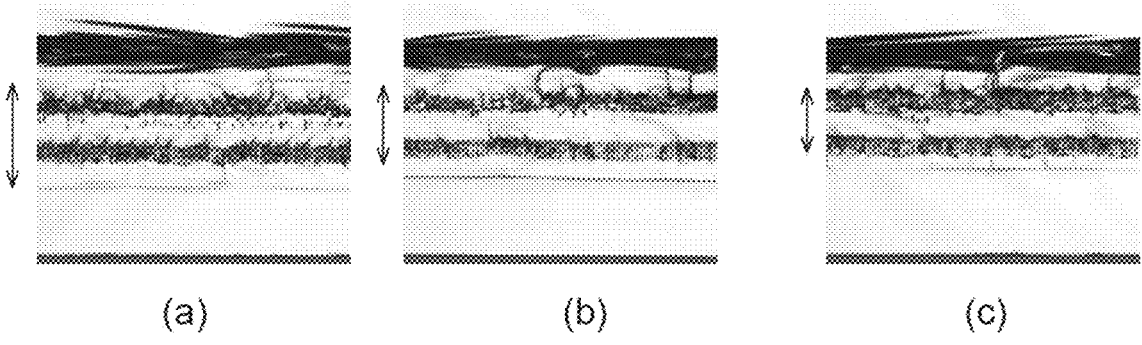
FIG. 27 is a diagram illustrating the change in the fracture amount in a case where the condensing state (spherical aberration correction level) of the laser light is changed at the three points.

FIGS. 26 and 27 are diagrams illustrating the change in the fracture amount in a case where the condensing state (spherical aberration correction level) of the laser light is changed at the three points. The three points of the spherical aberration correction level D6 are Lv−4, Lv−10, and Lv−16, and correspond to (a), (b), and (d) in FIG. 27, respectively. FIG. 27 illustrates a cut surface. As illustrated in FIGS. 26 and 27, the upper fracture amount F2, the lower fracture amount F4, and the total fracture amount F5 decrease in accordance with the increase in the spherical aberration correction level D6.

Figure 29:
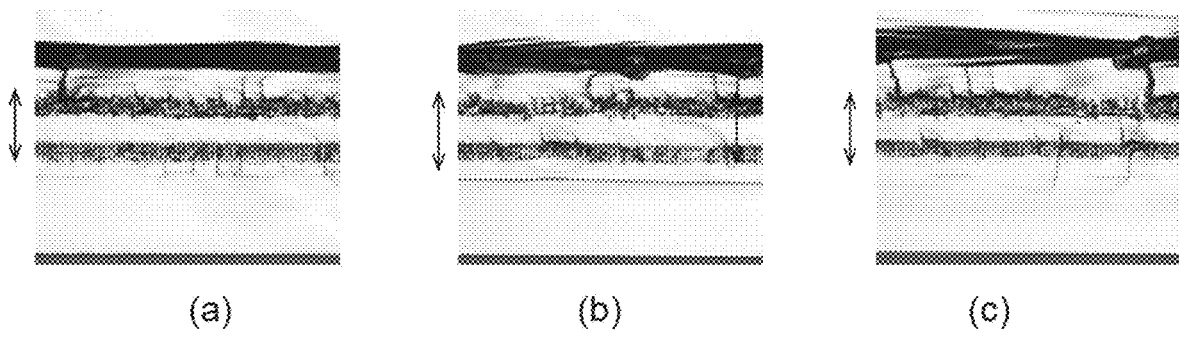
FIG. 29 is a diagram illustrating the change in the fracture amount in a case where the condensing state (astigmatism correction level) of the laser light is changed at the three points.

FIGS. 28 and 29 are diagrams illustrating the change in the fracture amount in a case where the condensing state (astigmatism correction level) of the laser light is changed at the three points. The three points of the astigmatism correction level D7 are Lv2.5, Lv10, and Lv17.5, and correspond to (a), (b), and (d) of FIG. 28, respectively. FIG. 29 illustrates a cut surface. As illustrated in FIGS. 28 and 29, the upper fracture amount F2, the lower fracture amount F4, and the total fracture amount F5 also change in accordance with the change in the astigmatism correction level D7. In particular, peaks appear in the astigmatism correction level D7 at the three points, except for the upper fracture amount F2 in the forward path and the backward path.

FIGS. 30 and 31 are diagrams illustrating the change in the presence or absence of the black streak in a case where the pulse pitch of the laser light is changed at the four points. The four points of the pulse pitch D4 are Lv2.5, Lv3.3, Lv4.1, and Lv6.7, and correspond to (a), (b), (c), and (d) of FIGS. 30 and 31, respectively. FIG. 31 illustrates a cut surface. As illustrated in FIG. 30, when the pulse pitch D4 is Lv6.7, the tips of the fractures 14b and 14c are checked (see (d) of FIG. 30). Actually, as illustrated in (d) of FIG. 31, in the observation of the cut surface, an occurrence of a black streak Bs was checked between the modified region 12a and the modified region 12b.

As described above, there is a correlation between the irradiation condition of the laser light L and the formation states of the modified regions 12a and 12b and the fractures 14a to 14d. Thus, by acquiring each item of the formation state by image capturing of the image capturing unit 4 after the formation of the modified regions 12a and 12b, it is possible to determine the pass or fail of the irradiation condition of the laser light L or obtain a desirable irradiation condition of the laser light L.

[Embodiment of Laser Processing Device]

Figure 32:
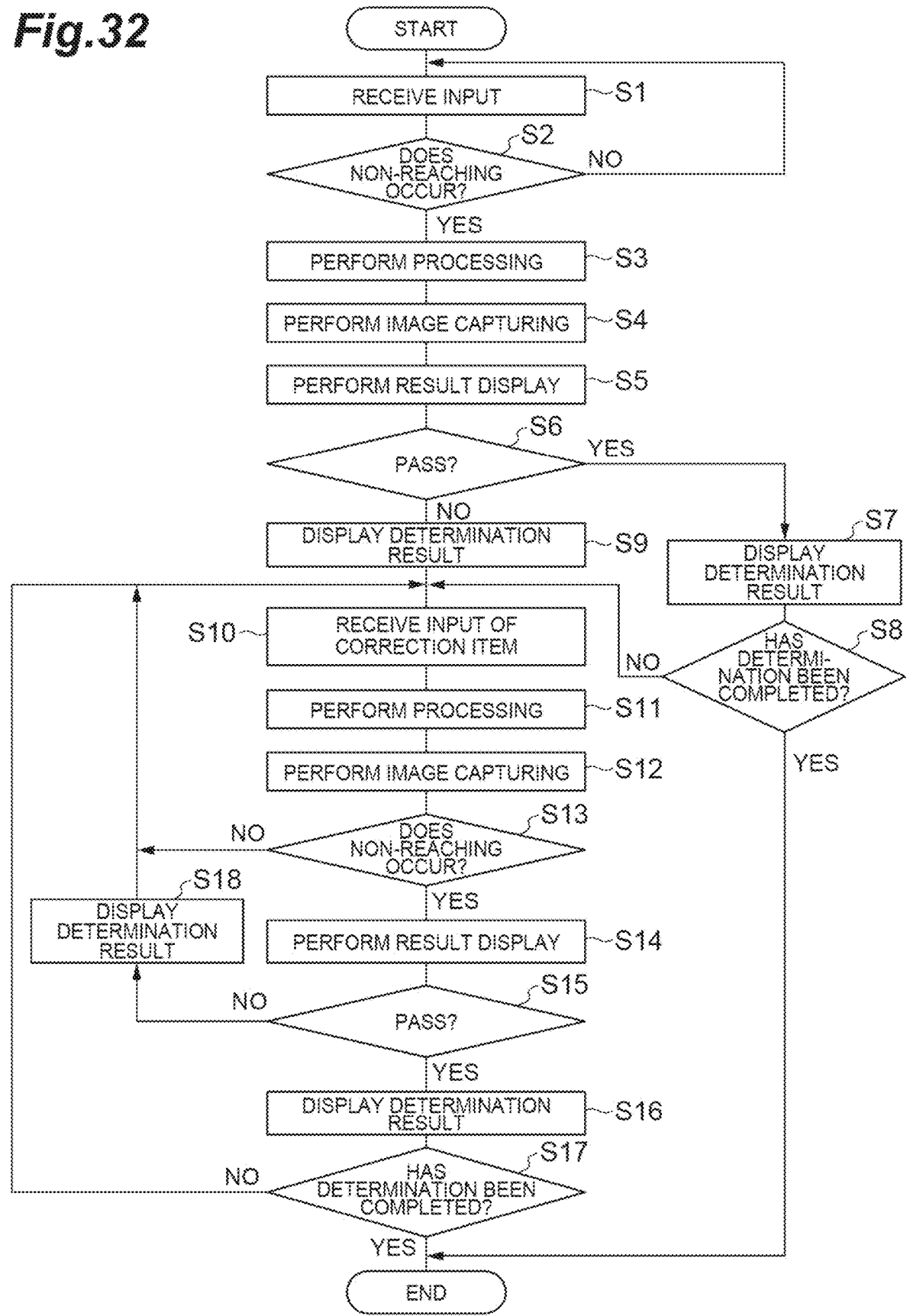
FIG. 32 is a flowchart illustrating main steps of a pass/fail determination method.

Next, an embodiment of the laser processing device 1 will be described. Here, an example of an operation of performing pass/fail determination of the irradiation condition of the laser light L will be described. FIG. 32 is a flowchart illustrating main steps of a pass/fail determination method. The following method is a first embodiment of a laser processing method. Here, first, the control unit 10 in the laser processing device 1 receives an input from a user (Step S1). Step S1 will be described in more detail.

Figure 33:
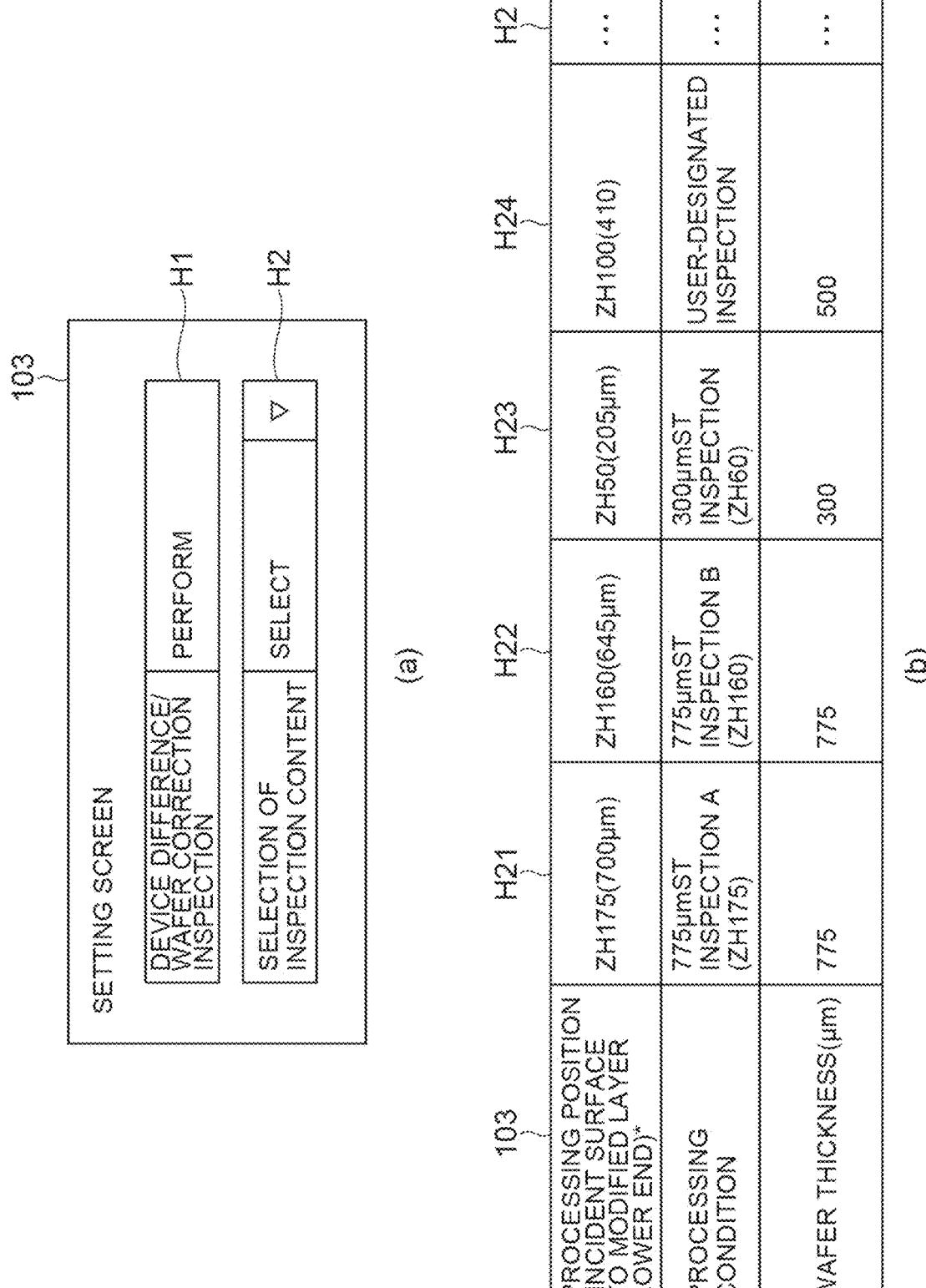
FIG. 33 is a diagram illustrating an example of an input reception unit illustrated in FIG. 1.

FIG. 33 is a diagram illustrating an example of the input reception unit illustrated in FIG. 1. As illustrated in (a) of FIG. 33, in Step S1, first, the control unit 10 controls the input reception unit 103 to display information H1 and information H2. The information H1 is used for urging the user to select whether or not to perform a device difference/wafer correction inspection. The information H2 is used for urging the user to select the inspection content. The device difference/wafer correction inspection is a mode in which, since the irradiation condition of the laser light L for realizing the desired formation states of the modified regions 12a and 12b and the fractures 14a to 14d may vary depending on the wafer or the device difference of the laser processing device 1, irradiation (processing) with the laser light L is performed under the predetermined irradiation condition, and the pass/fail determination of the irradiation condition is performed. In the following description, the formation states of the modified regions 12a and 12b and the fractures 14a to 14d may be simply referred to as a "formation state", and the irradiation condition of the laser light L may be simply referred to as an "irradiation condition".

In addition, as illustrated in (b) of FIG. 33, for example, a plurality of inspection contents H21 to H24 in which the processing position, the processing condition, and the wafer thickness are set as one set are displayed as the information H2 for urging the selection of the inspection contents. The processing position is a position of the tip of the modified region 12a on the front surface 21a side from the incident surface (here, the back surface 21b) of the laser light L. Here, the processing conditions are various conditions in which a fracture does not reach the outer surface at a predetermined wafer thickness and a processing position (ST).

Then, in Step S1, the input reception unit 103 receives selection of whether or not to perform the device difference/wafer correction inspection by the user. In Step S1, the input reception unit 103 receives selection of the inspection contents H21 to H24 and the like. Then, in Step S1, in a case where the input reception unit 103 receives the selection indicating that the device difference/wafer correction inspection is performed, and receives the selection of the inspection contents H21 to H24 and the like, the control unit 10 sets the processing conditions (including the irradiation conditions with the laser light L) corresponding to the inspection contents H21 to H24 and the like, as the basic processing conditions.

FIG. 34 is a diagram illustrating the input reception unit in a state where an example of basic processing conditions is displayed. As illustrated in FIG. 34, in Step S1, in a case where the input reception unit 103 receives the selection indicating that the device difference/wafer correction inspection is performed, and receives the selection of the inspection contents H21 to H24 and the like, the control unit 10 controls the input reception unit 103 to display information H3 indicating the set basic processing condition on the input reception unit 103. The information H3 indicating the basic processing condition includes a plurality of items.

Among the plurality of items, an item H31 indicating that the device difference/wafer correction inspection is performed, a processing condition H32, a wafer thickness H33, and a processing position H34 indicate the selection result of the inspection contents H21 to H24 and the like in the previous time, and do not receive the selection from the user at the present time. On the other hand, although the control unit 10 presents, as an example of the basic processing condition, the number of focuses H41, the number of paths H42, a processing speed H43, a pulse width H44, a frequency H45, pulse energy H46, a determination item H47, a target value H48, and a standard H49, the selection (change) from the user is received at the present time.

The number of focuses H41 indicates the number of branches (the number of focuses) of the laser light L. The number of paths H42 indicates the number of times of scanning of the laser light L along a line. The processing speed H43 indicates the relative speed of the focusing point of the laser light L. Therefore, the pulse pitch of the laser light L may be defined by the processing speed H43 and the (repetition) frequency H45 of the laser light L. On the other hand, the determination item H47 indicates a formation state item used for the pass/fail determination of the irradiation condition of the laser light L among the plurality of formation state items described above.

Here, as an example, the fracture amount (lower side), that is, the lower fracture amount F4 is set as the determination item H47 (other formation state items can also be selected). In addition, the target value H48 indicates the center value of a pass range of the irradiation condition of the laser light L. The standard H49 indicates the vertical width from the center value (target value H48) of the pass range. That is, here, in a case where the lower fracture amount F4 is in a range of 35 μm or more and 45 μm or less as the basic processing condition, the target value H48 and the standard H49 are set (another range can be selected) so that the irradiation condition of the laser light L is determined to be pass.

The above description means Step S1, and the basic processing condition for laser processing is set. In the subsequent step, the control unit 10 performs a process (fourth process) of determining whether or not the basic processing condition which is the irradiation condition set in Step S1 is a non-reaching condition (ST condition) being a condition that the fractures 14a and 14d actually do not reach the outer surface (front surface 21a and back surface 21b) (Step S2). Here, the control unit 10 determines whether or not the condition for which the input has been received is the non-reaching condition by referring to a database (without performing image capturing). As an example, the control unit 10 can determine, for example, whether a condition (BHC condition) that the fracture 14a reaches the front surface 21a is not satisfied because a condensing position corresponding to the processing position at which the input is received is too close to the front surface 21a.

In the subsequent step, in a case where the result of the determination in Step S2 is a result indicating that the basic processing condition is an non-reaching condition (Step S2: YES), processing is performed under the basic processing condition set in Step S1 (Step S3, first step). Here, by the control of the laser irradiation unit 3, the control unit 10 performs a first process of irradiating the semiconductor substrate 21 with the laser light L and forming modified regions 12a and 12b and the fractures 14a to 14d extending from the modified regions 12a and 12b in the semiconductor substrate 21 so as not to reach the outer surfaces (the front surface 21a and the back surface 21b) of the semiconductor substrate 21. More specifically, in Step S3, the control unit 10 controls the laser irradiation unit 3 and the stage 2 to relatively move the focusing points O1 and O2 in the X-direction in a state where the focusing points O1 and O2 of the laser light L is located in the semiconductor substrate 21. Thus, the modified regions 12*a* and 12*b* and the fractures 14*a* to 14*d* are formed in the semiconductor substrate 21. In a case where the result of the determination in Step S2 indicates that the basic processing condition is not the non-reaching condition (Step S2: NO), the process returns to Step S1 to reset the irradiation condition.

Then, by the control of the image capturing unit 4, the control unit 10 performs a second process of capturing an image of the semiconductor substrate 21 with the light I1 having transparency to the semiconductor substrate 21 and acquiring information indicating the formation states of the modified regions 12*a* and 12*b* and/or the fractures 14*a* and 14*b* (Step S4, second step). Here, in Step S1, since the lower fracture amount F4 is designated as the determination item H47, at least image capturing C5 and image capturing C6 necessary for acquiring the lower fracture amount F4 are performed (another image capturing may be performed).

Then, by the control of the input reception unit 103, the control unit 10 performs a process of causing the input reception unit 103 to display the information indicating the irradiation condition of the laser light L in Step S3 (first process) and the information indicating the formation state acquired in Step S4 (second process) in association with each other (Step S5). The information (formation state item) indicating the formation state displayed in Step S5 is the lower fracture amount F4 of the determination item H47 set in Step S1 (other formation state items may also be displayed). As described above, the determination item H47 may be selected.

Therefore, in Step S1, by the control of the input reception unit 103, the control unit 10 performs a process of causing the input reception unit 103 to display information for urging selection of the formation state item to be displayed on the input reception unit 103 in Step S5 among the plurality of formation state items. In addition, the input reception unit 103 receives selection of the formation state item in Step S1. Then, in Step S5, the control unit 10 controls the input reception unit 103 to display the information indicating the formation state item (here, the lower fracture amount F4) received by the input reception unit 103 and the information indicating the irradiation condition (here, the pulse energy D3) with the laser light L, on the input reception unit 103 in association with each other.

Furthermore, by the control of the input reception unit 103, the control unit 10 may perform a process of causing the input reception unit 103 to display information for urging selection of the irradiation condition item to be displayed on the input reception unit 103 in Step S5 among a plurality of irradiation condition items that are items included in the irradiation condition of the laser light L. In a case where this process is performed, the input reception unit 103 may receive an input of the selection of the irradiation condition item, and the control unit 10 may cause the input reception unit 103 to display information indicating the irradiation condition item received by the input reception unit 103 in the irradiation condition in association with the information indicating the formation state, by the control of the input reception unit 103.

In the subsequent step, the control unit 10 performs a third process of performing pass/fail determination of the irradiation condition of the laser light L in Step S3 (first process) based on the information indicating the formation states of the modified regions 12*a* and 12*b* and/or the fractures 14*a* to 14*b* acquired in Step S4 (Step S6, third step). More specifically, since the determination item H47 set in Step S1 is the lower fracture amount F4, the target value H48 is 40 µm, and the standard is ±5 µm, in a case where the lower fracture amount F4 acquired in Step S4 is in the range of 35 µm or more and 45 µm or less, the control unit 10 determines that the irradiation condition of the laser light L in Step S3 is a pass.

As described above, the determination item H47 may be selected. Therefore, in Step S1, by the control of the input reception unit 103, the control unit 10 performs a tenth process of causing the input reception unit 103 to display information for urging selection of the determination item H47, which is an item used for pass/fail determination among the plurality of formation state items included in the formation state. In addition, the input reception unit 103 receives selection of the determination item H47 in Step S1. Then, the control unit 10 performs the pass/fail determination based on the information indicating the determination item H47 received by the input reception unit 103.

Further, as described above, the target value H48 and standard H49 may be selected. Therefore, in Step S1, the control unit 10 performs the seventh process of causing the input reception unit 103 to display information for urging the input of the target value H48 and the standard H49 in the formation state under the control of the input reception unit 103. In Step S1, the input reception unit 103 receives the target value H48 and the standard H49. Then, in Step S6, the control unit 10 compares the formation state (lower fracture amount F4) under the irradiation condition in Step S3 with the target value H48 and the standard H49 to perform pass/fail determination.

In a case where the result of Step S6 is a result indicating a pass (Step S6: YES), the control unit 10 performs the sixth process of displaying a determination result indicating the pass (a result of the pass/fail determination) on the input reception unit 103 by the control of the input reception unit 103 (Step S7), and then determines whether the pass/fail determination has been completed (Step S8). In Step S8, under the control of the input reception unit 103, the control unit 10 causes the input reception unit 103 to display information urging selection of whether or not the pass/fail determination has been completed, and ends the processing when the input reception unit 103 receives an input indicating that the pass/fail determination has been completed (Step S8: YES). On the other hand, in Step S8, when the input reception unit 103 receives an input indicating that the pass/fail determination has not been completed and the re-determination is performed (Step S8: NO), the process proceeds to Step S10 described later. This is because, even in a case where the determination result by the control unit 10 is a pass, there is a case where there is a demand for continuing the pass/fail determination so as to set a favorable condition farther from the fail, for example.

On the other hand, in a case where the result of Step S6 is the result indicating the rejection (Step S6: NO), the control unit 10 performs the sixth process of displaying the determination result indicating the rejection (the result of the pass/fail determination) on the input reception unit 103 by the control of the input reception unit 103 (Step S9), and performs re-determination of correcting at least one of the plurality of irradiation condition items as a correction item and performing the first process and the subsequent processes again.

Re-determination will be described more specifically. In a case where the result of the pass/fail determination in Step S6 is the fail, and in a case where the input indicating that the re-determination is performed is received in Step S8, the control unit 10 performs the re-determination of correcting at least one of the plurality of irradiation condition items included in the irradiation condition as the correction item and performing the first process and the subsequent processes again by the control of the input reception unit 103. That is, the case of performing the re-determination is not limited to the case where the result of the pass/fail determination is a fail. In other words, here, the re-determination is performed according to the result of the pass/fail determination in Step S6. The control unit 10 may execute an eighth process of causing the input reception unit 103 to display information urging selection of whether or not to correct at least one of the plurality of irradiation condition items included in the irradiation condition as a correction item and perform re-determination, and may execute the re-determination when the input reception unit 103 receives the selection to perform the re-determination.

Figure 35:
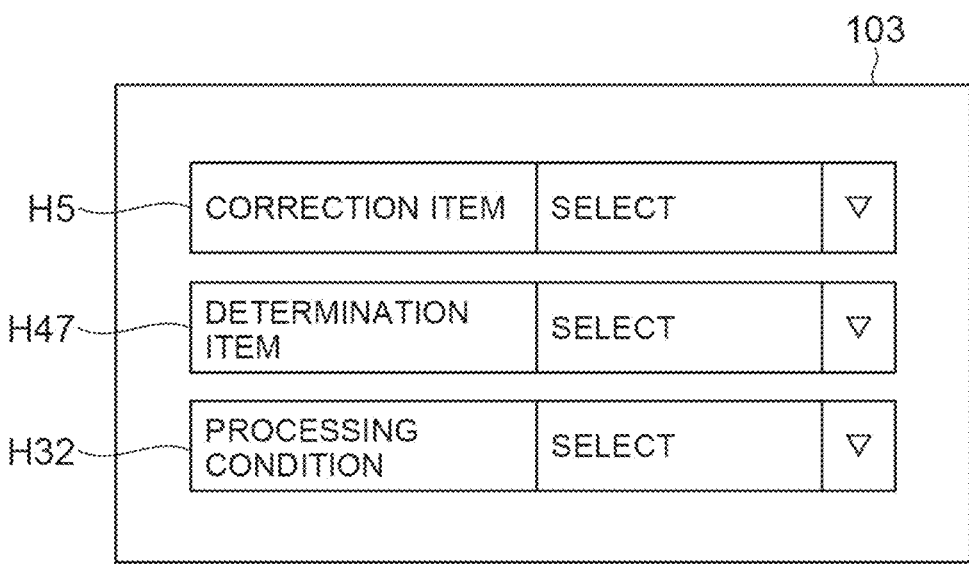
FIG. 35 is a diagram illustrating an input reception unit in a state where information for urging selection of a correction item is displayed.

Therefore, as illustrated in FIG. 35, the control unit 10 first performs the ninth process of causing the input reception unit 103 to display information urging the selection of the correction item H5 by the control of the input reception unit 103 (Step S10). The correction item H5 can be selected from the irradiation condition items described above, for example. At the same time as the correction item H5, the control unit 10 can cause the input reception unit 103 to display information urging selection of the determination item H47 and the processing condition H32. Then, the input reception unit 103 receives at least the selection of the correction item H5 by the user (Step S10).

Figure 36:
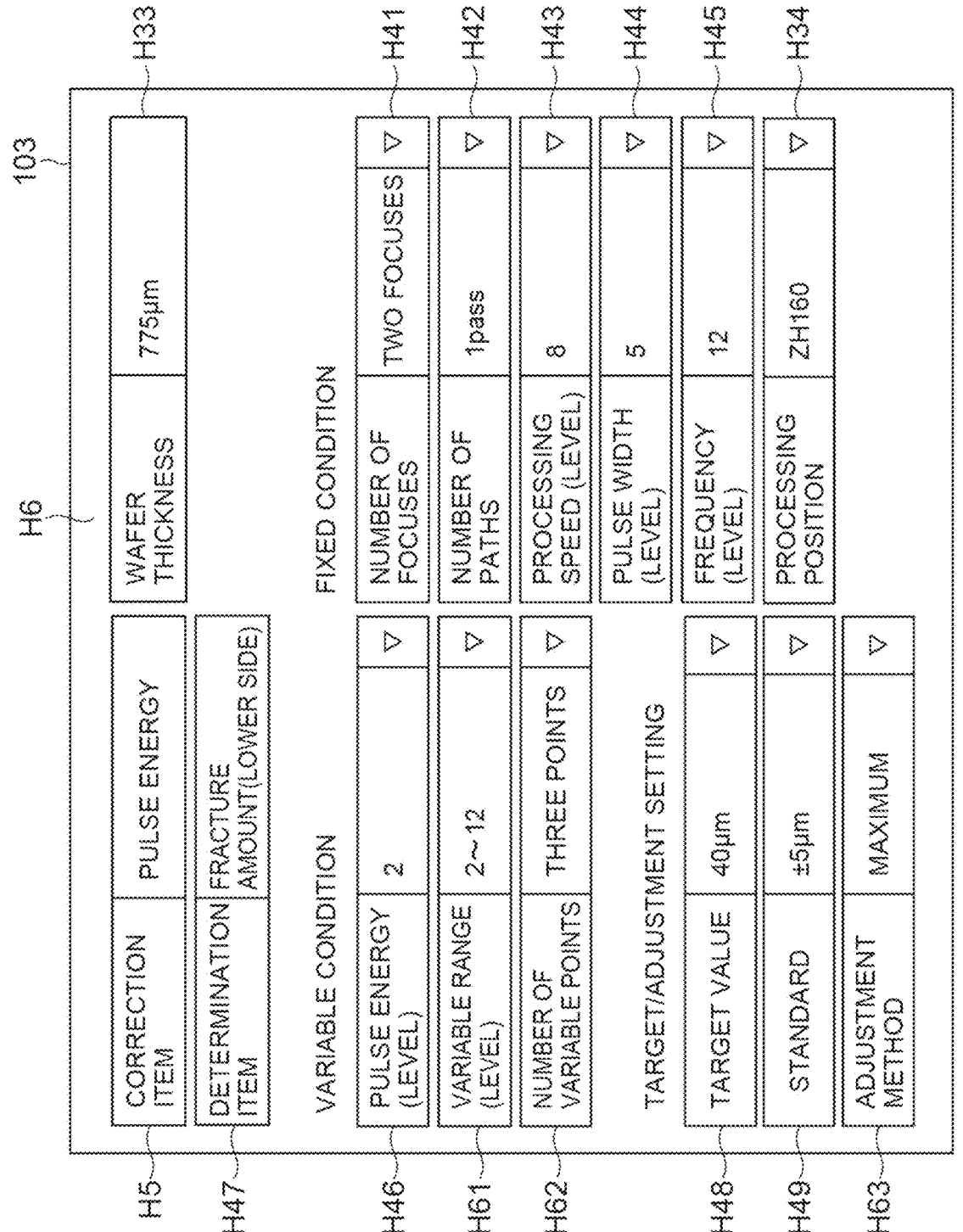
FIG. 36 is a diagram illustrating an input reception unit in a state where a setting screen for re-processing conditions is displayed.

Subsequently, as illustrated in FIG. 36, the control unit 10 causes the input reception unit 103 to display a setting screen H6 in which the correction item H5 of the selection result received by the input reception unit 103 is set as a variable condition under the control of the input reception unit 103. As an example, the setting screen H6 is a screen in a case where the correction item H5 is selected as the pulse energy D3. Therefore, pulse energy H46 is displayed as a variable condition. Here, the value of the basic processing condition is displayed as the pulse energy H46, the range of Lv2 is displayed as the variable range H61, and three points are displayed as the number of variable points H62. These items can also be selected (changed) by the user.

On the setting screen H6, the maximum value is displayed as the adjustment method H63. Therefore, in the following re-determination, as a result of irradiation (processing) of the laser light L with three pulse energies D3 different from each other in the range of Lv10, in a case where pass determination is made with a plurality of pulse energies D3, the pulse energy D3 with which the maximum lower fracture amount F4 is obtained is displayed as an adjustment candidate. In the setting screen H6, items other than the correction item H5, the determination item H47, and the wafer thickness H33 can be selected by the user at the present time. Then, the control unit 10 sets the irradiation condition and the like displayed on the setting screen H6 as conditions for re-determination. In the adjusting method H63, a minimum value, an average value, or the like can be selected instead of the maximum value depending on the irradiation condition.

Subsequently, the control unit 10 performs processing under the conditions displayed on the setting screen H6 (Step S11, first step). That is, hereinafter, the control unit 10 corrects the correction item H5 received by the input reception unit 103 and performs re-determination. In Step S11, by the control of the laser irradiation unit 3, the control unit 10 performs the first process of irradiating the semiconductor substrate 21 with the laser light L to form the modified regions 12a and 12b and the fractures 14a to 14d extending from the modified regions 12a and 12b on the semiconductor substrate 21 so as not to reach the outer surfaces (the front surface 21a and the back surface 21b) of the semiconductor substrate 21. In particular, here, processing is performed for three cases where the pulse energies as the correction items H5 are different from each other.

Subsequently, by the control of the image capturing unit 4, the control unit 10 performs a second process of capturing an image of the semiconductor substrate 21 with the light I1 having transparency to the semiconductor substrate 21 and acquiring information indicating the formation states of the modified regions 12a and 12b and/or the fractures 14a to 14b (Step S12, second step). Here, in Step S1 and Step S10 (setting screen H6), since the lower fracture amount F4 is designated as the determination item H47, at least image capturing C6 capable of acquiring the lower fracture amount F4 is executed.

Subsequently, the control unit 10 performs the fifth process of determining whether or not the fractures 14a and 14d have not reached the outer surfaces (the front surface 21a and the back surface 21b) based on the information indicating the formation state acquired in the Step S12 (second process) (Step S13). Here, in at least one of a case where the second end 14ae of the fracture 14a is not checked in the image acquired in the image capturing C5 and a case where the fracture 14d is checked on the back surface 21b in the image acquired in the image capturing C0, it can be determined that the fractures 14a and 14d have reached the outer surface and non-reaching does not occur (ST). In the image capturing C0, an image of the back surface 21b is captured with the light I1 (see FIG. 17).

When the determination result of Step S13 is a result indicating that the fractures 14a and 14d reach the outer surface, that is, in a case where non-reaching does not occur (Step S13: NO), the process proceeds to Step S10 so that the irradiation condition in Step S10 is reset.

On the other hand, in a case where the determination result of Step S13 is a result indicating that the fractures 14a and 14d have not reached the outer surface, that is, in a case where non-reaching occurs (Step S13: YES), the control unit 10 performs a process of causing the input reception unit 103 to display the information indicating the irradiation condition of the laser light L in Step S11 (first process) and the information indicating the formation state acquired in Step S12 (second process) in association with each other by the control of the input reception unit 103 (Step S14). The formation state item displayed in Step S14 is the lower fracture amount F4 of the determination item H47 set in Step S10. As described above, the determination item H47 may be selected.

Therefore, in Step S10, by the control of the input reception unit 103, the control unit 10 performs a process of causing the input reception unit 103 to display information urging selection of the formation state item to be displayed on the input reception unit 103 in Step S14 among the plurality of formation state items. In Step S10, the input reception unit 103 receives selection of the formation state item. Then, in Step S14, the control unit 10 controls the input reception unit 103 to display the information indicating the formation state item (here, the lower fracture amount F4) received by the input reception unit 103 in association with the information indicating the irradiation condition of the laser light L, on the input reception unit 103.

In the subsequent step, the control unit 10 performs the third process of performing pass/fail determination of the irradiation condition of the laser light L in Step S12 (first process) based on the information indicating the formation state acquired in Step S11 (Step S15, third step). More specifically, since the determination item H47 set in Step S10 is the lower fracture amount F4, the target value H48 is 40 μm, and the standard is ±5 μm, when the lower fracture amount F4 acquired in Step S12 is in the range of 35 μm or more and 45 μm or less, the control unit 10 determines that the irradiation condition of the laser light L in Step S11 is pass.

As described above, the target value H48 and the standard H49 may be selected. Therefore, in Step S10, the control unit 10 performs a seventh process of causing the input reception unit 103 to display information for urging the input of the target value H48 and the standard H49 in the formation state by the control of the input reception unit 103. In Step S10, the input reception unit 103 receives the target value H48 and the standard H49. Then, in Step S15, the control unit 10 performs the pass/fail determination by comparing the formation state (lower fracture amount F4) under the irradiation condition in Step S11 with the target value H48 and the standard H49.

Figure 37:
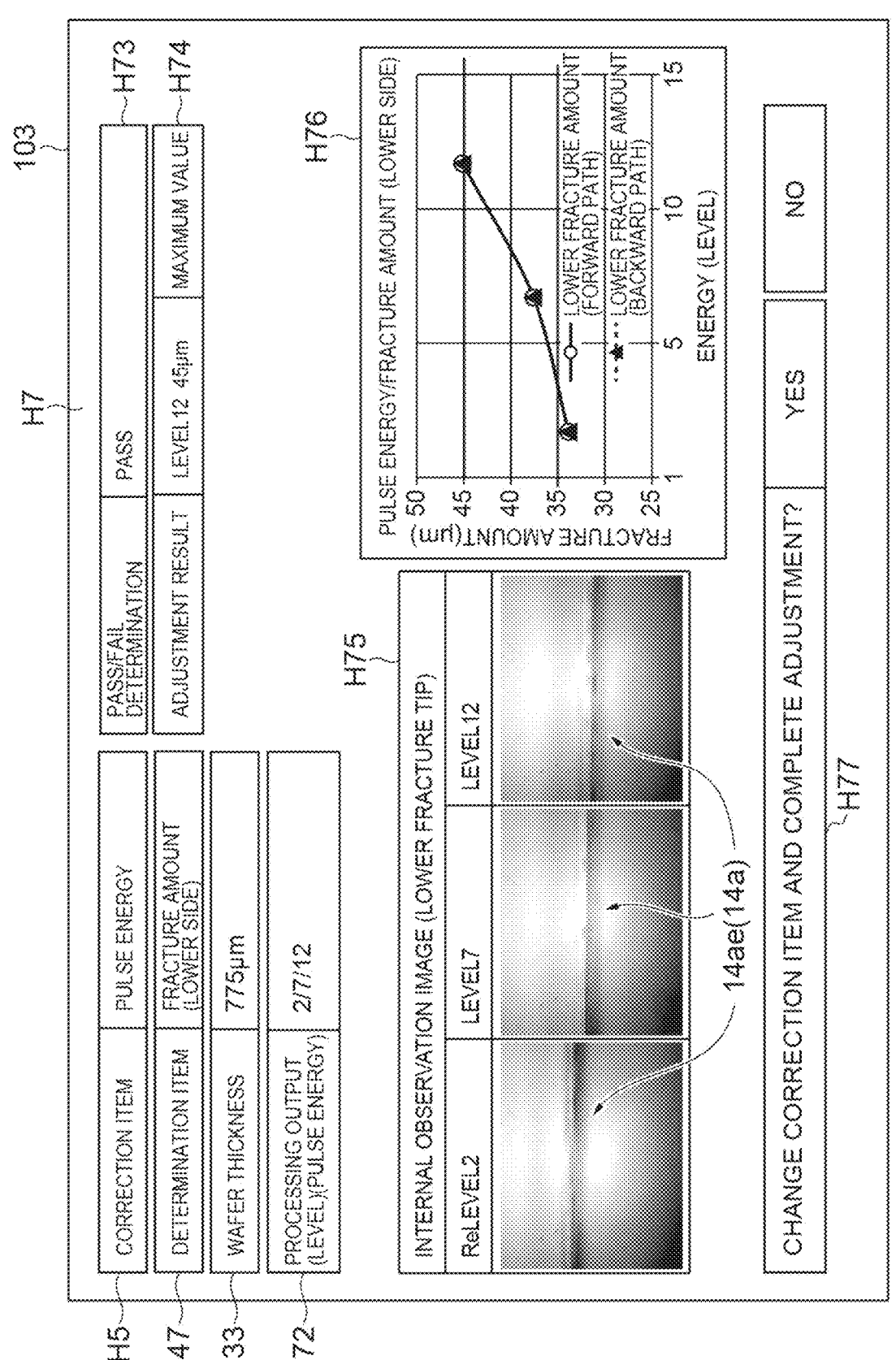
FIG. 37 is a diagram illustrating an input reception unit in a state where information indicating a determination result (pass) is displayed.

Then, in a case where the result of Step S15 is a result indicating the pass (Step S15: YES), the control unit 10 performs the sixth process (Step S16) of causing the input reception unit 103 to display the information H7 indicating the determination result (result of the pass/fail determination) by the control of the input reception unit 103, and ends the processing. FIG. 37 is a diagram illustrating the input reception unit in a state where the information indicating the determination result (pass) is displayed. As illustrated in FIG. 37, in the information H7 indicating the determination result, a processing output H72, pass/fail determination H73, an adjustment result H74, an internal observation image H75, and a graph H76 are displayed in addition to the correction item H5, the determination item H47, and the wafer thickness H33 described above.

The processing output H72 is an item for making the pulse energy D3 being the correction item H5, be variable. That is, here, the pulse energy D3 is made variable at three points by making the processing output H72 be variable at three points. In the adjustment result H74, the processing output H72 (pulse energy) with the largest lower fracture amount F4 (temporarily indicated as a peak value) is displayed among the processing outputs H72 (pulse energy) at the three points.

The pulse energy D3 as the irradiation condition item may be made variable by the processing output as described above. The processing output may be adjusted by, for example, adjustment by an attenuator or the like, or the original output and frequency of the laser irradiation unit 3. On the other hand, for example, in a case where a plurality of focusing points of the laser light L is formed by branching the laser light, the modified region interval D1 may be made variable by controlling the position of the focusing point in the Z-direction with the spatial light modulator 5. In addition, in a case where there is a single focusing point of the laser light, the modified region interval D1 may be made variable by adjusting the position of the laser irradiation unit 3 in the Z-direction between the plurality of paths.

Furthermore, the pulse width D2 may be made variable by performing switching of the setting of the laser irradiation unit 3 (combination of a mounted waveform memory/frequency and an original output), switching of the light source 31 in a case where a plurality of light sources 31 is mounted, or the like. The irradiation condition item may be set as a pulse waveform including the pulse width D2. In this case, the pulse waveform may be made variable not only in the pulse width D2 but also in a waveform (rectangular wave, Gaussian, burst pulse) or the like.

In addition, the pulse pitch D4 may be made variable depending on the relative speed of the focusing point of the laser light L (movement speed of the stage 2), the frequency of the laser light L, and the like. In addition, the spherical aberration correction level D6 may be made variable by a correction annular lens or a modulation pattern. The astigmatism correction level D7 (or a coma correction level) may be made variable depending on the adjustment of an optical system or the modulation pattern. Furthermore, the LBA offset amount D8 may be made variable by the control of the spatial light modulator 5.

Subsequently, FIG. 37 is used as the reference. In the internal observation image H75, an image (image acquired by image capturing C5) in a state in which the focus F is at the second end 14ae (lower fracture tip) of the fracture 14a (lower fracture) in each of the three processing outputs H72 (pulse energy D3) is displayed. In the graph H76, the pulse energy D3 and the lower fracture amount F4 are associated with each other. That is, here, the control unit 10 causes the input reception unit 103 to display the information indicating the formation state item (lower fracture amount F4) received by the input reception unit 103 in the formation state, on the input reception unit 103 in association with the correction item H5 (pulse energy D3) in the information indicating the irradiation condition (the associated graph H76).

In the information H7 indicating the determination result, information H77 for urging selection of whether or not to change the correction item and complete adjustment is displayed. Thus, the user can select whether or not to set the correction item (here, the pulse energy D3) to a value (pass value) indicated by the adjustment result H74.

In the subsequent step, the control unit 10 determines whether the pass/fail determination has been completed (Step S17). In Step S17, under the control of the input reception unit 103, the control unit 10 causes the input reception unit 103 to display information urging selection of whether or not the pass/fail determination has been completed, and ends the processing when the input reception unit 103 receives an input indicating that the pass/fail determination has been completed (Step S17: YES). On the other hand, in Step S17, when the input reception unit 103 receives an input indicating that the pass/fail determination has not been completed and the re-determination is performed (Step S17: NO), the process proceeds to Step S10. This is because, even in a case where the re-determination result by the control unit 10 is the pass, there is a case where there is a demand for continuing the pass/fail determination so as to set a favorable condition farther from the fail, for example.

Figure 38:
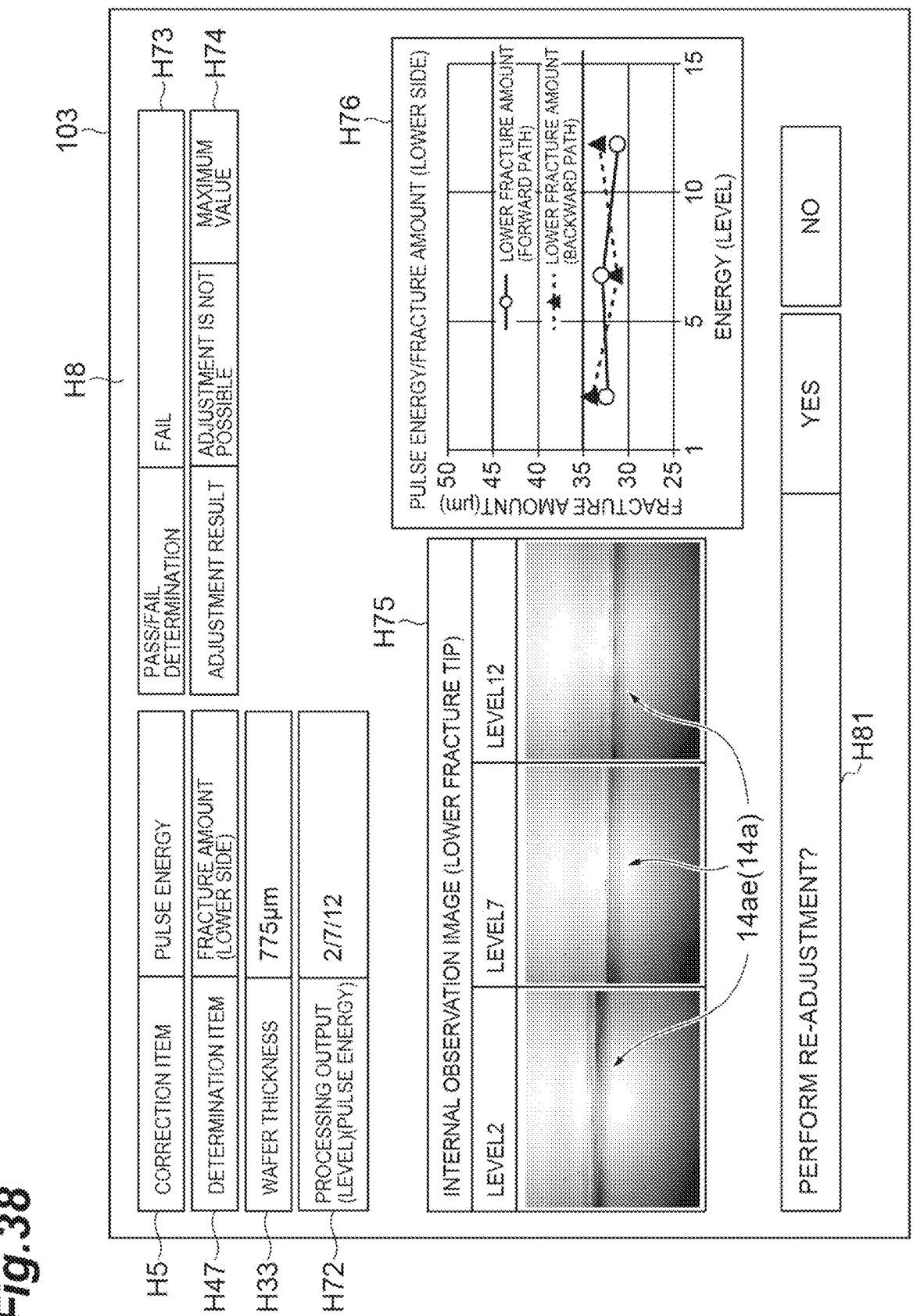
FIG. 38 is a diagram illustrating an input reception unit in a state where information indicating a determination result (fail) is displayed.

In a case where the result of Step S15 is a result indicating the fail (Step S15: NO), the control unit 10 performs the sixth process of displaying a determination result indicating the fail (a result of the pass/fail determination) on the input reception unit 103 by the control of the input reception unit 103 (Step S18), and then proceeds to Step S10. FIG. 38 is a diagram illustrating the input reception unit in a state where the information indicating the determination result (fail) is displayed. As illustrated in FIG. 38, the information H8 indicating the determination result is different from the information H7 illustrated in FIG. 37 in that fail is displayed in the pass/fail determination H73, that it is displayed in adjustment result H74 that the adjustment is not possible, and the contents of the graph H76. In the information H8 indicating the determination result, information H81 for urging selection of whether or not to perform re-adjustment is displayed. Thus, the user can also avoid repeating the re-determination by proceeding to Step S10 as described above and end the processing.

In the first embodiment described above, the lower fracture amount F4 is exemplified as the formation state item, and the pulse energy D3 is exemplified as the irradiation condition item (correction item). However, as the irradiation condition item (correction item), any of the above-described items may be selected. As the formation state item, any item having a correlation with the selected irradiation condition item (correction item) (which may be used here for the pass/fail determination of the irradiation condition item) may be selected.

For example, even in a case where any of the modified region interval D1 to the condensing state D5 is selected as the irradiation condition item (correction item), the upper fracture tip position F1 to the total fracture amount F5, the meandering amount F8 of the lower fracture tip, and the presence or absence F9 of a black streak between the modified regions may be selected (there is a correlation) as the formation state items. In addition, in a case where the condensing state D5 is selected as the irradiation condition item (correction item), the upper and lower fracture tip position shift width F6 and the presence or absence of a modified region dent F7 may be further selected as the formation state items. The same applies to other embodiments.

As described above, in the laser processing device 1 and the laser processing method according to the present embodiment, the semiconductor substrate 21 is irradiated with the laser light L to form the modified regions 12a and 12b and the like (the modified regions 12a and 12b and the fractures 14a to 14d extending from the modified regions 12a and 12b). Then, an image is formed on the semiconductor substrate 21 by the light I1 transmitted through the semiconductor substrate 21, and the formation states (processing results) of the modified regions 12a and 12b and the like are acquired. Then, the pass/fail determination of the irradiation condition of the laser light L is performed based on the formation states of the modified regions 12a and 12b and the like. Thus, it is not necessary to cut the semiconductor substrate 21 or perform cross-section observation when pass/fail determination of the laser light L irradiation condition is performed based on the formation states of the modified regions 12a and 12b, or the like. Therefore, according to the laser processing device 1 and the laser processing method according to the present embodiment, the pass/fail determination of the irradiation condition of the laser light L based on the processing result is facilitated.

In particular, in the laser processing device 1 and the laser processing method according to the above-described embodiment, in a state where the modified regions 12a and 12b and the fractures 14a to 14d are not exposed to the outer surface (the front surface 21a and the back surface 21b) of the semiconductor substrate 21, it is possible to grasp the relevance between the formation state of the modified regions 12a and 12b and the irradiation condition of the laser light L, and perform the pass/fail determination of the irradiation condition. Therefore, as compared with a state in which the fractures 14a to 14d reach the outer surface, the fractures are less likely to be affected by the outside (for example, vibration or change with time). Therefore, it is possible to avoid an occurrence of a situation in which the semiconductor substrate 21 is divided due to unintentional development of the fractures 14a to 14d at the time of transport.

In addition, the laser processing device 1 according to the present embodiment further includes the input reception unit 103 that displays information and receives an input. Therefore, it is possible to present information to the user, and receive an input of information from the user.

In the laser processing device 1 according to the present embodiment, after the third process, the control unit 10 performs the fourth process of displaying the information indicating the result of the pass/fail determination on the input reception unit 103 by the control of the input reception unit 103. Therefore, it is possible to present the result of the pass/fail determination to a user.

In addition, in the laser processing device 1 according to the present embodiment, before the third process, the control unit 10 performs the seventh process of causing the input reception unit 103 to display information for urging the input of the target value of the formation state, by the control of the input reception unit 103. In addition, the input reception unit 103 receives the input of the target value. Then, in the third process, the control unit 10 performs the pass/fail determination by comparing the formation state under the irradiation condition in the first process to the target value based on the information indicating the formation state acquired in the second process. Therefore, it is possible to perform the pass/fail determination on a processing state (target value of the formation state) desired by the user.

In addition, in the laser processing device 1 according to the present embodiment, in a case where the result of the pass/fail determination in the third process is the fail, or in a case where an input to receive the result of the pass/fail determination and perform re-determination is received in the third process, the control unit 10 can correct at least one of the plurality of irradiation condition items included in the irradiation condition as the correction item and perform re-determination of performing the first process and the subsequent processes again. That is, the control unit 10 can correct, as the correction item, at least one of the plurality of irradiation condition items included in the irradiation condition and perform re-determination of performing the first process and the subsequent processes again, in response to the result of the pass/fail determination in the third process. In this case, it is possible to automatically correct and re-determine the irradiation condition of the laser light L in response to the result of the pass/fail determination.

In addition, in the laser processing device 1 according to the present embodiment, in a case where the result of the pass/fail determination in the third process is the fail, or in a case where an input to receive the result of the pass/fail determination and perform re-determination is received in the third process, the control unit 10 may perform an eighth process of causing the input reception unit 103 to display information for urging selection of whether or not to correct at least one of the plurality of irradiation condition items included in the irradiation condition as the correction item and perform re-determination of performing the first process and the subsequent processes again, by the control of the input reception unit 103. That is, in response to the result of the pass/fail determination in the third process, the control unit 10 may perform the eighth process of causing the input reception unit 103 to display information for urging selection of whether or not to correct at least one of the plurality of irradiation condition items included in the irradiation condition as the correction item and perform re-determination of performing the first process and the subsequent processes again, by the control of the input reception unit 103. In this case, the input reception unit 103 receives the input of the selection of whether or not to perform re-determination. Then, the control unit 10 performs the re-determination in a case where the input reception unit 103 receives the selection to perform the re-determination. In this case, it is possible to select whether or not to correct and re-determine the irradiation condition of the laser light L in response to the result of the pass/fail determination.

In the laser processing device 1 according to the present embodiment, the control unit 10 performs a ninth process of causing the input reception unit 103 to display the information for urging the selection of the correction item by the control of the input reception unit 103. In addition, the input reception unit 103 receives the input of the selection of the correction item. Then, the control unit 10 corrects the correction item received by the input reception unit 103 and performs re-determination. At this time, the irradiation condition includes, as the irradiation condition items, the pulse width (pulse width D2) of the laser light L, the pulse energy (pulse energy D3) of the laser light L, the pulse pitch (pulse pitch D4) of the laser light L, and the condensing state (condensing state D5) of the laser light L.

In addition, the laser processing device 1 according to the present embodiment includes the spatial light modulator 5 that displays the spherical aberration correction pattern for correcting the spherical aberration of the laser light L, and the condenser lens 33 for condensing the laser light L modulated by the spherical aberration correction pattern in the spatial light modulator 5 on the semiconductor substrate 21. Then, the condensing state includes the offset amount (LBA offset amount D8) of the center of the spherical aberration correction pattern with respect to the center of the incident pupil surface 33a of the condenser lens 33.

Further, in a case where the plurality of modified regions 12a and 12 is formed at positions different from each other in the Z-direction intersecting with the incident surface (back surface 21b) of the laser light L of the semiconductor substrate 21 in the first process, the irradiation condition includes the interval (modified region interval D1) between the modified regions 12a and 12 in the Z-direction as the irradiation condition item.

Thus, it is possible to correct an item selected by the user in the irradiation condition of the laser light L and then perform re-determination.

In addition, in the laser processing device 1 according to the present embodiment, before the third process, the control unit 10 performs the tenth process of causing the input reception unit 103 to display information for urging selection of the determination item that is an item used for the pass/fail determination among the plurality of formation state items included in the formation state by the control of the input reception unit 103. In addition, the input reception unit 103 receives the input of the selection of the determination item. Then, in the third process, the control unit 10 performs the pass/fail determination based on the information indicating the determination item in the formation states acquired in the second process.

Here, the semiconductor substrate 21 includes the back surface 21b which is the incident surface of the laser light L and the front surface 21a on an opposite side of the back surface 21b. The fracture includes the fracture 14d extending from the modified region 12b toward the back surface 21b and the fracture 14a extending from the modified region 12a toward the front surface 21a. The formation state includes, as the formation state items, the length of the fracture 14b in the Z-direction (upper fracture amount F2), the length of the fracture 14a in the Z-direction (lower fracture amount F4), the total amount of the lengths of the fractures 14a to 14d in the Z-direction (total fracture amount F5), the position of the first end 14de which is the tip of the fracture 14d on the back surface 21b side in the Z-direction (upper fracture tip position F1), the position of the second end 14ae which is the tip of the fracture 14a on the front surface 21a side in the Z-direction (lower fracture tip position F3), the shift width between the first end 14de and the second end 14ae when viewed from the Z-direction (upper and lower fracture tip position shift width F6), the presence or absence of a dent in the modified regions 12a and 12b (presence or absence of a modified region dent F7), the meandering amount of the second end 14ae when viewed from the Z-direction (meandering amount F8 of the lower fracture tip), and the presence or absence of the tip of the fracture in the region between the modified regions 12a and 12b arranged in the Z-direction (presence or absence F9 of a black streak between modified regions).

Therefore, it is possible to perform the pass/fail determination of the item selected by the user in the formation states of the modified regions 12a and 12b, or the like.

[First Reference Embodiment of Laser Processing Device]

Figure 39:
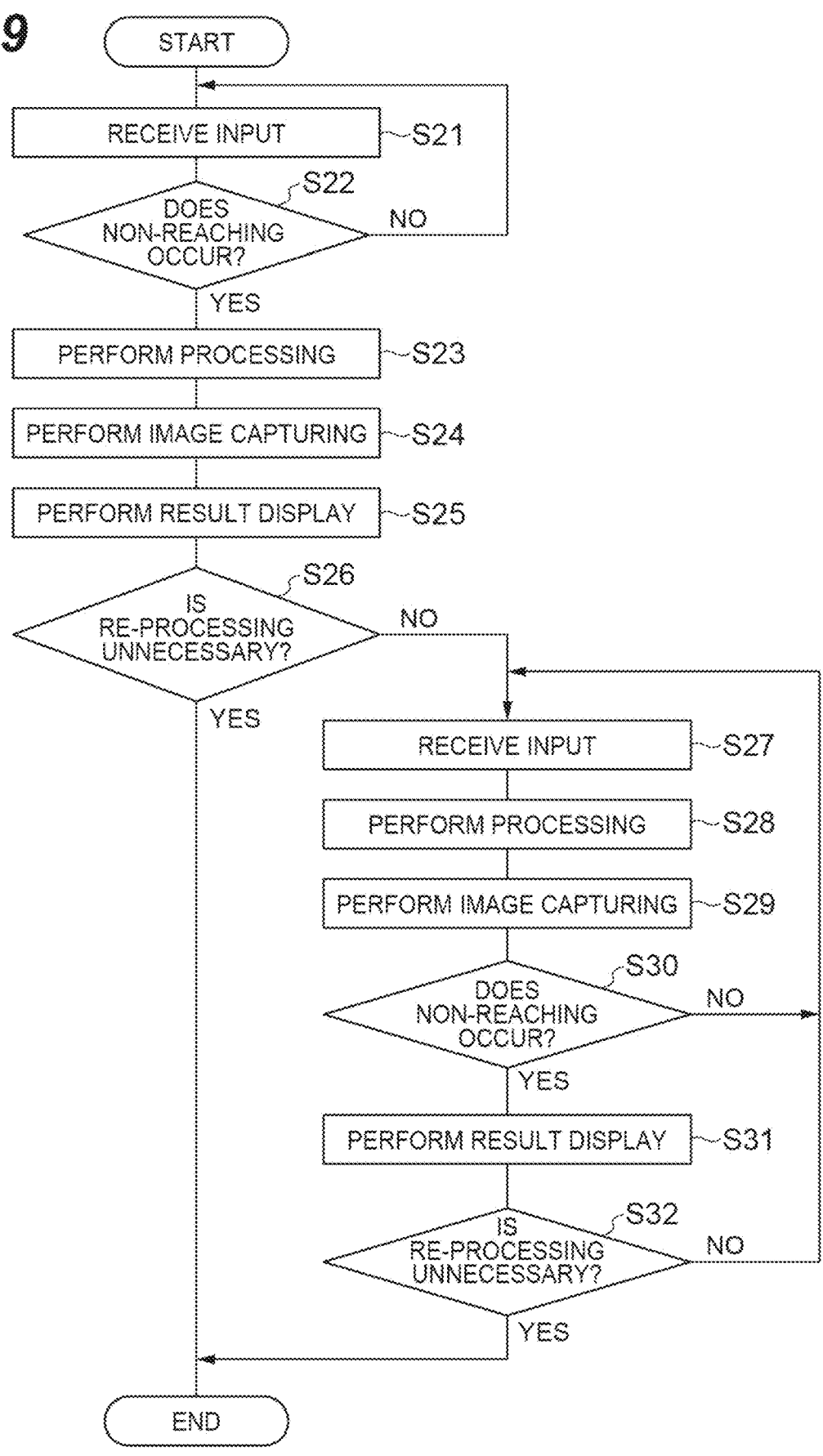
FIG. 39 is a flowchart illustrating main steps of an obtaining method of an irradiation condition.

Next, a first reference embodiment of the laser processing device 1 will be described. Here, an example of an operation of obtaining (parameter management) the irradiation condition of the laser light L will be described. FIG. 39 is a flowchart illustrating main steps of an obtaining method of the irradiation condition. The following method is a first reference embodiment of a laser processing method. Here, first, the control unit 10 in the laser processing device 1 receives an input from a user (Step S21). Step S21 will be described in more detail.

Figure 40:
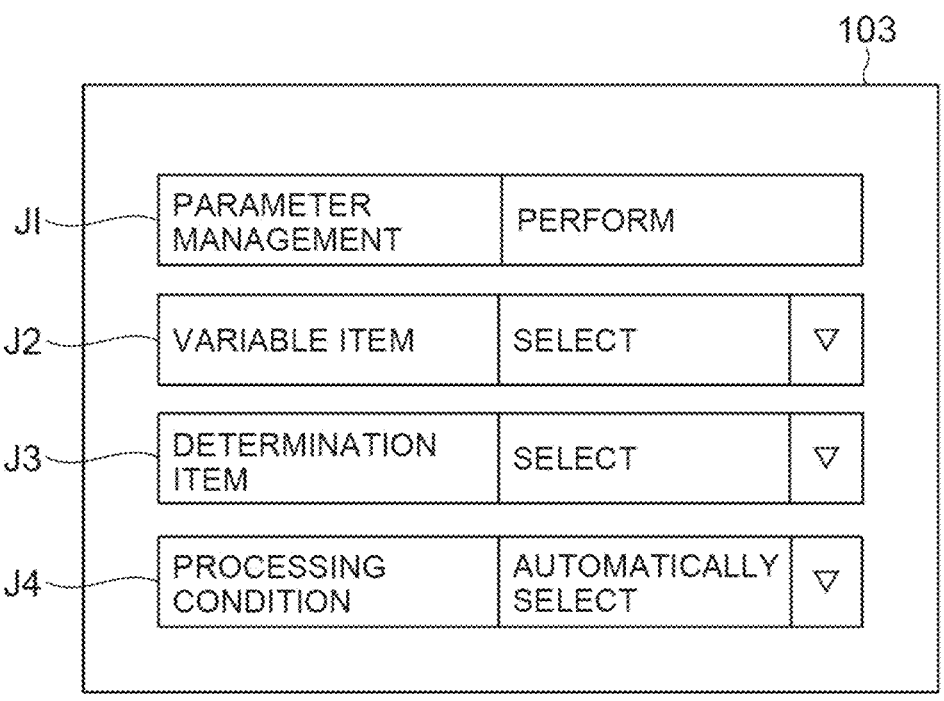
FIG. 40 is a diagram illustrating an example of an input reception unit illustrated in FIG. 1.

As illustrated in FIG. 40, in Step S21, first, the control unit 10 controls the input reception unit 103 to display information J1, information J2, information J3, and information J4 on the input reception unit 103. The information J1 is used for urging the user to select whether or not to perform parameter management. The information J2 is used for urging the user to select a variable item. The information J3 is used for urging the user to select the determination item, and the information J4 indicates that selection of the processing condition is automatic. The parameter management is, for example, a mode for obtaining the irradiation condition for an object for which the irradiation condition (parameter) for obtaining a desired formation state is unknown.

Therefore, in the present embodiment, as will be described later, the semiconductor substrate 21 is irradiated with the laser light L along each of the plurality of lines 15 under irradiation conditions different from each other to form the modified regions 12a and 12b and the like. The variable item indicates the irradiation condition item that varies for each line 15 in the irradiation conditions. The determination item is an item for determining (evaluating) the variable item among the formation state items. Here, the processing conditions are various conditions under which the fracture does not reach the outer surface (ST).

Then, in Step S21, the input reception unit 103 receives the selection of whether or not to perform the parameter management, the variable item, and the determination item by the user. Then, in a case where selection to perform the parameter management, selection of the variable item, and selection of the determination item are made, the control unit 10 automatically selects an example of the processing condition and causes the input reception unit 103 to display information indicating the selected processing condition.

Figure 41:
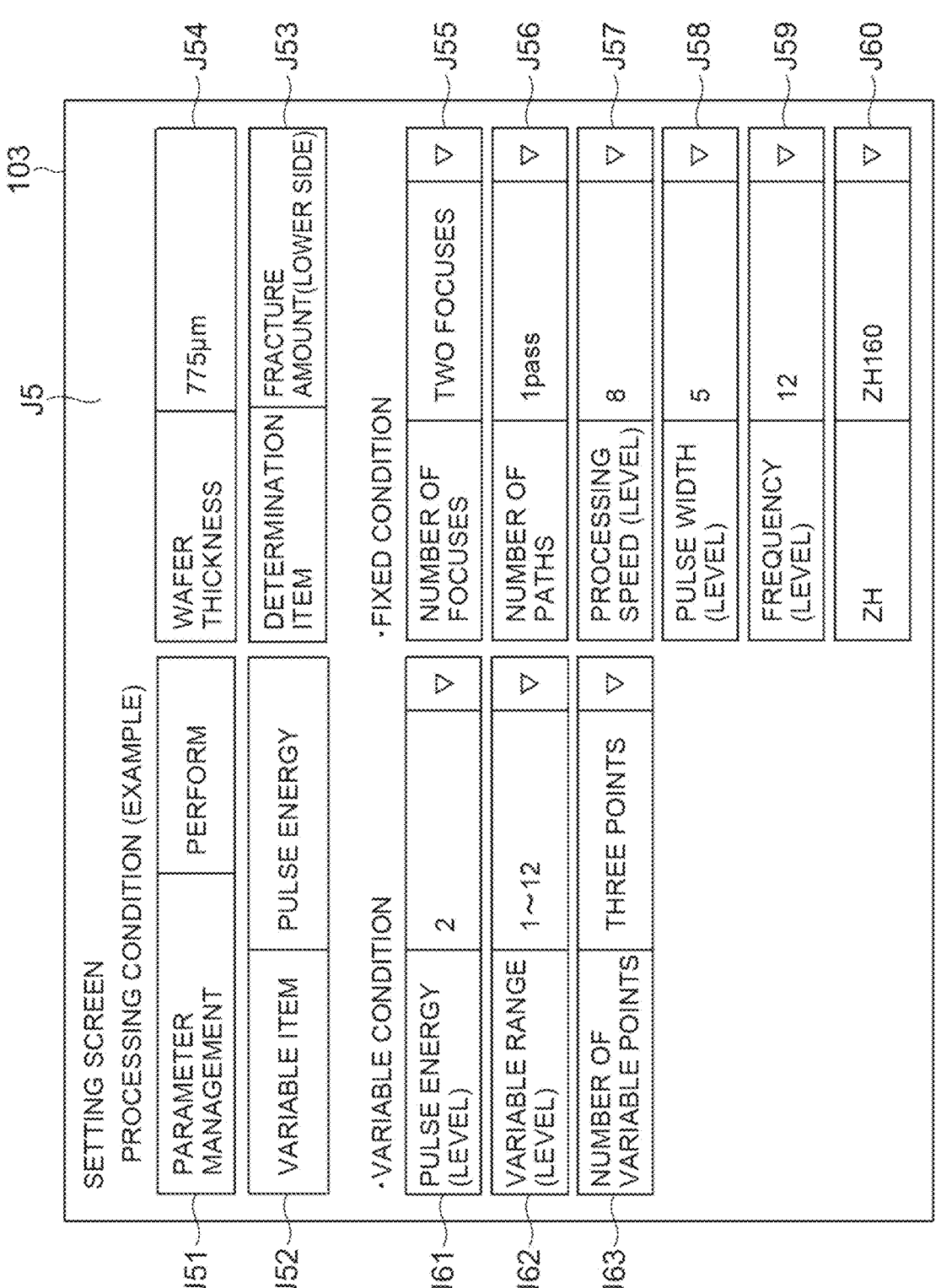
FIG. 41 is a diagram illustrating an input reception unit in a state in which an example of a selected processing condition is displayed.

FIG. 41 is a diagram illustrating the input reception unit in a state in which the example of the selected processing condition is displayed. As illustrated in FIG. 41, the information J5 indicating the processing condition is displayed on the input reception unit 103 and presented to the user. The information J5 indicating the processing condition includes a plurality of items. Among the plurality of items, an item J51 indicating that the parameter management is performed, a variable item J52, and a determination item J53 indicate the previous selection result, and do not receive the selection from the user at the present time (the same applies to a wafer thickness J54).

On the other hand, although the control unit 10 presents an example of the number of focuses J55, the number of paths J56, a processing speed J57, a pulse width J58, a frequency J59, and ZH (Z-height: processing position in the Z-direction) J60, the selection (change) is received from the user. The meanings of the number of focuses J55 to the frequency J59 are similar to the meanings of the number of focuses H41 to the frequency H45 illustrated in FIG. 32.

In this example, the pulse energy D3 is selected as the variable item. Therefore, pulse energy J61 is displayed as a variable condition. Here, an initial value as the pulse energy J61 is displayed, and a range of Lv1 to 12 is displayed as a variable range J62. In addition, three points are displayed as the number of variable points J63. This means that the number of lines 15 with different irradiation conditions is three. These items can also be selected (changed) by the user at the present time.

In the subsequent stroke, a process of determining whether or not the irradiation condition set in Step S21 is a non-reaching condition (ST condition) that is a condition that the fractures 14_a_ and 14_d_ do not actually reach the outer surface is performed (Step S22). Here, similar to Step S2 described above, the control unit 10 can determine whether or not the condition for which the input has been received is the non-reaching condition.

In the subsequent step, in a case where the result of the determination in Step S22 is a result indicating that the irradiation condition set in Step S21 is the non-reaching condition (Step S22: YES), as described above, processing is performed under the information J5 indicating the processing condition (Step S23). That is, here, the control unit 10 performs a process of irradiating the semiconductor substrate 21 with the laser light L along each of the plurality of lines 15 to form the modified regions 12_a_ and 12_b_ and the like in the semiconductor substrate 21 so that the modified regions do not reach the outer surface (the front surface 21_a_ and the back surface 21_b_) of the semiconductor substrate 21 (Step S23).

In particular, in Step S23, the semiconductor substrate 21 is irradiated with the laser light L under irradiation conditions different from each other for each of the plurality of lines 15. As an example, here, as presented in the information J5 indicating the processing conditions, the irradiation with the laser light L is performed while changing the pulse energy D3 at three points (three lines 15) from Lv1 to Lv12. As a result, the modified regions 12_a_ and 12_b_ and the like having different formation states are formed in each of the lines 15. In a case where the result of the determination in Step S22 indicates that the irradiation condition is not the non-reaching condition (Step S22: NO), the process returns to Step S21 to reset the irradiation condition.

Subsequently, by the control of the image capturing unit 4, the control unit 10 performs a process of capturing an image of the semiconductor substrate 21 by the light I1 having transparency to the semiconductor substrate 21 and acquiring information indicating the formation states of the modified regions 12_a_ and 12_b_ and/or the fractures 14_a_ and 14_b_ (Step S24). In particular, in Step S24, information indicating the formation state is acquired for each of the plurality of lines 15. Here, in Step S21, since the lower fracture amount F4 is designated as the determination item J53, at least image capturing C5 and image capturing C6 necessary for acquiring the lower fracture amount F4 are performed (another image capturing may be performed).

Figure 42:
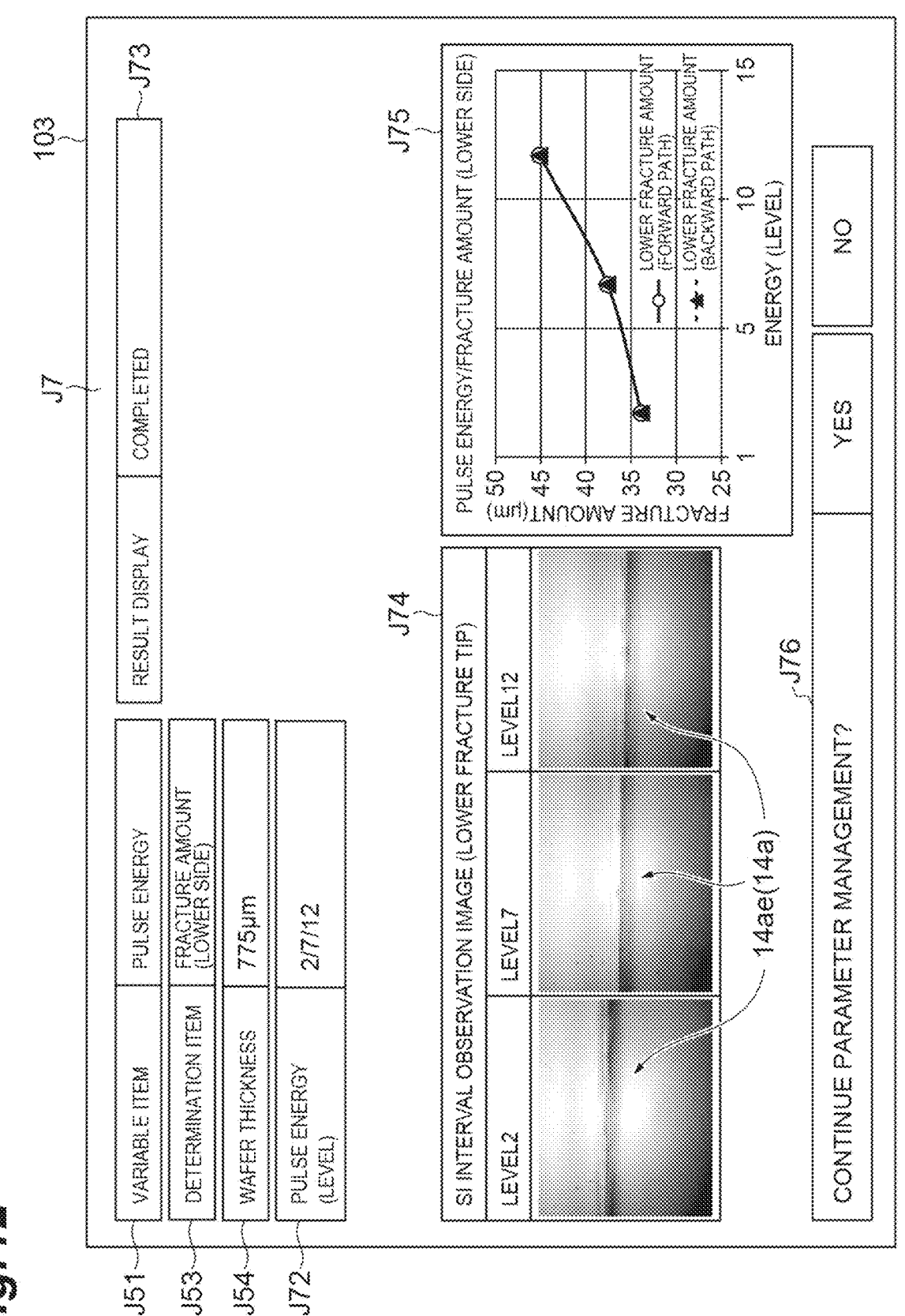
FIG. 42 is a diagram illustrating an input reception unit in a state where information indicating a processing result is displayed.

Then, the control unit 10 controls the input reception unit 103 to display information indicating the processing result on the input reception unit 103 (Step S25). FIG. 42 is a diagram illustrating the input reception unit in a state where the information indicating the processing result is displayed. As illustrated in FIG. 42, in Step S25, the information J7 indicating the processing result is displayed. In the information J7 indicating the processing result, the pulse energy J72, a result display J73, an internal observation image J74, and a graph J75 are displayed in addition to the variable item J52, the determination item J53, and the wafer thickness J54 described above.

The pulse energy J72 is an item indicating a variable value of the pulse energy which is the variable item J52. That is, here, the pulse energy D3 is different at three points illustrated in the drawing. In the internal observation image J74, an image (image acquired by image capturing C5) in a state in which the focus F is at the second end 14_ae_ (lower fracture tip) of the fracture 14_a_ (lower fracture) in each of the three processing outputs (pulse energy D3) is displayed.

The graph J75 illustrates a relationship between the pulse energy D3 and the lower fracture amount F4. That is, in Step S25, the control unit 10 performs a process of causing the input reception unit 103 to display the information indicating the irradiation condition of the laser light L in Step S23 and the information indicating the formation state acquired in Step S24 in association with each other (associated graph J75), by the control of the input reception unit 103.

In addition, the information (formation state item) indicating the formation state displayed in Step S25 is the lower fracture amount F4 of the determination item J53 set in Step S21. As described above, the determination item J53 may be selected. Therefore, in Step S21, by the control of the input reception unit 103, the control unit 10 performs a process of causing the input reception unit 103 to display information urging selection of the formation state item to be displayed on the input reception unit 103 in Step S25 among the plurality of formation state items.

In Step S21, the input reception unit 103 receives selection of the formation state item. Then, in Step S25, the control unit 10 controls the input reception unit 103 to display the information indicating the formation state item (here, the lower fracture amount F4) received by the input reception unit 103 on the input reception unit 103 in association with the information indicating the irradiation condition of the laser light L (here, the pulse energy D3).

Similarly, in Step S21, by the control of the input reception unit 103, the control unit 10 performs a process of causing the input reception unit 103 to display information for urging selection of the variable item that varies for each line 15 and is the irradiation condition item to be displayed on the input reception unit 103 in Step S25 among the plurality of irradiation condition items included in the irradiation condition of the laser light L. Furthermore, the input reception unit 103 receives the input of the selection of the irradiation condition item (variable item), and the control unit 10 performs Step S23 by the control of the laser irradiation unit 3 so that the variable item (here, the pulse energy D3) received by the input reception unit 103 varies for each line 15. In addition, the control unit 10 causes the input reception unit 103 to display information indicating the variable item (here, the pulse energy D3) received by the input reception unit 103 in the irradiation condition in association with the information indicating the formation state (here, the lower fracture amount F4), by the control of the input reception unit 103.

Figure 43:
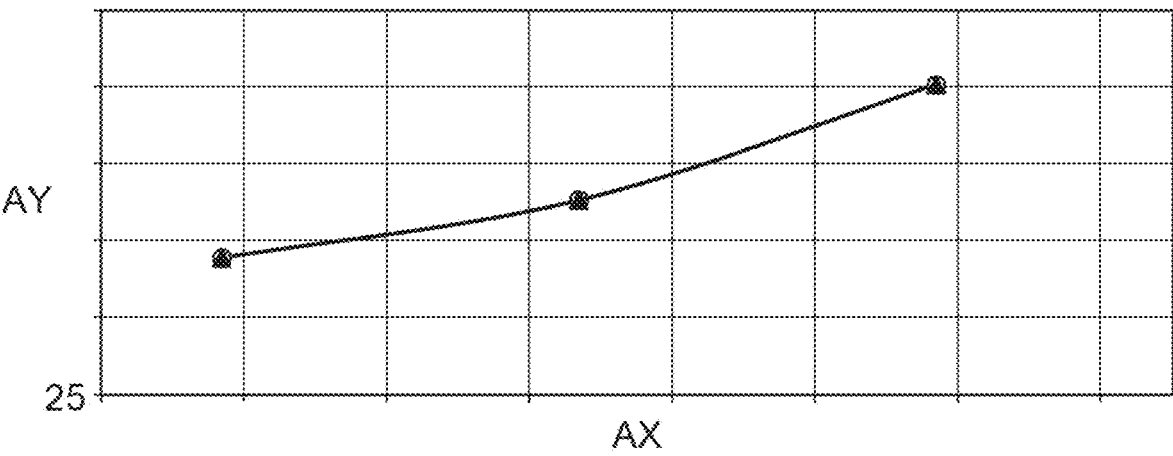
FIG. 43 is a graph showing a relationship between the irradiation condition and the formation state.

In particular, as illustrated in the graph J75, the control unit 10 acquires the information (here, the pulse energy D3) indicating the irradiation condition in Step S23 and the information (here, the lower fracture amount F4) indicating the formation state, in association with each other for each of the plurality of lines 15 by image capturing in Step S24. As a result, in the laser processing device 1, it is possible to acquire the relationship between the irradiation condition and the formation state (manage parameters) for an unknown object, for example. In particular, as illustrated in FIG. 43, by displaying a graph in which the horizontal axis AX is set to the variable item (parameter) and the vertical axis AY set to the formation state with the variable item, it is possible to visually manage the parameter. Therefore, the user can adjust the irradiation condition such that the modified regions 12a and 12b and the like are in a desired formation state.

In the subsequent step, the control unit 10 causes the input reception unit 103 to display information J76 for urging selection of whether or not to continue the parameter management. As illustrated in FIG. 42, the information J76 has already been displayed in Step S25. Therefore, here, the input reception unit 103 receives selection of whether or not to continue the parameter management (Step S26). Continuing parameter management means performing re-processing while changing the variable item and the determination item. In a case where the result of Step S26 is a result indicating that re-processing is unnecessary (Step S26: YES), the processing is ended.

On the other hand, in a case where the result of Step S26 is a result indicating that re-processing is necessary (Step S26: NO), similar to Step S21, the control unit 10 causes the input reception unit 103 to display, by the control of the input reception unit 103, the information J2 for urging the user to select the variable item, the information J3 for urging the user to select the determination item, the information J4 indicating that the selection of the processing condition is automatic, and the information J5 indicating the processing condition, and receives inputs thereof (Step S27). Here, for example, the irradiation condition item different from the variable item selected in Step S21 can be set as the variable item, or the formation state item different from the determination item selected in Step S21 can be set as the determination item.

Then, the control unit 10 performs processing in the similar manner to Step S23 (Step S28) and performs image capturing in the similar manner to Step S24 (Step S29) in response to the input reception in Step S27. In this manner, the control unit 10 acquires information indicating the formation states of the modified regions 12a and 12b and the like.

Subsequently, the control unit 10 performs a process of determining whether or not the fractures 14a and 14d have not reached the outer surfaces based on the information indicating the formation state acquired in the Step S29 (Step S30). Here, in at least one of a case where the second end 14ae of the fracture 14a is not checked in the image acquired in the image capturing C5 and a case where the fracture 14d is checked on the back surface 21b in the image acquired in the image capturing C0, it can be determined that the fractures 14a and 14d have reached the outer surface and non-reaching does not occur.

In a case where the result of the determination in Step S30 is a result indicating that the fractures 14a and 14d have reached the outer surface, that is, in a case where non-reaching does not occur (Step S30: NO), the process proceeds to Step S27. On the other hand, in a case where the result of the determination in Step S30 is a result indicating that the fractures 14a and 14d have not reached the outer surface, that is, in a case where non-reaching occurs (Step S30: YES), the control unit 10 causes the input reception unit 103 to display the information indicating the processing result (Step S31), similar to Step S25, and determines whether re-processing is necessary (Step S32). In a case where the result of Step S32 is a result indicating that re-processing is unnecessary, the processing is ended. In a case where the result is a result indicating that re-processing is necessary, the process proceeds to Step S27.

[Second Reference Embodiment of Laser Processing Device]

Next, a reference embodiment of the laser processing device 1 will be described. Here, similarly to the first reference embodiment, the irradiation condition of the laser light L is obtained. Here, the variable item is set to the LBA offset amount D8 included in the condensing state D5 among the irradiation condition items. First, the LBA offset amount will be described. As described above, the laser irradiation unit 3 includes the spatial light modulator 5 and the condenser lens 33 that condenses the laser light L modulated by the spatial light modulator 5. Then, the modulation pattern displayed on the reflection surface 5a of the spatial light modulator 5 is transferred to the incident pupil surface 33a of the condenser lens 33.

The formation states of the modified regions 12a and 12b and the like change by irradiating the center of the incident pupil surface 33a of the condenser lens 33 with the laser light L in a state where the center of the modulation pattern is offset. In particular, by offsetting at least the center of the spherical aberration correction pattern among the modulation patterns with respect to the center of the incident pupil surface 33a of the condenser lens 33, it is possible to suitably control the formation state. The LBA offset amount D8 is the offset amount of the center of the spherical aberration correction pattern with respect to the center of the incident pupil surface 33a of the condenser lens 33 as described above. In the LBA offset amount D8, the offset amount in the X-direction is referred to as an X-offset amount, and the offset amount in the Y-direction is referred to as a Y-offset amount. The X-direction is a traveling direction of the focusing point of the laser light and is a direction parallel to the laser processing progress direction. The Y-direction is a direction perpendicular to the traveling direction of the focusing point of the laser light and is a direction perpendicular to the laser processing progress direction.

Figure 44:
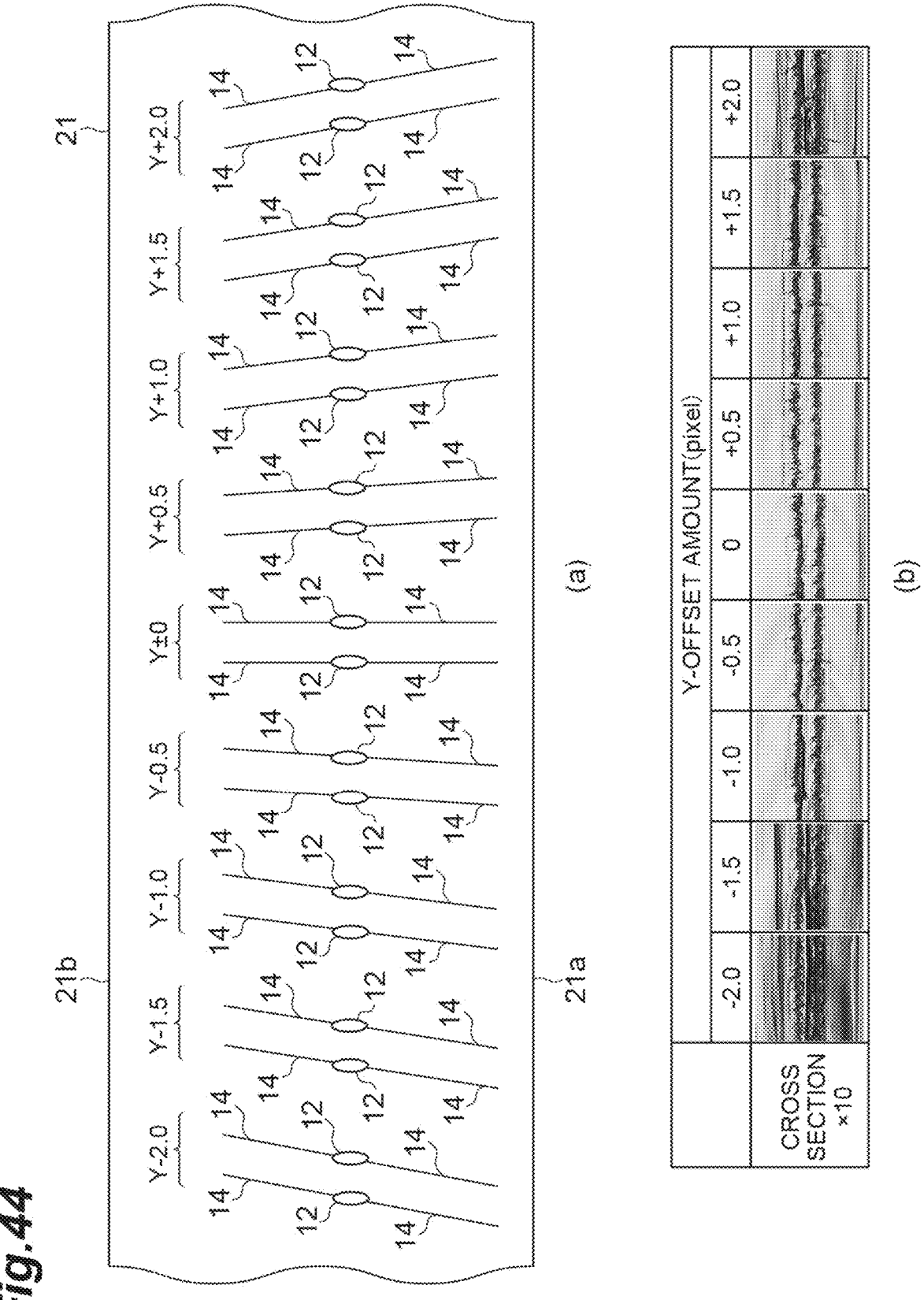
FIG. 44 is a diagram illustrating a relationship between a Y-offset amount and the formation state.

FIG. 44 is a diagram illustrating a relationship between the Y-offset amount and the formation state. (a) of FIG. 44 (a) illustrates a modified region 12 and a fracture 14 extending from the modified region 12 in a case where the Y-offset amount is changed from −2.0 to +2.0 in increments of 0.5. A pair of modified regions 12 (and the corresponding fractures 14) is shown for each Y-offset amount. The left side shows the modified region at the time of processing in the forward path (X positive direction), and the right side shows the modified region at the time of processing in the backward path (X negative direction). The Y-offset amount corresponds to the pixel of the spatial light modulator 5. (b)

of FIG. 44 illustrates a cut surface after processing with each Y-offset amount. In the example in FIG. 44, the X-offset amount is constant.

As illustrated in FIG. 44, if the Y-offset amount is changed when the modified region 12 and the fracture 14 are formed in the semiconductor substrate 21 by irradiation with the laser light L, the formation states of the modified region 12 and the fracture 14 also change. Therefore, by acquiring the formation states of the modified region 12 and the fracture 14, it is possible to obtain the irradiation condition of the laser light L, under which the modified region 12 and the fracture 14 are in a desired formation state. The LBA offset amount D8 is correlated with all of the upper fracture tip position F1 to the presence or absence F9 of a black streak between the upper fracture tip position F1 and the modified region in the formation state. An obtaining method of the LBA offset amount D8 in the irradiation condition of the laser light L will be described below.

Figure 45:
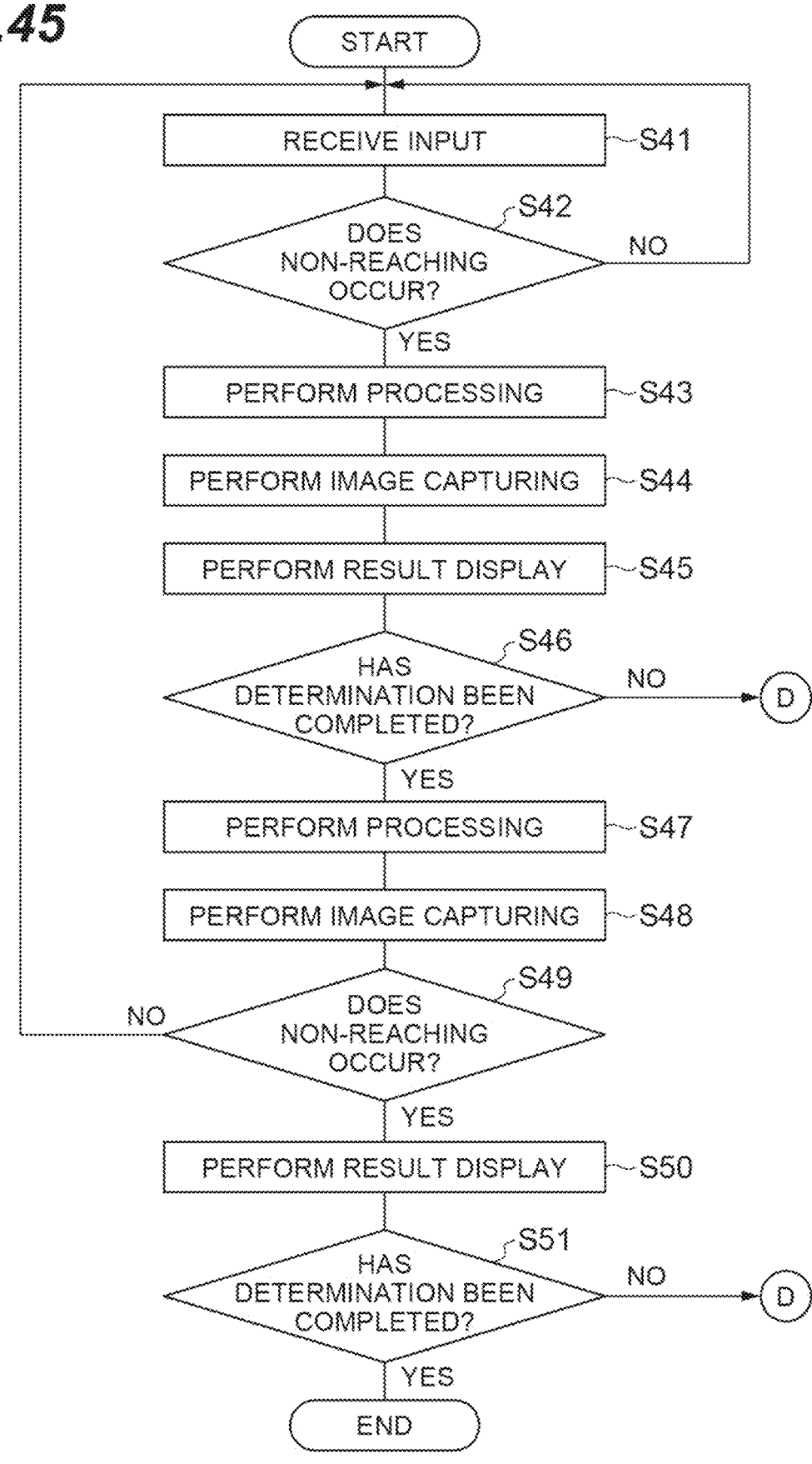
FIG. 45 is a flowchart illustrating main steps of an obtaining method of an LBA offset amount.
Figure 46:
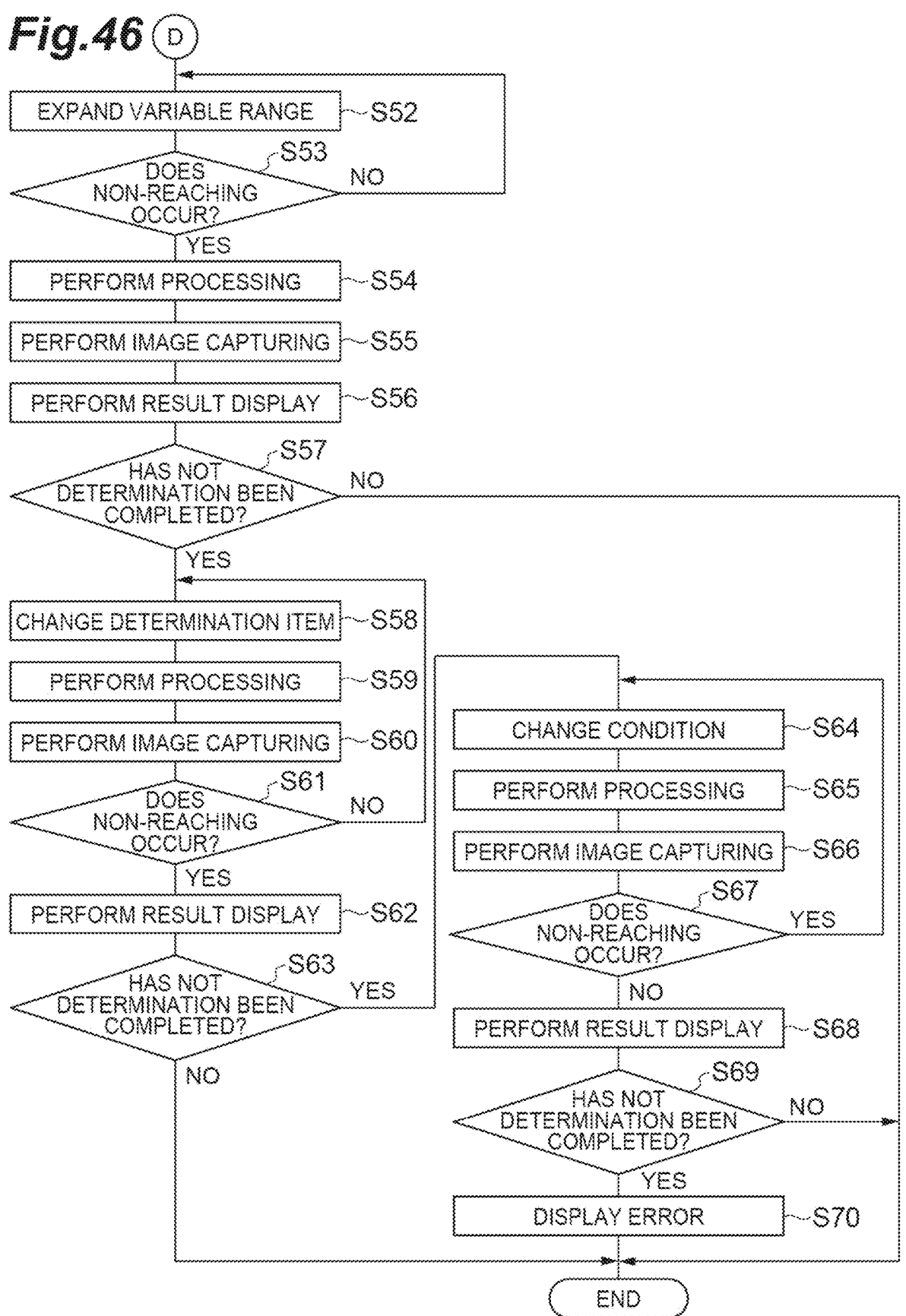
FIG. 46 is a flowchart illustrating the main steps of the obtaining method of the LBA offset amount.

FIGS. 45 and 46 are flowcharts illustrating the main steps of the obtaining method of the LBA offset amount. The following method is the second reference embodiment of a laser processing method. As illustrated in FIG. 45, here, first, the control unit 10 receives an input from the user (Step S41). Step S41 will be described in more detail. In Step S41, first, by the control of the input reception unit 103, information (not illustrated) for urging the user to select whether or not to perform LBA offset inspection is displayed on the input reception unit 103. The LBA offset inspection is an inspection for obtaining an LBA offset amount.

Figure 47:
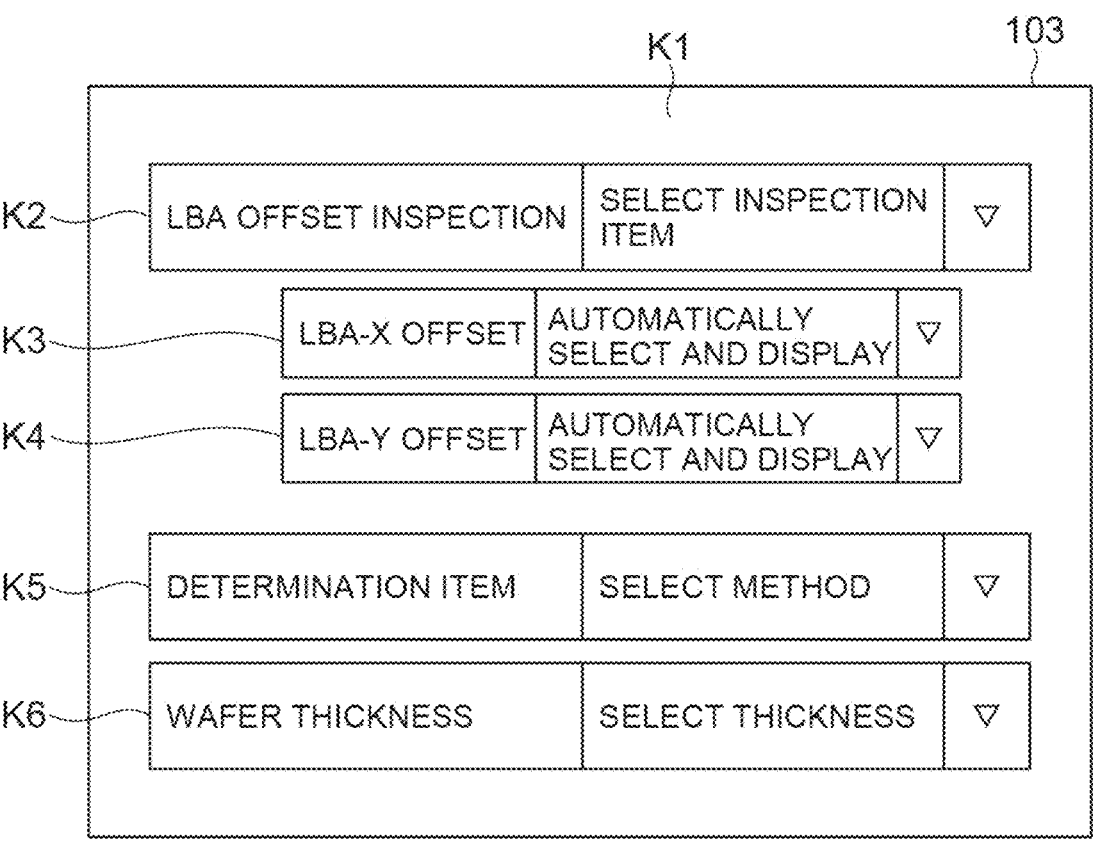
FIG. 47 is a diagram illustrating an input reception unit in a state where information for urging selection of an inspection condition is displayed.

Then, in Step S41, the input reception unit 103 receives selection of whether or not to perform the LBA offset inspection by the user. Then, in Step S41, in a case where the input reception unit 103 receives the selection to perform the LBA offset inspection, the control unit 10 causes the input reception unit 103 to display information K1 for urging the selection of an inspection condition as illustrated in FIG. 47. The information K1 includes a plurality of items. Among the plurality of items, LBA offset inspection K2 is an item for urging the user to select whether to perform inspection (obtaining) of the X-offset amount, inspection (obtaining) of the Y-offset amount, or inspection (obtaining) of both the X-offset amount and the Y-offset amount.

An LBA-X offset K3 indicates a variable range (for example, ±6) of the X-offset amount, and may be selected by the user (may be automatically selected). An LBA-Y offset K4 indicates a variable range (for example, ±2) of the Y-offset amount, and may be selected by the user (may be automatically selected). A determination item K5 indicates a formation state item used for obtaining the LBA offset amount, and may be selected by the user (may be automatically selected). A wafer thickness K6 may also be selected by the user (may be automatically selected).

Subsequently, in Step S41, the input reception unit 103 receives at least an input of the LBA offset inspection K2. Then, in a case where the input reception unit 103 receives the input of the LBA offset inspection K2 (the LBA-X offset K3, the LBA-Y offset K4, the determination item K5, and the wafer thickness K6 are automatically selected when there is no input from the user), the control unit 10 controls the input reception unit 103 to display a setting screen including the selection result on the input reception unit 103.

FIG. 48 is a diagram illustrating the input reception unit in a state where the setting screen is displayed. As illustrated in FIG. 48, a setting screen K7 includes a plurality of items. Among the plurality of items, LBA offset inspection K71, a determination item K72, an X-offset variable range K73, a Y-offset variable range K74, and a wafer thickness K75 indicate previous selection results, and do not receive selection from the user at the present time. In the LBA offset inspection K71, it is indicated that it is selected to perform inspection (obtaining) of both the X-offset amount and the Y-offset amount in the LBA offset inspection K71 in FIG. 47.

On the other hand, although the control unit 10 presents an example of the number of focuses K81, the number of paths K82, a processing speed K83, a pulse width K84, a frequency K85, ZH (Z-height: processing position in the Z-direction) K86, and a processing output K87, the selection (change) is received from the user at the present time. The meanings of the number of focuses K81 to the frequency K85 are similar to the meanings of the number of focuses H41 to the frequency H45 illustrated in FIG. 34.

In the subsequent step, the control unit 10 performs a process of determining whether or not the processing condition (irradiation condition) set in Step S41 is a non-reaching condition (ST condition) being a condition that the fractures 14a and 14d actually do not reach the outer surface (front surface 21a and back surface 21b) (Step S42). Here, similar to Step S2 described above, the control unit 10 can determine whether or not the condition for which the input has been received is the non-reaching condition. In a case where the result of the determination in Step S42 is a result indicating that the processing condition is not the non-reaching condition (Step S42: NO), the process proceeds to Step S41.

On the other hand, in a case where the result of the determination in Step S42 is a result indicating that the processing condition is the non-reaching condition (Step S42: YES), processing is performed based on the selected content and the processing condition displayed on the setting screen K7 (Step S43). That is, here, the control unit 10 performs a process of irradiating the semiconductor substrate 21 with the laser light L along each of the plurality of lines 15 to form the modified regions 12a and 12b and the like in the semiconductor substrate 21 so that the modified regions do not reach the outer surface (the front surface 21a and the back surface 21b) of the semiconductor substrate 21.

In particular, in Step S43, the semiconductor substrate 21 is irradiated with the laser light L with the LBA offset amount D8 (irradiation condition, condensing state D5) different for each of the plurality of lines 15. As an example, here, the irradiation with the laser light L is performed while making the X-offset amount be constant and changing the Y-offset amount from −2 to +2 in increments of 0.5 as indicated in the Y-offset variable range K74. As a result, the modified regions 12a and 12b and the like having different formation states are formed in each of the lines 15.

Subsequently, by the control of the image capturing unit 4, the control unit 10 performs a process of capturing an image of the semiconductor substrate 21 by the light I1 having transparency to the semiconductor substrate 21 and acquiring information indicating the formation states of the modified regions 12a and 12b and/or the fractures 14a and 14b (Step S44). In particular, in Step S44, information indicating the formation state is acquired for each of the plurality of lines 15. Here, in Step S41, since the lower fracture amount F4 is designated as the determination item K5 (determination item K72), at least image capturing C5 and image capturing C6 necessary for acquiring the lower fracture amount F4 are performed (another image capturing may be performed).

Figure 49:
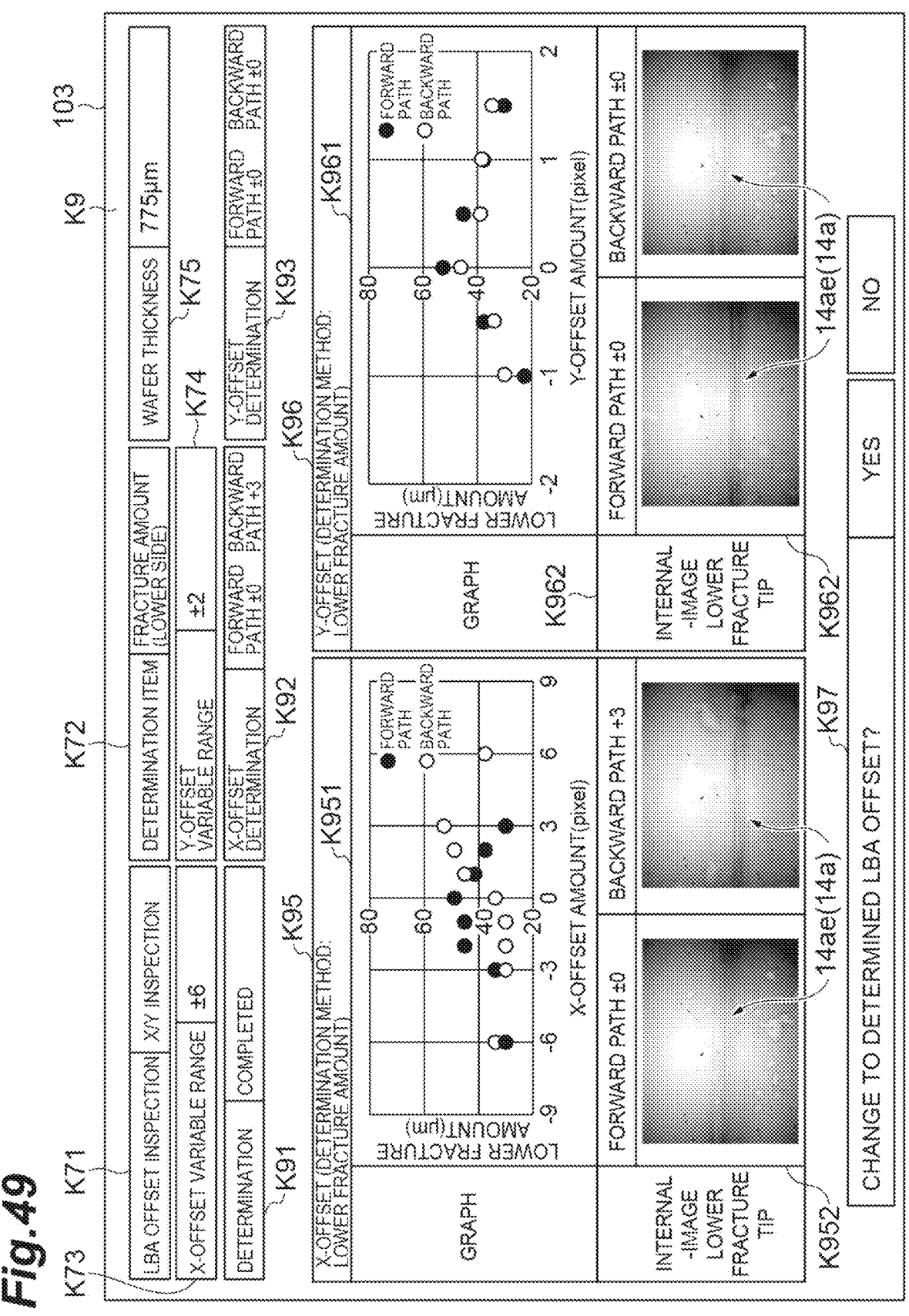
FIG. 49 is a diagram illustrating the input reception unit in a state where information indicating the processing result is displayed.

Then, the control unit 10 controls the input reception unit 103 to display information indicating the processing result on the input reception unit 103 (Step S45). FIG. 49 is a diagram illustrating the input reception unit in a state where the information indicating the processing result is displayed. As illustrated in FIG. 49, in Step S45, the information K9 indicating the processing result is displayed. In the information K9 indicating the processing result, a determination K91, an X-offset determination K92, a Y-offset determination K93, an X-offset K95, and a Y-offset K96 are shown in addition to the LBA offset inspection K71, the determination item K72, the X-offset variable range K73, the Y-offset variable range K74, and the wafer thickness K75 described above.

The determination K91 indicates whether or not the determination of the LBA offset amount to be in a desired formation state (that is, obtaining the LBA offset amount) has been completed. Here, an LBA offset amount in which the lower fracture amount F4 shows a peak value is exemplified as an example of the LBA offset amount in a desired formation state, but the LBA offset amount may not have a peak value and can be set by the user. Here, in the determination K91, it is indicated that the determination has been completed, that is, the LBA offset amount in which the lower fracture amount F4 indicates the peak value is obtained.

In addition, in the X-offset determination K92, a value of the X-offset amount by which a desired formation state is obtained (the lower fracture amount F4 shows a peak value) is shown. In the Y-offset determination K93, a value of the Y-offset amount by which the desired formation state is obtained (the lower fracture amount F4 shows a peak value) is indicated. That is, in a case where the peak value of the formation state is obtained, the control unit 10 controls the input reception unit 103 to display the irradiation condition (here, the LBA offset amount D8) corresponding to the peak value on the input reception unit 103. Also in the first reference embodiment, in a case where the peak value is obtained, the control unit 10 can cause the input reception unit 103 to display the irradiation condition corresponding to the peak value. Even in a case where the peak value of the formation state is obtained, the control unit 10 may cause the input reception unit 103 to display the irradiation condition corresponding to a value shifted from the peak value. This is for providing a margin in the irradiation condition by which the desirable formation state is obtained.

The X-offset K95 includes a graph K951 and an internal-image lower fracture tip K952, and the Y-offset K96 includes a graph K961 and an internal-image lower fracture tip K962. In the graph K951, the X-offset amount and the lower fracture amount F4 are displayed in association with each other. In the graph K961, the Y-offset amount and the lower fracture amount F4 are displayed in association with each other. In the information K9 indicating the processing result, for convenience, information regarding the X-offset is also displayed in addition to the information regarding the Y offset. At the present time, since only processing with making the Y-offset amount be variable is performed, the information regarding the X-offset is not displayed.

As shown in the graph K961, the lower fracture amount F4 has a peak value when the Y-offset amount is ±0. Therefore, in the Y-offset determination K93, ±0 is displayed as the Y-offset amount giving the peak value of the lower fracture amount F4. In the determination K91, a display indicating that the determination (obtaining) of the Y-offset amount giving the peak value of the lower fracture amount F4 has been completed is made.

As described above, in the graph K961, a relationship between the Y-offset amount of the LBA offset amount D8 and the lower fracture amount F4 is shown. That is, in Step S45, the control unit 10 controls the input reception unit 103 to display the information indicating the irradiation condition of the laser light L in Step S43 and the information indicating the formation state acquired in Step S44 in association with each other (associated graph K961), on the input reception unit 103.

In addition, the information (formation state item) indicating the formation state displayed in Step S45 is the lower fracture amount F4 of the determination item K5 (determination item K72) set in Step S41. As described above, the determination item K5 may be selected. Therefore, in Step S41, by the control of the input reception unit 103, the control unit 10 performs a process of causing the input reception unit 103 to display information urging selection of the formation state item to be displayed on the input reception unit 103 in Step S45 among the plurality of formation state items.

In Step S41, the input reception unit 103 receives selection of the formation state item. Then, in Step S45, the control unit 10 controls the input reception unit 103 to display the information indicating the formation state item (here, the lower fracture amount F4) received by the input reception unit 103 on the input reception unit 103 in association with the information indicating the irradiation condition of the laser light L (here, the LBA offset amount D8).

In the subsequent step, the control unit 10 determines whether or not the determination (obtaining) of the LBA offset amount D8 (here, the Y-offset amount) has been completed, that is, whether or not the LBA offset amount in which the lower fracture amount F4 shows the peak value is obtained (Step S46). In a case where the result of the determination in Step S46 is a result indicating that the determination of the LBA offset amount D8 has been completed (Step S46: YES), processing is performed based on the selected content and the processing condition displayed on the setting screen K7 (Step S47, first step). That is, here, the control unit 10 performs a process of irradiating the semiconductor substrate 21 with the laser light L along each of the plurality of lines 15 to form the modified regions 12*a* and 12*b* and the like in the semiconductor substrate 21 so that the modified regions do not reach the outer surface (the front surface 21*a* and the back surface 21*b*) of the semiconductor substrate 21.

In particular, in Step S47, the semiconductor substrate 21 is irradiated with the laser light L by the LBA offset amount D8 (irradiation condition, condensing state) different for each of the plurality of lines 15. Here, the irradiation with the laser light L is performed while making the Y-offset amount be constant and changing the X-offset amount from −6 to +6 as indicated in the X-offset variable range K73. As a result, the modified regions 12*a* and 12*b* and the like having different formation states are formed in each of the lines 15.

Subsequently, by the control of the image capturing unit 4, the control unit 10 performs a process of capturing an image of the semiconductor substrate 21 by the light I1 having transparency to the semiconductor substrate 21 and acquiring information indicating the formation states of the modified regions 12*a* and 12*b* and/or the fractures 14*a* and 14*b* (Step S48). In particular, in Step S48, information indicating the formation state is acquired for each of the plurality of lines 15. Here, in Step S41, since the lower fracture amount F4 is designated as the determination item K5 (determination item K72), at least image capturing C5 and image capturing C6 necessary for acquiring the lower fracture amount F4 are performed (another image capturing may be performed).

Subsequently, the control unit 10 performs a process of determining whether or not the fractures 14*a* and 14*d* have not reached the outer surfaces based on the information indicating the formation state acquired in the Step S48 (Step S49). Here, in at least one of a case where the second end 14*ae* of the fracture 14*a* is not checked in the image acquired in the image capturing C5 and a case where the fracture 14*d* is checked on the back surface 21*b* in the image acquired in the image capturing C0, it can be determined that the fractures 14*a* and 14*b* have reached the outer surface and non-reaching does not occur (ST). In a case where the result of the determination in Step S49 is a result indicating that the fractures 14*a* and 14*d* have reached the outer surface, that is, in a case where non-reaching does not occur (Step S49: NO), the process proceeds to Step S41.

On the other hand, in a case where the result of the determination in Step S49 is a result indicating that the fractures 14*a* and 14*d* have not reached the outer surface, that is, in a case where non-reaching occurs (Step S49: YES), the control unit 10 controls the input reception unit 103 to display the information indicating the processing result on the input reception unit 103 (Step S50). The information displayed here is the information K9 indicating the processing result illustrated in FIG. 49. At the time of Step S45, only the processing with making the Y-offset amount be variable is performed. Thus, the information regarding the X-offset is not displayed. However, here, since the processing with making the X-offset amount be variable has also been completed, the information regarding the X-offset is also displayed (all the items in FIG. 49 are displayed). As shown in the graph K951, the lower fracture amount F4 has a peak value when the X-offset amount is ±0 in the forward processing. In addition, the lower fracture amount F4 becomes the maximum when the X-offset amount is +3 in the processing of a bag. Thus, in the X-offset determination K92, ±0 and +3 (X-offset amount giving the maximum value) are displayed as the X-offset amount giving the peak value of the lower fracture amount F4. In the determination K91, a display indicating that the determination (obtaining) of the X-offset amount giving the peak value of the lower fracture amount F4 has been completed is made.

The graph K951 shows a relationship between the X-offset amount of the LBA offset amount D8 and the lower fracture amount F4. That is, in Step S50, the control unit 10 performs a process of causing the input reception unit 103 to display the information indicating the irradiation condition of the laser light L in Step S47 and the information indicating the formation state acquired in Step S48 in association with each other (associated graph K951), by the control of the input reception unit 103.

In addition, the information (formation state item) indicating the formation state displayed in Step S50 is the lower fracture amount F4 of the determination item K5 (determination item K72) set in Step S41. As described above, the determination item K5 may be selected. Therefore, in Step S41, by the control of the input reception unit 103, the control unit 10 performs a process of causing the input reception unit 103 to display information urging selection of the formation state item to be displayed on the input reception unit 103 in Step S50 among the plurality of formation state items.

In Step S41, the input reception unit 103 receives selection of the formation state item. Then, in Step S50, the control unit 10 controls the input reception unit 103 to display the information indicating the formation state item (here, the lower fracture amount F4) received by the input reception unit 103 on the input reception unit 103 in association with the information indicating the irradiation condition of the laser light L (here, the LBA offset amount D8).

In the subsequent step, the control unit 10 determines whether or not the determination (obtaining) of the LBA offset amount D8 (here, the X-offset amount) has been completed (Step S51). In a case where the result of the determination in Step S51 is a result indicating that the determination of the LBA offset amount D8 has been completed (Step S51: YES), the processing is ended. In the information K9 indicating the processing result, information K97 for urging the selection of whether or not to change the value of the LBA offset amount D8 to the determined value (the value displayed in the X-offset determination K92 and the Y-offset determination K93) is displayed. As a result, the user can select whether or not to change the value of the LBA offset amount D8 to the determined value at a timing at which the information K9 is displayed.

On the other hand, in a case where the result of the determination in Step S46 is a result indicating that the determination of the Y-offset amount has not been completed (Step S46: NO) and in a case where the result of the determination in Step S51 is a result indicating that the determination of the X-offset amount has not been completed (Step S51: NO), it is determined that it is not possible to obtain the desired formation state (here, the peak value) in the variable range of the LBA offset amount D8 selected previously and the determination item, and the process proceeds to Step S52 illustrated in FIG. 46.

That is, in the subsequent step, the control unit 10 expands the variable range of the LBA offset amount D8 (Step S52). In a case where the process proceeds from Step S46 to Step S52, the variable range of the Y-offset amount in the LBA offset amount D8 is expanded from the Y-offset variable range K74 (±2). In a case where the process proceeds from Step S51 to Step S52, the variable range of the X-offset amount in the LBA offset amount D8 is expanded from the X-offset variable range K73 (±6). In the following steps, the determination of the Y-offset amount will be described, but the same applies to the case of the determination of the X-offset amount.

In the subsequent step, a process of determining whether or not the processing condition (irradiation condition) corresponding to the variable range expanded in Step S52 is the non-reaching condition being a condition that the fractures 14*a* and 14*d* do not reach the outer surface is performed (Step S53). Here, similar to Step S2 described above, the control unit 10 can determine whether or not the condition corresponding to the enlarged variable range is the non-reaching condition. In a case where the result of the determination in Step S53 is a result indicating that the processing condition is not the non-reaching condition (Step S53: NO), the process proceeds to Step S52 to adjust the degree of expansion of the variable range.

On the other hand, in a case where the result of the determination in Step S53 is a result indicating that the processing condition is the non-reaching condition (Step S53: YES), processing is performed in an extended variable range (Step S54). That is, here, the control unit 10 performs a process of irradiating the semiconductor substrate 21 with the laser light L along each of the plurality of lines 15 to form the modified regions 12*a* and 12*b* and the like in the semiconductor substrate 21 so that the modified regions do not reach the outer surface (the front surface 21*a* and the back surface 21*b*) of the semiconductor substrate 21.

In particular, in Step S54, the semiconductor substrate 21 is irradiated with the laser light L with the Y-offset amount (irradiation condition, condensing state) different for each of the plurality of lines 15. Here, the irradiation with the laser light L is performed while making the X-offset amount be constant and changing the Y-offset amount in an expanded variable range. As a result, the modified regions 12a and 12 and the like having different formation states are formed in each of the lines 15.

Subsequently, by the control of the image capturing unit 4, the control unit 10 performs a process of capturing an image of the semiconductor substrate 21 by the light I1 having transparency to the semiconductor substrate 21 and acquiring information indicating the formation states of the modified regions 12a and 12b and/or the fractures 14a and 14b (Step S55). Step S55 is similar to Step S44 illustrated in FIG. 45. Then, the control unit 10 controls the input reception unit 103 to display information indicating the processing result on the input reception unit 103 (Step S56). Step S56 is similar to Step S45 illustrated in FIG. 45.

Then, the control unit 10 determines whether or not the determination (obtaining) of the LBA offset amount D8 (here, the Y-offset amount) has been completed, that is, whether or not the LBA offset amount D8 in which the lower fracture amount F4 shows the peak value is not obtained in the expanded variable range (Step S57). In a case where the result of the determination in Step S57 is a result indicating that the determination of the LBA offset amount D8 has been completed (Step S57: NO), the processing is ended.

On the other hand, in a case where the result of the determination in Step S57 is a result indicating that the determination of the LBA offset amount D8 has not been completed (Step S57: YES), the control unit 10 changes the determination item (Step S58). More specifically, in this case, the item used to determine the LBA offset amount D8 among the formation state items is set to an item other than the determination item K5 (here, the lower fracture amount F4) designated by the information K1 illustrated in FIG. 47.

As illustrated in FIG. 50, in both a case where the determination item is the lower fracture tip position F3 ((a) of FIG. 50) and a case where the determination item is the upper fracture tip position F1 ((b) of FIG. 50), a peak value is obtained in accordance with a change in the Y-offset amount, and the Y-offset amount giving the peak value coincides with a Y-offset amount Oc in the conventional method ((c) of FIG. 50) by cross-section observation. In addition, as illustrated in FIG. 51, even in a case where the determination item is the upper and lower fracture tip position shift width F6, a peak value is obtained from the approximate expression in accordance with the change in the Y-offset amount, and the Y-offset amount giving the peak value coincides with the Y-offset amount Oc in the conventional method ((c) in FIG. 51) by cross-section observation.

Figure 52:
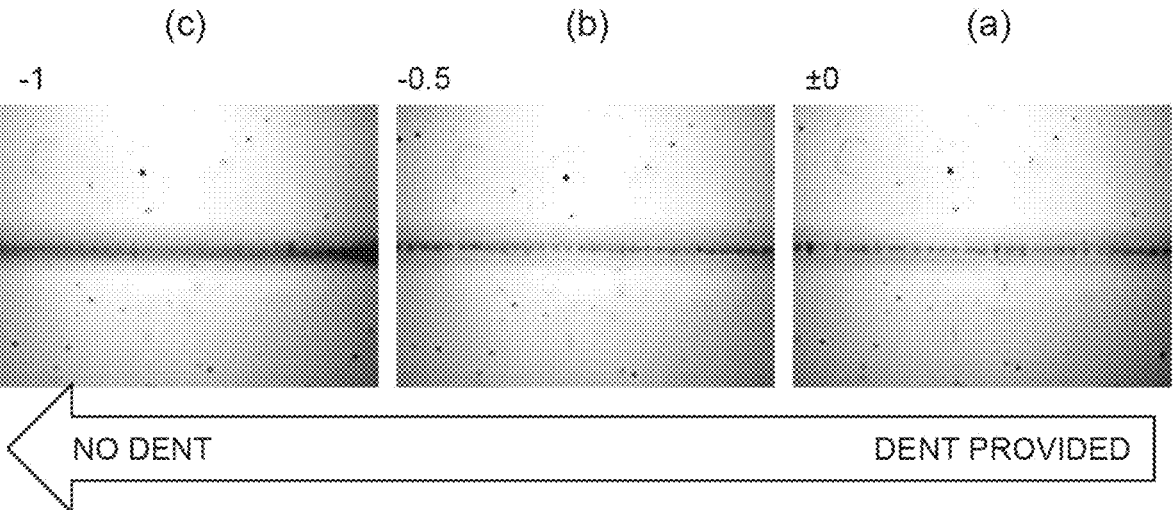
FIG. 52 is a diagram illustrating a relationship between the Y-offset amount and a determination item.
Figure 53:
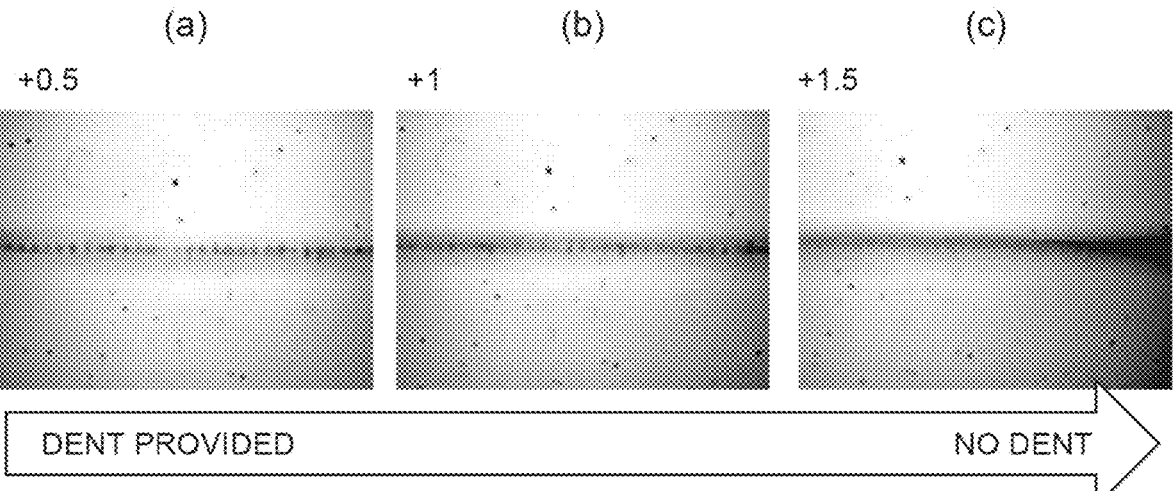
FIG. 53 is a diagram illustrating a relationship between the Y-offset amount and a determination item.

Furthermore, as illustrated in FIGS. 52 and 53, even in a case where the determination item is the presence or absence F7 of a modified region dent, a change in the appearance of the dent was observed in accordance with the change in the Y-offset amount, and the most clear dent was checked in the vicinity of the Y-offset amount±0 (the Y-offset amount was similar to the other determination item and that of the conventional method). As described above, in Step S58, various determination items can be used instead of the lower fracture amount F4 described above.

Figure 54:
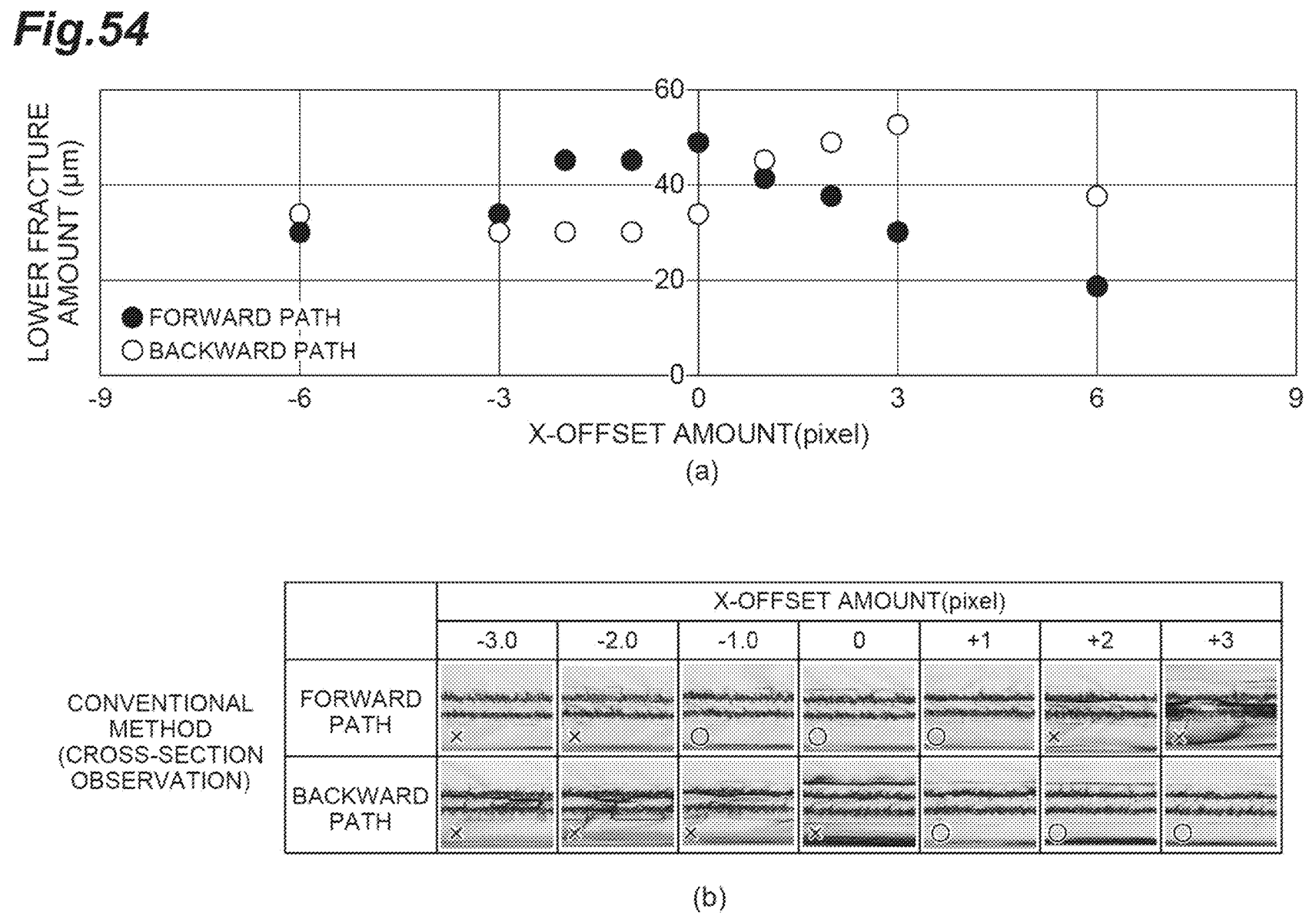
Figure 55:
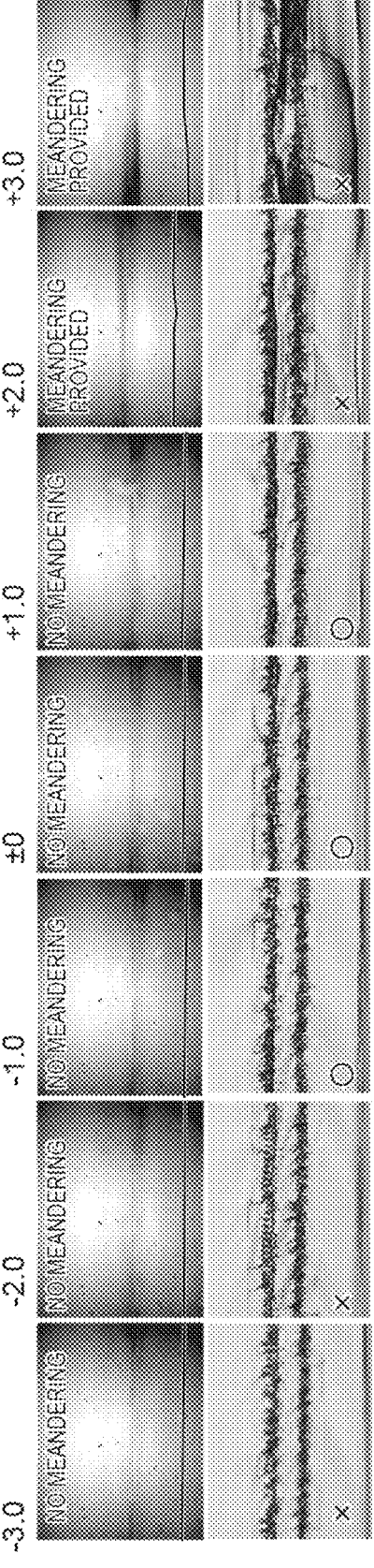
FIG. 55 is a diagram illustrating a relationship between the X-offset amount and a determination item.
Figure 56:
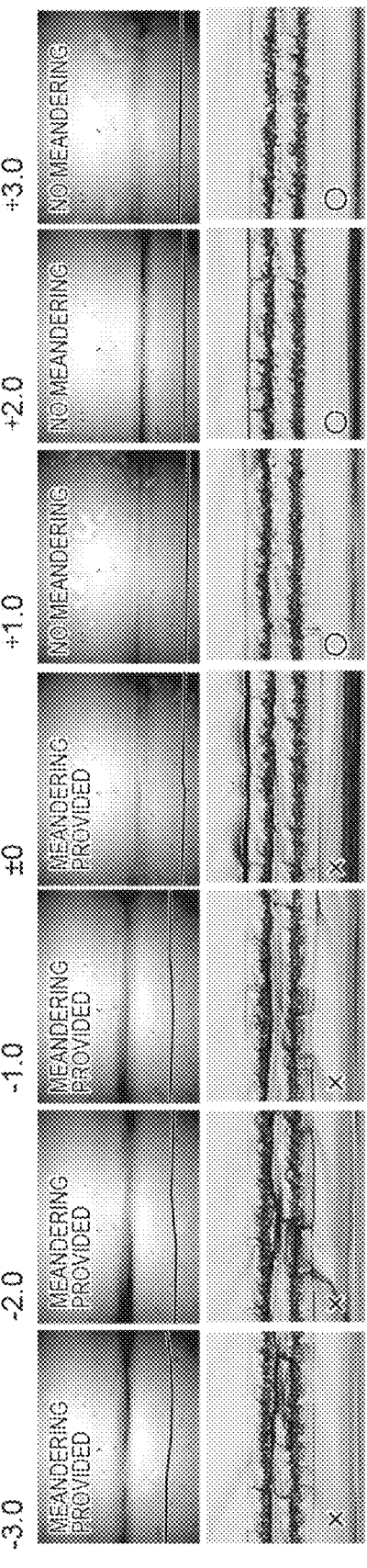
FIG. 56 is a diagram illustrating a relationship between the X-offset amount and a determination item.

The same applies to the determination of the X-offset amount. As an example, as illustrated in FIG. 54, in a case where the determination item is the lower fracture amount F4, a peak value is obtained in accordance with the change in the X-offset amount, and the X-offset amount giving the peak value coincides with the conventional method (±0 (forward path) and +2 (backward path) in (b) of FIG. 54) by cross-section observation. In addition, as illustrated in FIGS. 55 (forward path) and 56 (backward path), even in a case where the determination item is the meandering amount F8 of the lower fracture tip, a change in the meandering amount F8 of the lower fracture tip in accordance with the change in the X-offset amount was observed, and the X-offset amount in which the meandering amount F8 of the lowest fracture tip become the minimum coincided with the above case. As described above, various determination items can also be used for the determination of the X-offset amount.

Subsequently, processing (Step S59), image capturing (Step S60), and result display (Step S62) are performed. Step S59 is similar to Step S54 described above, Step S60 is similar to Step S55 described above, and Step S62 is similar to Step S56 described above. However, in Step S60, among the image capturing C1 to C11, image capturing capable of acquiring the determination item changed in Step S58 is performed.

In addition, here, after Step S60 and before Step S62, the control unit 10 performs a process of determining whether or not the fractures 14a and 14d have not reached the outer surface, based on the information indicating the formation state acquired in Step S60 (Step S61). Here, in at least one of a case where the second end 14ae of the fracture 14a is not checked in the image acquired in the image capturing C5 and a case where the fracture 14d is checked on the back surface 21b in the image acquired in the image capturing C0, it can be determined that the fractures 14a and 14b have reached the outer surface. In a case where the result of the determination in Step S61 is a result indicating that the fractures 14a and 14d have reached the outer surface, that is, in a case where non-reaching does not occur (Step S61: NO), the process proceeds to Step S58. In addition, in a case where the result is a result indicating that the fractures 14a and 14b have not reached the outer surface, that is, in a case where non-reaching occurs (Step S61: YES), the process proceeds to Step S62 as described above.

Subsequently, the control unit 10 determines whether or not the determination (obtaining) of the LBA offset amount D8 (here, the Y-offset amount) has been completed, that is, whether or not the LBA offset amount D8 in which the changed determination item shows the peak value (desired state) is not obtained (Step S63). In a case where the result of the determination in Step S63 is a result indicating that the determination of the LBA offset amount D8 has been completed (Step S63: NO), the processing is ended.

On the other hand, in a case where the result of the determination in Step S63 is a result indicating that the determination of the LBA offset amount D8 has not been completed (Step S63: YES), the control unit 10 changes the irradiation conditions other than the above-described irradiation condition items such as enhancing the condensing correction (Step S64). Then, processing (Step S65), image capturing (Step S66), and result display (Step S68) are performed. Step S65 is similar to Step S54 described above, Step S66 is similar to Step S55 described above, and Step S68 is similar to Step S56 described above.

However, here, after Step S66 and before Step S68, the control unit 10 performs a process of determining whether or not the fractures 14a and 14d have not reached the outer surface, based on the information indicating the formation state acquired in Step S65 (Step S67). Here, in at least one of a case where the second end 14ae of the fracture 14a is not checked in the image acquired in the image capturing C5 and a case where the fracture 14d is checked on the back surface 21b in the image acquired in the image capturing C0, it can be determined that the fractures 14a and 14b have reached the outer surface. In a case where the result of the determination in Step S67 is a result indicating that the fractures 14*a* and 14*d* have reached the outer surface, that is, in a case where non-reaching does not occur (Step S67: NO), the process proceeds to Step S64. In addition, in a case where the result is a result indicating that the fractures 14*a* and 14*b* have not reached the outer surface, that is, when they have not reached the outer surface (Step S67: YES), the process proceeds to Step S68 as described above.

Then, the control unit 10 determines whether or not the determination (obtaining) of the LBA offset amount D8 (here, the Y-offset amount) has been completed, that is, whether or not the LBA offset amount D8 showing the peak value (desired state) is not obtained under the changed irradiation condition (Step S69). In a case where the result of the determination in Step S69 is a result indicating that the determination of the LBA offset amount D8 has been completed (Step S69: NO), the processing is ended.

On the other hand, in a case where the result of the determination in Step S69 is a result indicating that the determination of the LBA offset amount D8 has not been completed (Step S69: YES), the control unit 10 controls the input reception unit 103 to display information notifying the user of an error, on the input reception unit 103 (Step S70), and the processing is ended. The reason is as follows. That is, it is not possible to obtain a desired formation state by any of the expansion of the variable range of the LBA offset amount D8, the change of the determination item, and the change of the irradiation condition, and thus there is a possibility that there is an abnormality in the device state.

DESCRIPTION OF MODIFICATION EXAMPLES

The above embodiment has described one aspect of the present disclosure. Thus, the present disclosure is not limited to the above embodiment, and any modification may be made.

For example, in the above embodiment, an example (example of dicing) in which the wafer 20 is cut for each functional element 22*a* along each of the plurality of lines 15 has been described as the processing of the laser processing device 1. However, the laser processing device 1 may be applied to processing of cutting an object along a virtual plane (in the object) facing the incident surface of laser light in the object (processing of peeling in a thickness direction), trimming processing of cutting an annular region including an outer edge of an object from the object, and the like.

In the above embodiment, the wafer 20 including the semiconductor substrate 21, which is a silicon substrate, has been described exemplified as the object of the laser processing device 1. However, the object of the laser processing device 1 is not limited to the substrate containing silicon.

In addition, in each embodiment, some examples of the irradiation condition items, the formation state items, and the combinations thereof have been described. The present disclosure is not limited to the irradiation condition items, the formation state items, and the combinations thereof exemplified in the above embodiments, and the irradiation condition items, the formation state items, and the combinations thereof may be freely selected. For example, in the first embodiment, the pass/fail determination of the LBA offset amount D8 exemplified in the third embodiment may be performed.

In the above embodiment, the step of displaying the information acquired in the second process is unnecessary in a case where the irradiation condition of the laser light L is automatically adjusted to the irradiation condition determined to be the pass.

Furthermore, in the above example, an example of the performing timing has been described for the case where the process (fourth process) of receiving the setting of the irradiation condition for the processing and determining whether or not the irradiation condition is the non-reaching condition is performed before the process of performing processing is performed, and the case where the process (fifth process) of determining whether or not the fractures 14*a* and 14*d* do not reach the outer surface is performed after the process of performing processing is performed, and the process of acquiring the information indicating the formation state is performed. The performing timings of the processes are not limited to the above example and are freely set.

INDUSTRIAL APPLICABILITY

It is possible to provide a laser processing device and a laser processing method capable of facilitating pass/fail determination of an irradiation condition of laser light based on a processing result.

REFERENCE SIGNS LIST 1 laser processing device
3 laser irradiation unit (irradiation unit)
4 image capturing unit (image capturing part)
5 spatial light modulator
10 control unit
11 object
21 semiconductor substrate
33 condenser lens
33*a* incident pupil surface
103 input reception unit (input unit, display unit)

The invention claimed is:

1. A laser processing device comprising:
an irradiation unit configured to irradiate an object with laser light;
an image capturing part configured to capture an image of the object; and
a control unit configured to control at least the irradiation unit and the image capturing part, wherein
the control unit performs
a first process of irradiating the object with the laser light by control of the irradiation unit to form a modified spot and a fracture extending from the modified spot in the object so as not to reach an outer surface of the object,
a second process of, after the first process, capturing an image of the object with light having transparency to the object and acquiring information indicating a formation state of the modified spot and/or the fracture, by control of the image capturing part, and
a third process of, after the second process, performing pass/fail determination of an irradiation condition of the laser light in the first process, based on the information indicating the formation state acquired in the second process,
wherein the outer surface includes a first surface that is an incident surface of the laser light and a second surface on an opposite side of the first surface,
wherein, in the second process, capturing is performed in at least a range from the second surface to a virtual image of a lower fracture located symmetrical position with respect to the second surface, the lower fracture is the fracture extending from the modified spot toward the second surface side.

2. The laser processing device according to claim 1, wherein the control unit performs a fourth process of, before the first process, determining whether or not the irradiation condition is a non-reaching condition being a condition that the fracture does not reach the outer surface, and the first process in a case where the irradiation condition is the non-reaching condition as a result of the determination in the fourth process.

3. The laser processing device according to claim 1, wherein the control unit performs a fifth process of determining whether the fracture does not reach the outer surface, based on the information indicating the formation state acquired in the second process, after the second process and before the third process, and the third process in a case where the modified spot and the fracture do not reach the outer surface as a result of the determination in the fifth process.

4. The laser processing device according to claim 1, further comprising:

a display unit configured to display information; and an input unit configured to receive an input.

5. The laser processing device according to claim 4, wherein the control unit performs, after the third process, a sixth process of displaying information indicating a result of the pass/fail determination on the display unit by control of the display unit.

6. The laser processing device according to claim 4, wherein the control unit performs, before the third process, a seventh process of causing the display unit to display information for urging an input of a target value of the formation state by control of the display unit, the input unit receives an input of the target value, and the control unit performs the pass/fail determination by comparing the formation state under the irradiation condition in the first process to the target value based on the information indicating the formation state acquired in the second process, in the third process.

7. The laser processing device according to claim 4, wherein in response to a result of the pass/fail determination in the third process, the control unit corrects, as a correction item, at least one of a plurality of irradiation condition items included in the irradiation condition, and performs re-determination of performing the first process and the subsequent processes again.

8. The laser processing device according to claim 4, wherein the control unit performs an eighth process of causing the display unit to display information for urging selection of whether or not to correct, as a correction item, at least one of a plurality of irradiation condition items included in the irradiation condition and perform re-determination of performing the first process and the subsequent processes again, in response to a result of the pass/fail determination in the third process by control of the display unit, the input unit receives an input of the selection of whether or not to perform the re-determination, and

the control unit performs the re-determination in a case where the input unit receives the selection to perform the re-determination.

9. The laser processing device according to claim 8, wherein the control unit performs a ninth process of causing the display unit to display information for urging selection of the correction item by control of the display unit, the input unit receives an input of the selection of the correction item, and the control unit corrects the correction item received by the input unit and performs the re-determination.

10. The laser processing device according to claim 7, wherein the irradiation condition includes, as the irradiation condition item, at least one of a pulse waveform of the laser light, pulse energy of the laser light, a pulse pitch of the laser light, a condensing state of the laser light, and an interval of the modified spots in a direction intersecting with an incident surface of the laser light of the object in the first process, in a case where a plurality of the modified spots is formed at positions different from each other in the direction intersecting with the incident surface.

11. The laser processing device according to claim 10, further comprising:

a spatial light modulator configured to display a spherical aberration correction pattern for correcting spherical aberration of the laser light; and a condenser lens for condensing, on the object, the laser light modulated by the spherical aberration correction pattern in the spatial light modulator, wherein the condensing state includes an offset amount of a center of the spherical aberration correction pattern with respect to a center of a pupil surface of the condenser lens.

12. The laser processing device according to claim 4, wherein the control unit performs, before the third process, a tenth process of causing the display unit to display information for urging selection of a determination item by control of the display unit, the determination item being an item used for the pass/fail determination among a plurality of formation state items included in the formation state, the input unit receives an input of the selection of the determination item, and the control unit performs the pass/fail determination based on information indicating the determination item in the formation state acquired in the second process, in the third process.

13. The laser processing device according to claim 12, wherein the object includes a first surface that is an incident surface of the laser light and a second surface on an opposite side of the first surface, the fracture includes a first fracture extending from the modified spot to the first surface side and a second fracture extending from the modified spot to the second surface side, the formation state includes, as the formation state item, at least one of a length of the first fracture in a first direction intersecting with the first surface, a length of the second fracture in the first direction, a total length of the fractures in the first direction, a position of a first end that is a tip of the first fracture on the first surface side in the first direction, a position of a second end that is a tip of the second fracture on the second surface side in the first direction, a shift width between the first end and the second end when viewed from the first direction, presence or absence of a dent of the modified spot, a meandering amount of the second end when viewed from the first direction, and presence or absence of the tip of the fracture in a region between the modified spots arranged in a direction intersecting with the first surface in a case where a plurality of the modified spots is formed at positions different from each other in the direction intersecting with the first surface in the first process.

14. A laser processing method comprising:

a first step of irradiating an object with laser light to form a modified spot and a fracture extending from the modified spot in the object so as not to reach an outer surface of the object;

a second step of, after the first step, capturing an image of the object with light having transparency to the object and acquiring information indicating a formation state of the modified spot and/or the fracture; and a third step of, after the second step, performing pass/fail determination of an irradiation condition of the laser light in the first step, based on the information indicating the formation state acquired in the second step, wherein the outer surface includes a first surface that is an incident surface of the laser light and a second surface on an opposite side of the first surface, wherein, in the second step, capturing is performed in at least a range from the second surface to a virtual image of a lower fracture located symmetrical position with respect to the second surface, the lower fracture is the fracture extending from the modified spot toward the second surface side.

\* \* \* \* \*